United States Patent
Okamoto

(10) Patent No.: US 8,003,525 B2
(45) Date of Patent: Aug. 23, 2011

(54) SEMICONDUCTOR DEVICE AND METHOD OF MANUFACTURING THE SAME

(75) Inventor: Naoya Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 12 days.

(21) Appl. No.: 12/146,946

(22) Filed: Jun. 26, 2008

(65) Prior Publication Data

US 2009/0001478 A1 Jan. 1, 2009

(30) Foreign Application Priority Data

Jun. 29, 2007 (JP) ................................. 2007-172345
Feb. 15, 2008 (JP) ................................. 2008-034974

(51) Int. Cl.
*H01L 21/4763* (2006.01)

(52) U.S. Cl. ........ 438/648; 438/285; 438/589; 438/618; 257/E21.577; 257/E21.584; 257/E21.585

(58) Field of Classification Search .................. 438/160, 438/280, 572, 576, 590, 602; 257/E21.061, 257/E21.062, E21.483
See application file for complete search history.

(56) References Cited

U.S. PATENT DOCUMENTS

| 7,067,857 | B2 | 6/2006 | Mochizuki et al. |
| 7,078,743 | B2 | 7/2006 | Murata et al. |
| 7,339,207 | B2 | 3/2008 | Murata et al. |
| 2004/0212034 | A1 | 10/2004 | Mochizuki et al. |
| 2005/0001235 | A1 | 1/2005 | Murata et al. |
| 2006/0289894 | A1 | 12/2006 | Murata et al. |
| 2007/0200134 | A1* | 8/2007 | Therrien et al. ............... 257/103 |

FOREIGN PATENT DOCUMENTS

| JP | 2004-327604 A | 11/2004 |
| JP | 2004-363563 A | 12/2004 |

* cited by examiner

*Primary Examiner* — Cheung Lee
(74) *Attorney, Agent, or Firm* — Fujitsu Patent Center

(57) ABSTRACT

A GaN layer and an n-type AlGaN layer are formed over an insulating substrate, and thereafter, a gate electrode, a source electrode and a drain electrode are formed on them. Next, an opening reaching at least a surface of the insulating substrate is formed in the source electrode, the GaN layer and the n-type AlGaN layer. Then, a nickel (Ni) layer is formed in the opening. Thereafter, by conducting dry etching from the back side while making the nickel (Ni) layer serve as an etching stopper, a via hole reaching the nickel (Ni) layer is formed in the insulating substrate. Then, a via wiring is formed extending from an inside the via hole to the back surface of the insulating substrate.

13 Claims, 63 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application Nos. 2007-172345, filed on Jun. 29, 2007, and 2008-034974, filed on Feb. 15, 2008, the entire contents of which are incorporated herein by reference.

TECHNICAL FIELD

The present invention relates to a semiconductor device provided with a gallium nitride base (GaN) high electron mobility transistor (HEMT) or the like and a method of manufacturing the same.

BACKGROUND

In recent years, the gallium nitride base semiconductor device such as a GaN base HEMT or the like has been expected to be applied to highly high-power and high-speed devices because of its physical characteristics. In order to improve in high frequency characteristics of the GaN base semiconductor devices, a via wiring structured unit is necessary for the reduction of source inductance and the heat radiation.

A conventional method of manufacturing a GaN base HEMT will be explained here. FIG. 1A to FIG. 1X are sectional views showing the conventional method of manufacturing a GaN base HEMT in process order.

First, as shown in FIG. 1A, a GaN layer 102 and an n-type AlGaN layer 103 are formed over a surface of an insulating substrate 101 made of silicon carbide (SiC) in this order. The insulating substrate 101 is about 350 μm in thickness, and the total thickness of the GaN layer 102 and the n-type AlGaN layer 103 is about 2 μm. Then, a source electrode 104s, a gate electrode 104g and a drain electrode 104d are selectively formed on the n-type AlGaN layer 103. Thereafter, a SiN layer 105 covering the source electrode 104s, the gate electrode 104g and the drain electrode 104d is formed over the n-type AlGaN layer 103.

Then, as shown in FIG. 1B, a resist pattern 151 provided with an opening 151s corresponding to the source electrode 104s and an opening 151d corresponding to the drain electrode 104d is formed over the SiN 105. The resist pattern 151 is about 1 μm in thickness.

Next, as shown in FIG. 1C, a contact hole 105s matching to the opening 151s is formed above the source electrode 104s, and a contact hole 105d matching to the opening 151d is formed above the drain electrode 104d by patterning the SiN layer 105 using the resist pattern 151 as a mask.

Then, the resist pattern 151 is removed, and a resist pattern 152 provided with an opening 152s which is smaller than the opening 151s and corresponding to the source electrode 104s is newly formed over the SiN layer 105 and the source electrode 104s as shown in FIG. 1D. The resist pattern 152 is about 1 μm in thickness. The diameter of the opening 152s is about 150 μm.

Next, as shown in FIG. 1E, an opening 106 is formed by ion-milling the source electrode 104s using the resist pattern 152 as a mask.

Thereafter, the resist pattern 152 is removed, and, as shown in FIG. 1F, a stacked body composed of a titanium (Ti) layer and a nickel (Ni) layer, or a titanium (Ti) layer and a copper (Cu) layer is formed as a seed layer 107 over the whole surface on the front side of the insulating substrate 101.

Then, as shown in FIG. 1G, a resist pattern 153 provided with an opening 153s corresponding to the outer periphery of the source electrode 104s is formed over the seed layer 107. The thickness of the resist pattern 153 is about 3 μm. Then, a nickel (Ni) layer 108 of about 1.2 μm in thickness is formed on the seed layer 107 in the inside of the opening 153s by electroplating.

Then, as shown in FIG. 1H, the resist pattern 153 is removed.

Therefore, as shown in FIG. 1I, by ion-milling, a portion of the seed layer 107 exposed from the nickel (Ni) layer 108 is removed. The nickel (Ni) layer 108 is also processed a little simultaneously, and the resultant thickness of the nickel (Ni) layer 108 is about 1 μm.

Then, as shown in FIG. 1J, a stacked body composed of a titanium (Ti) layer, a platinum (Pt) layer and a gold (Au) layer is formed as a seed layer 109 over the whole surface on the front side of the insulating substrate 101.

Next, as shown in FIG. 1K, a resist pattern 154 provided with an opening corresponding to the outer periphery of the source electrode 104s and an opening corresponding to the outer periphery of the drain electrode 104d is formed over the seed layer 109. The thickness of the resist pattern 154 is about 1 μm. Next, a gold (Au) layer 110 of about 1 μm in thickness is formed on the seed layer 109 in each opening of the resist pattern 154 by electroplating.

Thereafter, as shown in FIG. 1L, the resist pattern 154 is removed.

Then, as shown in FIG. 1M, by ion-milling, a portion of the seed layer 109 exposed from the gold (Au) layer 110 is removed. The gold (Au) layer 110 is also processed a little simultaneously, and the resultant thickness of the gold (Au) layer 110 is about 0.6 μm.

Next, as shown in FIG. 1N, a surface protecting layer 111 is formed over the whole surface on the front side of the insulating substrate 101, and the front and the back of the insulating substrate 101 are inversed. Then, the thickness of the insulating substrate 101 is adjusted to about 150 μm by polishing the back surface of the insulating substrate 101.

Thereafter, as shown in FIG. 1O, a stacked body composed of a titanium (Ti) layer and a nickel (Ni) layer, or a titanium (Ti) layer and a copper (Cu) layer is formed as a seed layer 112 over the back of the insulating substrate 101. Then, a resist pattern 155 covering a part corresponding to the source electrode 104s is formed on the seed layer 112. The thickness of the resist pattern 155 is about 3 μm, and the diameter thereof is about 100 μm. Next, a nickel (Ni) layer 113 of about 3.2 μm in thickness is formed over the seed layer 112 in the area excepting the resist pattern 155 by electroplating.

Next, as shown in FIG. 1P, the resist pattern 155 is removed. Then, a portion of the seed layer 112 which is exposed from the nickel (Ni) layer 113 is removed by ion-milling. The nickel (Ni) layer 113 is simultaneously processed a little and the resultant thickness of the nickel (Ni) layer 113 is about 3 μm.

Thereafter, as shown in FIG. 1Q, a via hole 101s is formed by conducting dry etching of the insulating substrate 101 using the nickel (Ni) layer 113 as a mask. In the dry etching, a mixed gas of sulfur hexafluoride ($SF_6$) gas and oxygen ($O_2$) gas is used.

Then, as shown in FIG. 1R, the via hole 101s is allowed to reach the seed layer 107 by conducting dry etching of the GaN layer 102 and the n-type AlGaN layer 103 using the nickel (Ni) layer 113 as a mask. Chlorine gas ($Cl_2$) is used for the dry etching. In the dry etching, the nickel (Ni) layer 108 and the seed layer 107 serve as an etching stopper.

Next, as shown in FIG. 1S, a resist layer 156 is formed in the via hole 101s and over the nickel (Ni) layer 113.

Next, as shown in FIG. 1T, the resist layer 156 is left only in the via hole 101s by conducting exposure and development of the resist layer 156.

Thereafter, as shown in FIG. 1U, the nickel (Ni) layer 113 and the seed layer 112 are removed by ion-milling.

Then, as shown in FIG. 1V, the resist layer 156 is removed. Next, a portion of the seed layer 107 which is exposed from the via hole 101s is removed by ion-milling. Then, a stacked body composed of a titanium (Ti) layer, a platinum (Pt) layer and a gold (Au) layer is formed as a seed layer 114 over the whole surface on the back side of the insulating substrate 101.

Next, as shown in FIG. 1W, a gold (Au) layer 115 of about 10 μm in thickness is formed over the seed layer 114 by electroplating.

As shown in FIG. 1X, the front and the back of the insulating substrate 101 are inversed and the surface protecting layer 111 is removed.

Conventionally, the GaN base HEMT has been manufactured by the method like this.

However, formation and extension processing of the via hole 101s are not easy with this conventional manufacturing method.

For example, the dry etching rate of the insulating substrate 101 made of SiC is subject to be influenced by the diameter or the like of the via hole 101s, and its in-plane distribution is great. Accordingly, conventionally, over-etching is conducted for the purpose of obtaining high yields by allowing the via hole 101s to reach the GaN layer 102 with reliability. The etching selection ratio of SiC to nickel (Ni) is 100 or more under the ordinary dry etching condition of the insulating substrate 101, however, the etching selection ratio among SiC, and GaN and AlGaN is as low as about 20 to 30. The total thickness of the GaN layer 102 and the n-type AlGaN layer 103 is as thin as about 2 μm. Accordingly, as a result of the over-etching, the variation in the ratio of remaining the GaN layer 102 and the n-type AlGaN layer 103 is greater. For example, when the variation (in-plane distribution) in the dry etching rate of the insulating substrate 101 is about ±5%, 33% of over-etching (corresponding to the etching amount of 50 μm in SiC thickness) is supposed to be conducted for the purpose of forming the via hole 101s of 150 μm in depth. The selection ratio between SiC, and GaN, AlGaN is supposed to be 25. In this case, though 0.4 μm of the GaN layer 102 remains in some portions, the GaN layer 102 and the n-type AlGaN layer 103 are completely removed in other portions. If dry etching of the remaining GaN layer 102 and the remaining n-type AlGaN layer 103 is conducted from this state, the seed layer 107 and the nickel (Ni) layer 108 cannot work as an etching stopper in the areas where the GaN layer 102 and the n-type AlGaN layer 103 has been completely removed, and these layers areas are still also etched. Since the thickness of the nickel (Ni) layer 108 is about 1 μm, the nickel (Ni) layer 108 might also be removed.

If the nickel (Ni) layer 108 is made thicker, it is possible to prevent the total removal, but in this case, other problems occur. That is, after forming the nickel (Ni) layer 108, formation of the resist pattern 154 is necessary for forming the gold (Au) layer 110 (FIG. 1K), but when the thickness of the nickel (Ni) layer 108 exceeds 1 μm, say about 3 μm for example, the thickness lacks its uniformity and distortion of the pattern easily occurs unless the resist pattern 154 is formed thickly. In other words, the opening precision of the pattern is apt to be lowered. Meanwhile, for the purpose of preventing this problem, if the resist pattern 154 is also formed thickly, it becomes difficult to form the resist pattern 154 with high resolution. Because of these circumstances, in the conventional manufacturing method, the thickness of the nickel (Ni) layer 108 is kept about 1 μm.

In the dry etching of the insulating substrate 101 (FIG. 1Q) and the dry etching of the GaN layer 102 and the n-type AlGaN layer 103 (FIG. 1R), the nickel (Ni) layer 113 is used as a metal mask. Accordingly, it is possible to conduct the two times of dry etching in the same chamber. However, in this case, sulfur hexafluoride ($SF_6$) used in the dry etching of the insulating substrate 101 remains, and the etching rate of the GaN layer 102 and the n-type AlGaN layer 103 becomes unstable owing to this effect. FIG. 2 is a graph showing the result of an ICP dry etching experiment conducted by the present inventor for confirmation. ● in FIG. 2 shows the etching rate when only chlorine gas ($Cl_2$) being an etching gas is supplied at a flow rate of 30 sccm, ◆ shows the etching rate when nitrogen gas ($N_2$) is mixed with other than chlorine gas ($Cl_2$) at 30 sccm, and ▲ shows the etching rate when sulfur hexafluoride ($SF_6$) gas is mixed with other than chlorine gas ($Cl_2$) at 30 sccm. In any measurement, the antenna power is set to 150 W and the bias power is set to 10 W. As shown in FIG. 2, when only chlorine gas ($Cl_2$) is supplied, the etching rate of 54 nm/min is obtained, and even when diluting by mixing nitrogen gas ($N_2$), the etching rate of about 40 nm/min can be obtained. Meanwhile, in the case that sulfur hexafluoride ($SF_6$) gas is mixed, the etching rate is considerably reduced to 2 nm/min even when the flow rate is only 1 sccm. Thus, when even trace amount of sulfur hexafluoride ($SF_6$) gas remains in the chamber, the etching rate of the GaN layer 102 and the n-type AlGaN layer 103 is considerably reduced. Accordingly, in the conventional method, evacuation to vacuum in a chamber or cleaning of the chamber with chlorine plasma is conducted before conducting the dry etching of the GaN layer 102 and the n-type AlGaN layer 103, which requires a longer time for the treatment. In addition, in order to shorten the treatment time, the treatments possible to be conducted in the same chamber (dry etching) are separately conducted with two sets of dry etching apparatuses, or conducted in two separate chambers using a dry etching apparatus provided with multi-chambers.

By conducting these means, it becomes possible to reduce the effect of sulfur hexafluoride ($SF_6$) remaining in the chamber. When sulfur hexafluoride ($SF_6$) is attached to the insulating substrate 101 or the like, however, it is difficult to exclude its influence.

See, for example Japanese Patent Application Laid-open Nos. 2004-363563 and 2004-327604.

SUMMARY

A manufacturing method of a semiconductor device according to an aspect of the present invention comprises: forming a compound semiconductor layer over a substrate; forming a gate electrode, a source electrode and a drain electrode on the compound semiconductor layer; forming an opening reaching at least a surface of the substrate in the compound semiconductor layer; forming a conductive layer coupled to the source electrode in the opening; conducting dry etching from a back side of the substrate while making the conductive layer serve as an etching stopper so as to form a via hole reaching the conductive layer; and forming a via wiring extending from an inside of the via hole to a back surface of the substrate.

A manufacturing method of a semiconductor device according to another aspect of the present invention comprises: forming a compound semiconductor layer over an insulating substrate; forming a gate electrode, a source electrode and a drain electrode on the compound semiconductor layer; forming an opening reaching at least a surface of the insulating substrate in the source electrode and the compound semiconductor layer; forming a conductive layer in the opening; conducting dry etching from a back side of the insulating substrate while making the conductive layer serve as an etching stopper so as to form a via hole reaching the conductive layer; and forming a via wiring extending from an inside of the via hole to a back surface of the insulating substrate.

A semiconductor device according to further another aspect of the present invention comprises: a substrate in which a via hole is formed; a compound semiconductor layer over the substrate; a gate electrode, a source electrode and a drain electrode on the compound semiconductor layer; and a via wiring extending from an inside of the via hole to a back surface of the substrate, wherein an opening which reaches the via wiring is formed in the compound semiconductor layer, and a conductive layer coupled to the source electrode is formed in the opening.

A semiconductor device according to still further another aspect of the present invention comprises: an insulating substrate in which a via hole is formed; a compound semiconductor layer over the insulating substrate; a gate electrode, a source electrode and a drain electrode on the compound semiconductor layer; and a via wiring extending from an inside of the via hole to a back surface of the insulating substrate, wherein an opening which reaches the via wiring is formed in the source electrode and the compound semiconductor layer, and a conductive layer is formed in the opening.

DETAILED DESCRIPTION OF THE EMBODIMENTS

The present embodiments will be explained specifically referring to attached drawings.

First Embodiment

Figure 1A:
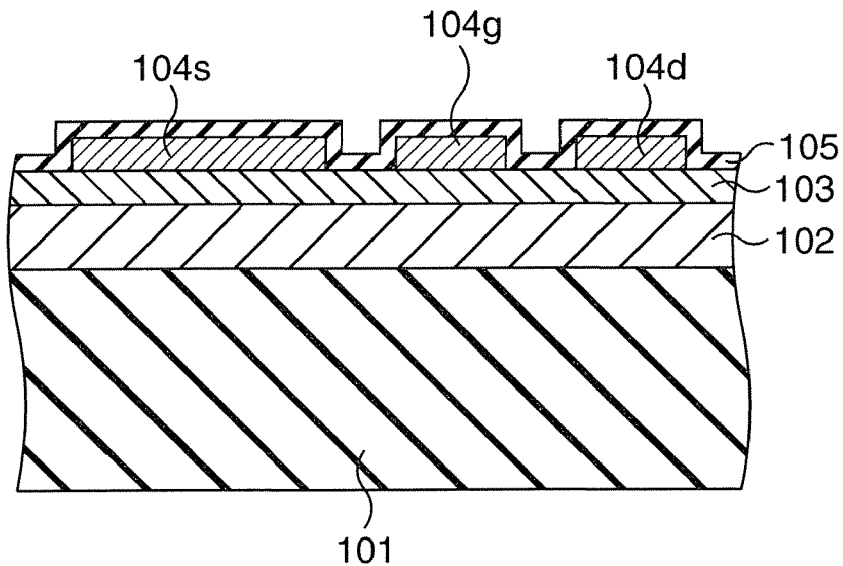
FIG. 1A to FIG. 1X are sectional views showing a conventional method of manufacturing a GaN base HEMT.
Figure 1B:
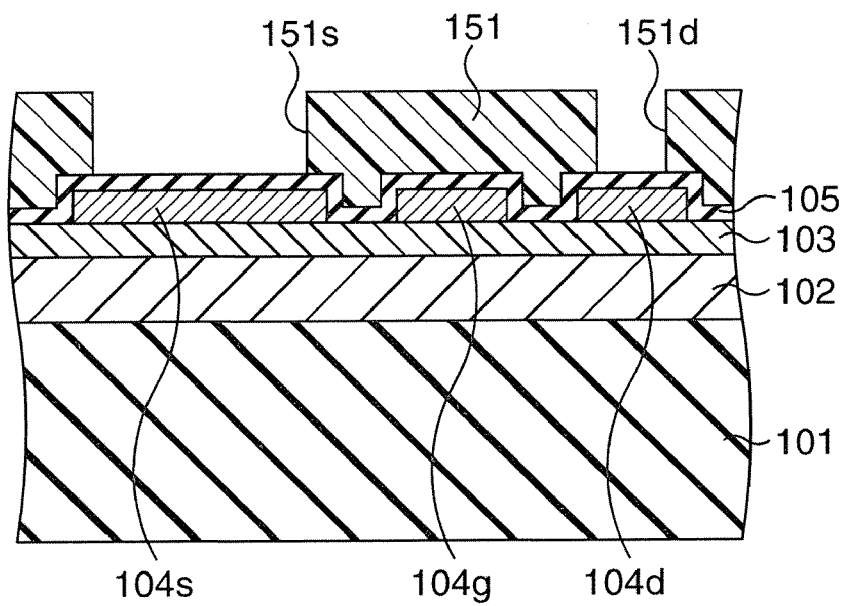
Figure 1C:
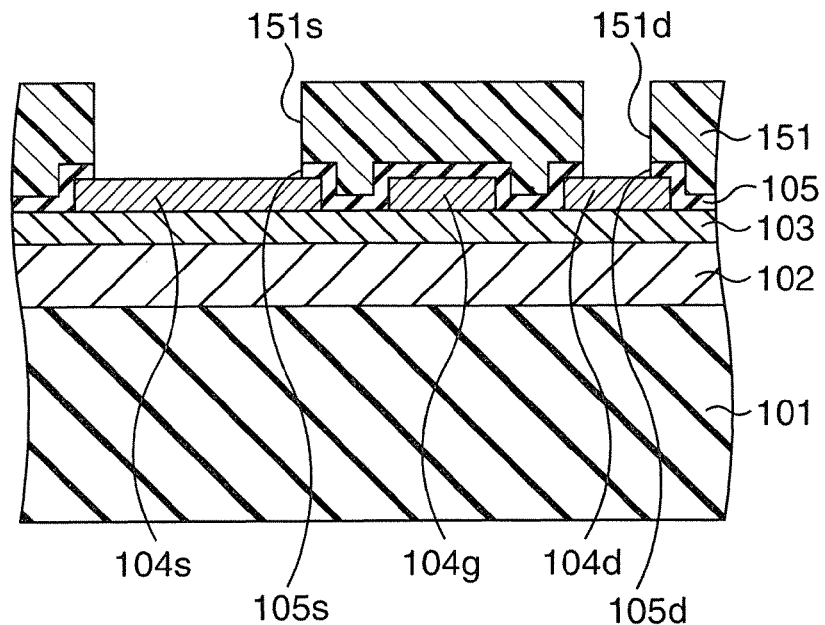
Figure 1D:
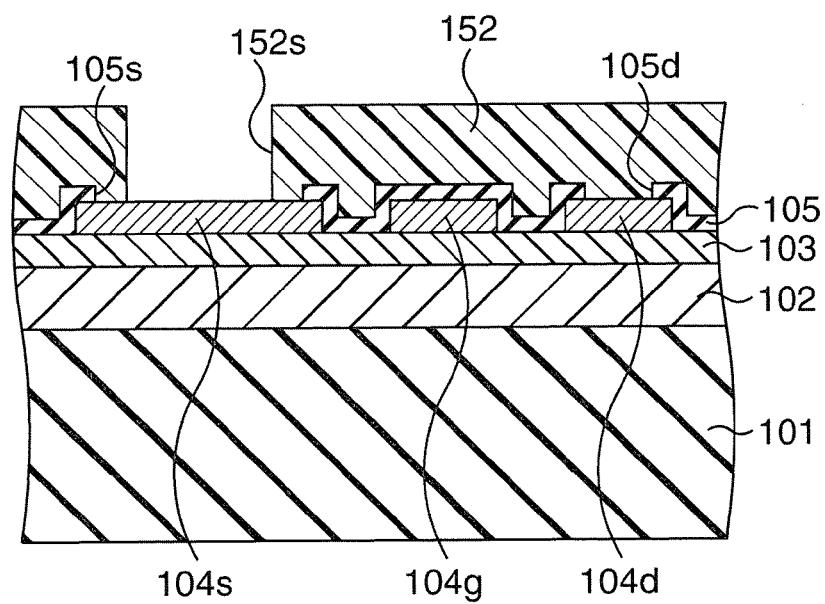
Figure 1E:
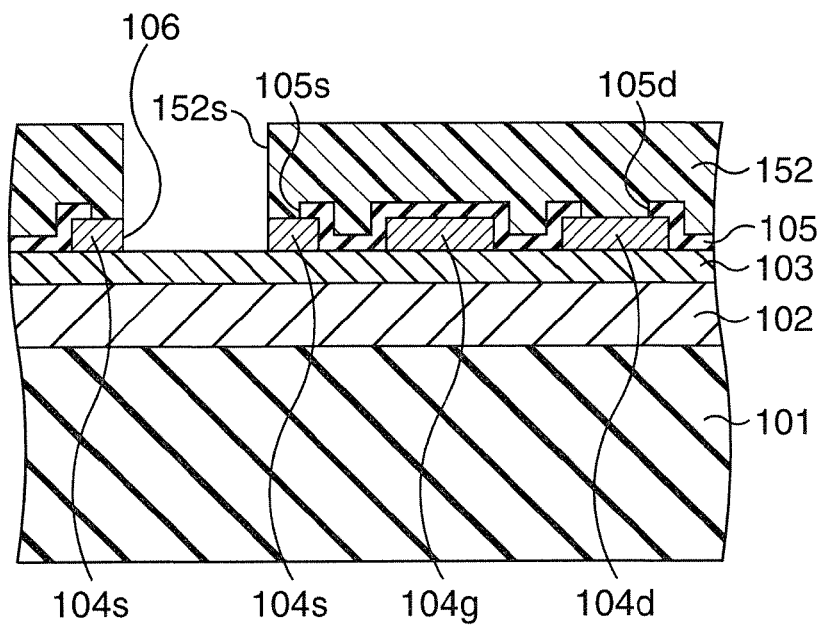
Figure 1F:
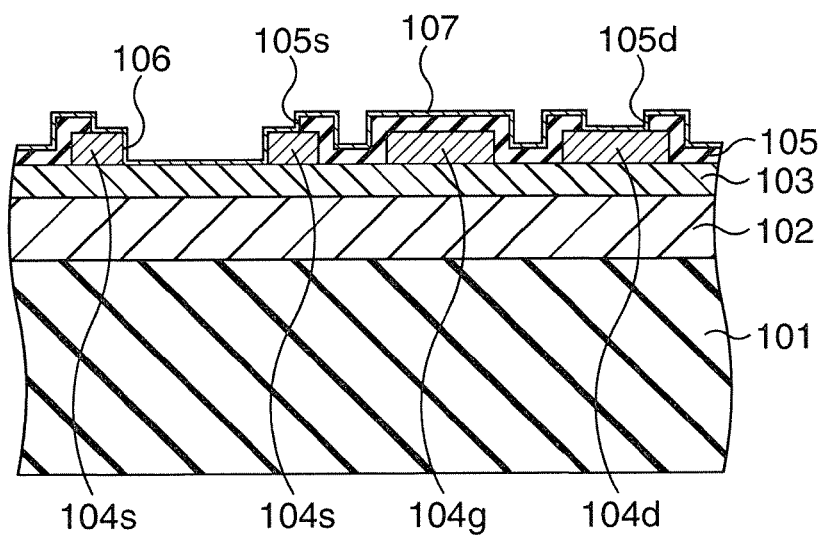
Figure 1G:
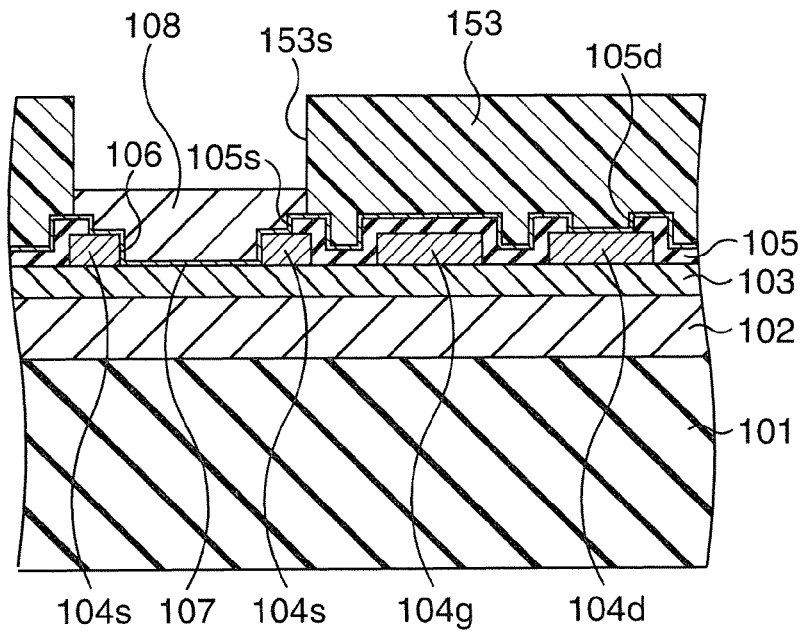
Figure 1H:
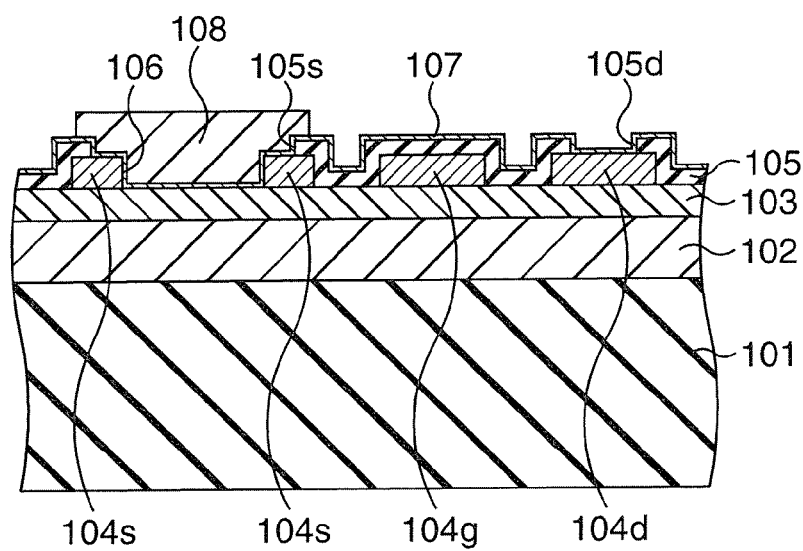
Figure 1I:
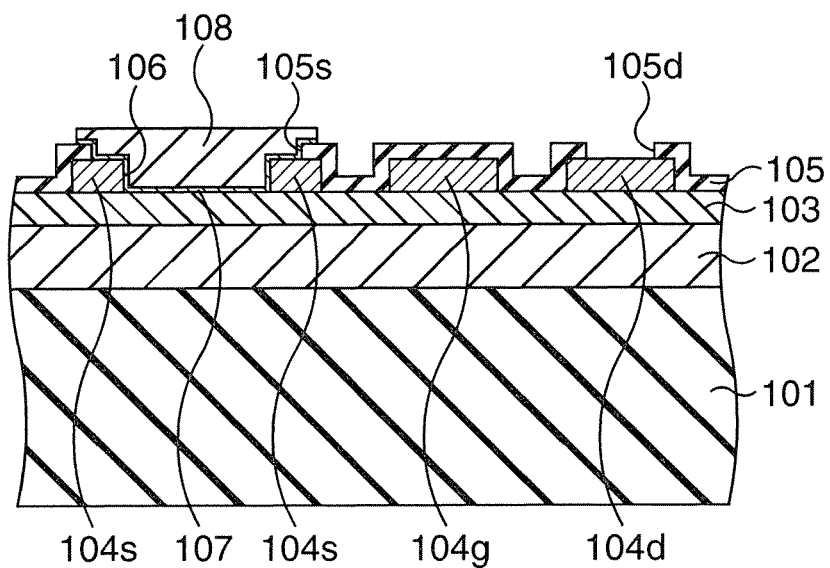
Figure 1J:
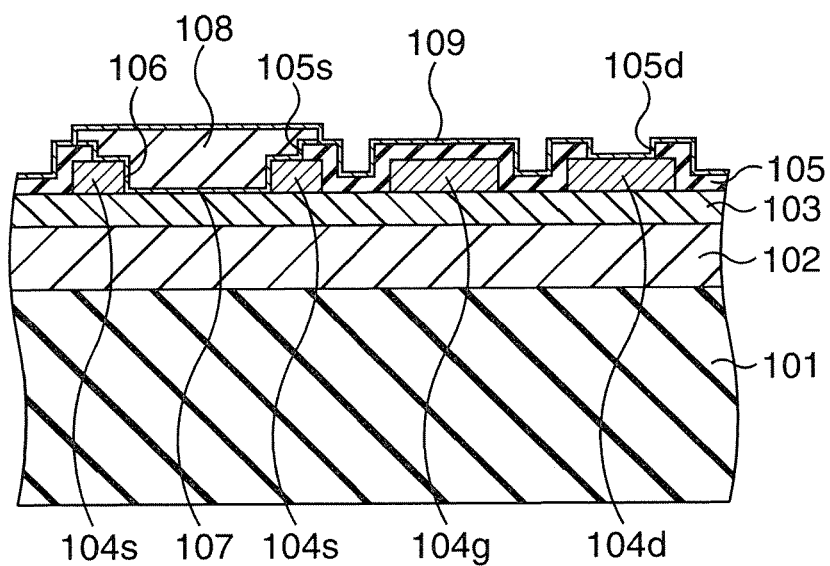
Figure 1K:
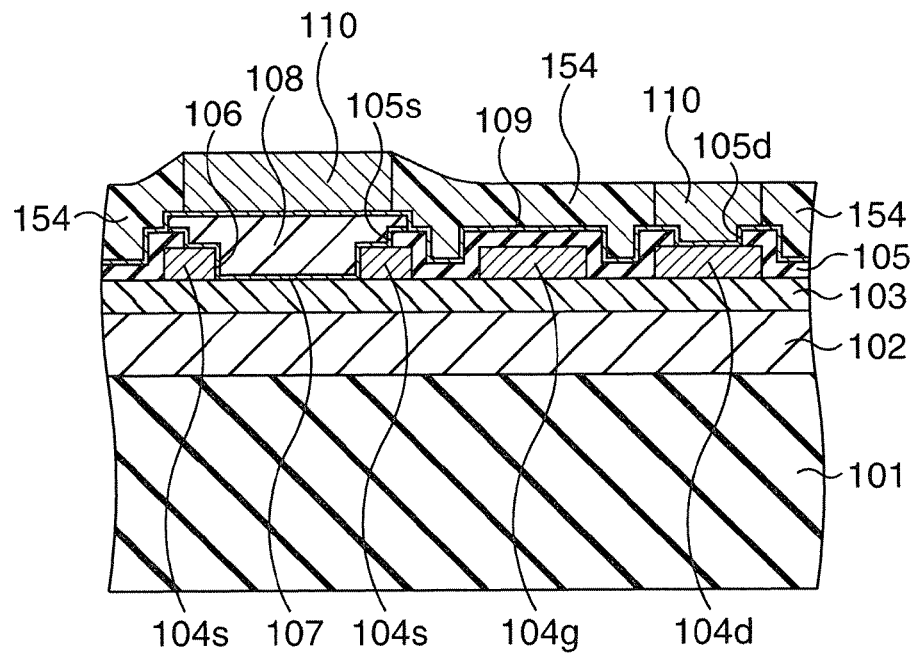
Figure 1L:
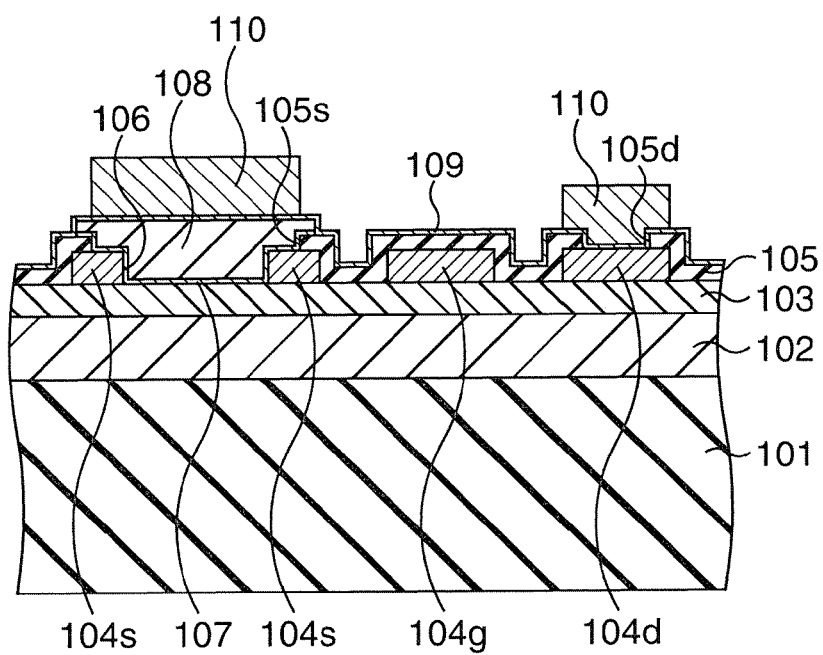
Figure 1M:
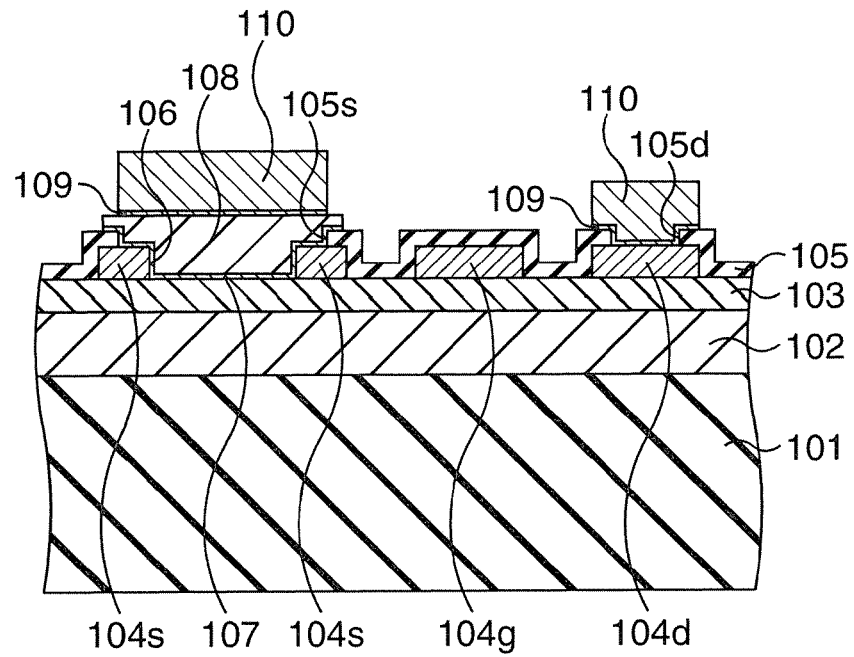
Figure 1N:
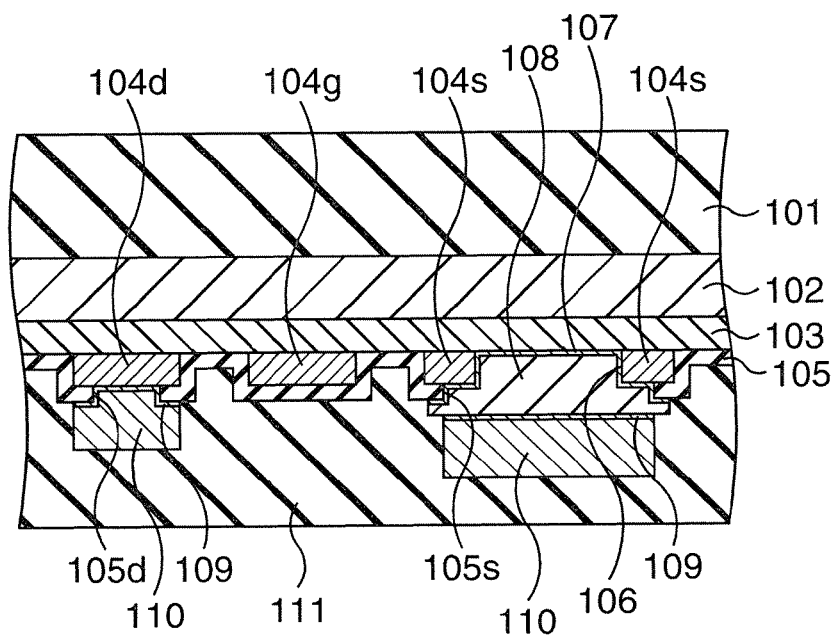
Figure 1O:
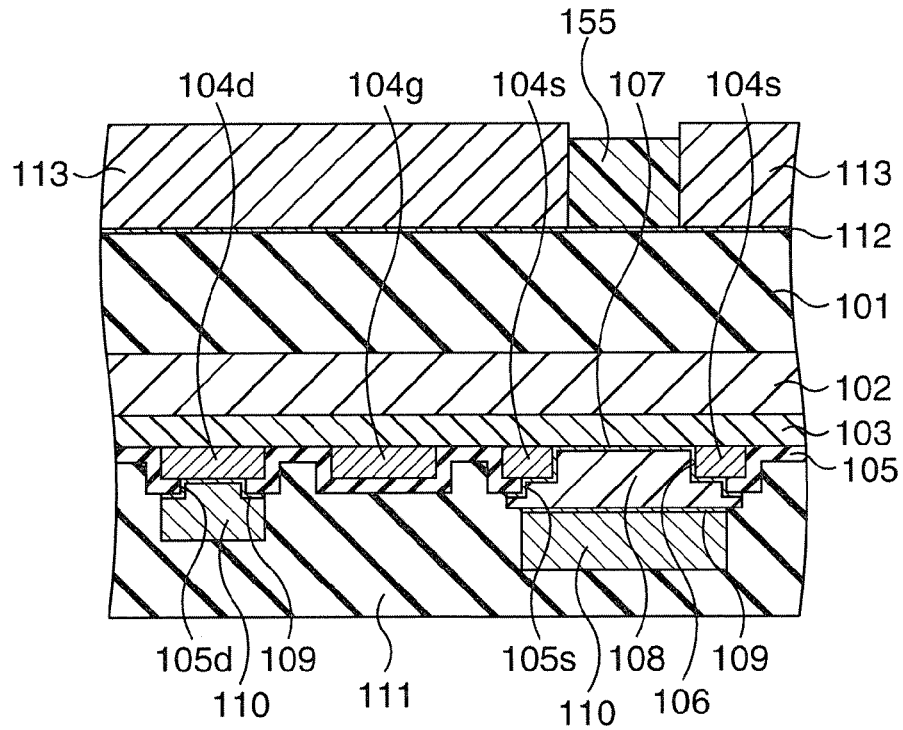
Figure 1P:
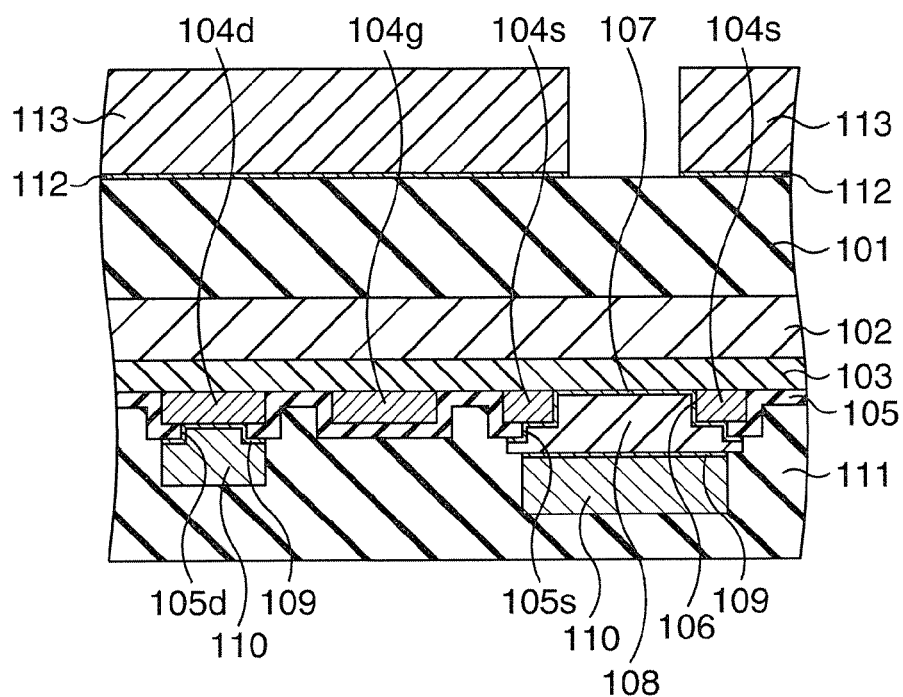
Figure 1Q:
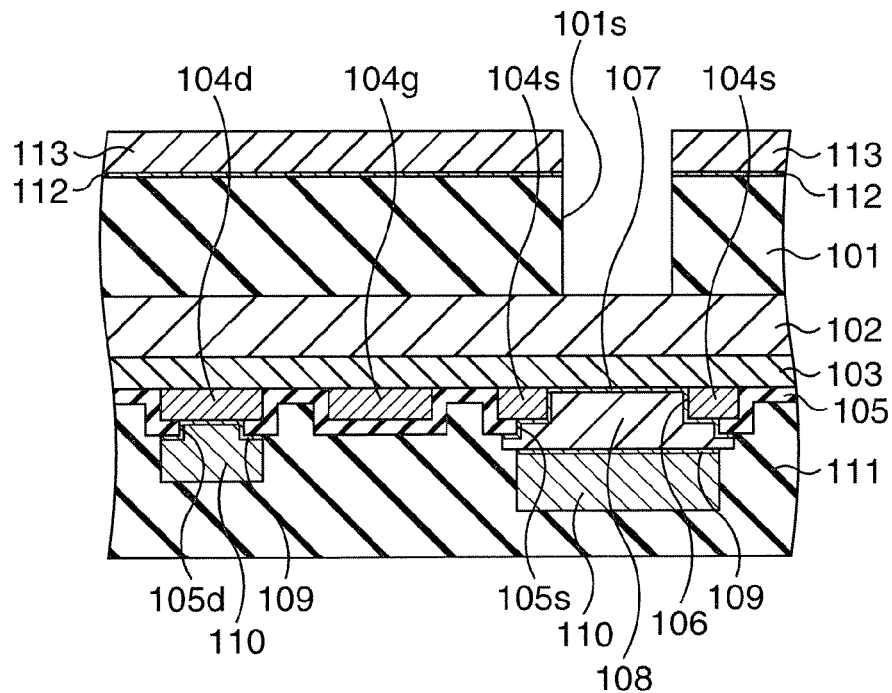
Figure 1R:
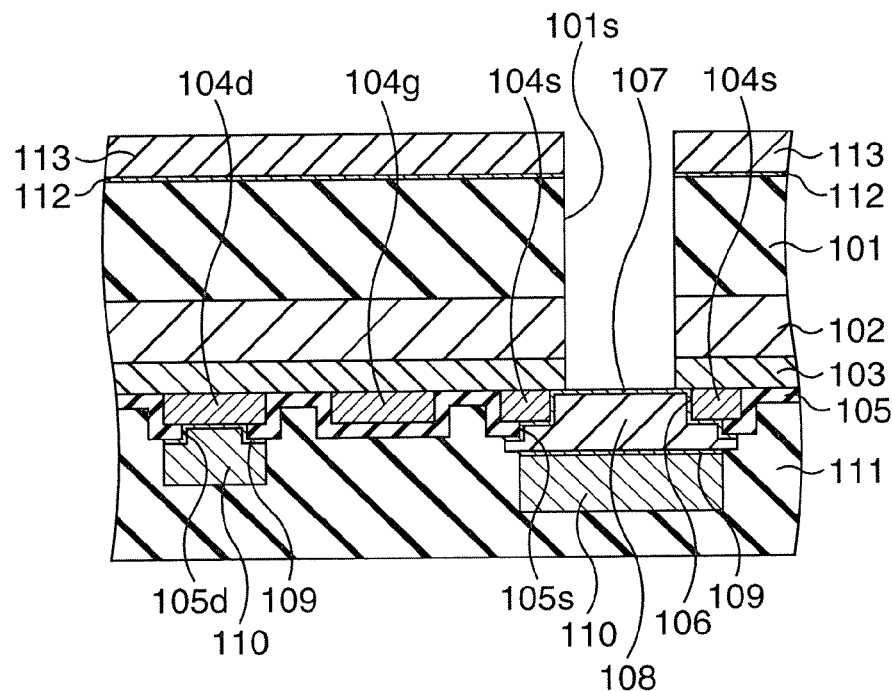
Figure 1S:
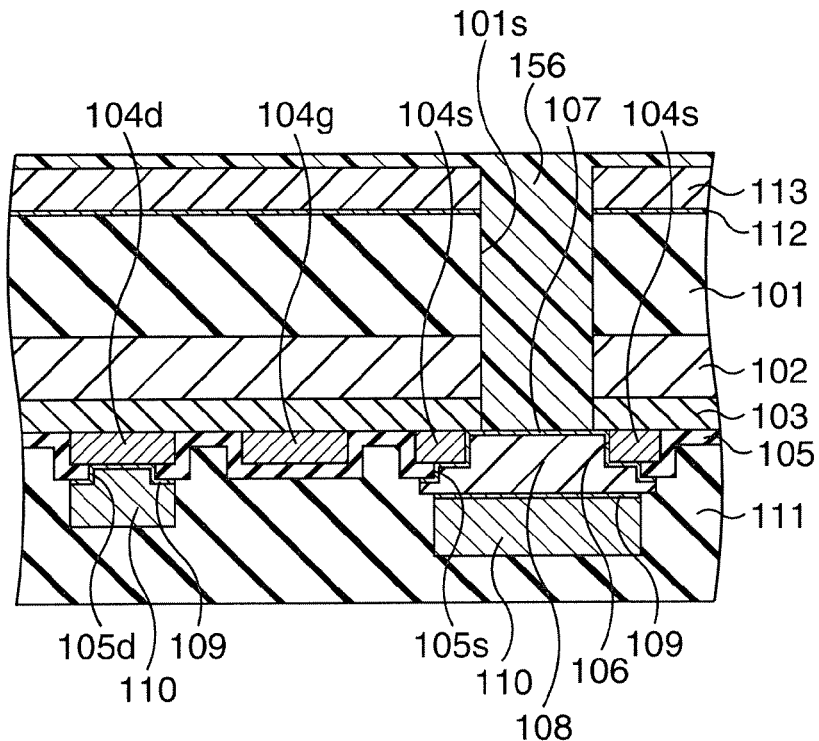
Figure 1T:
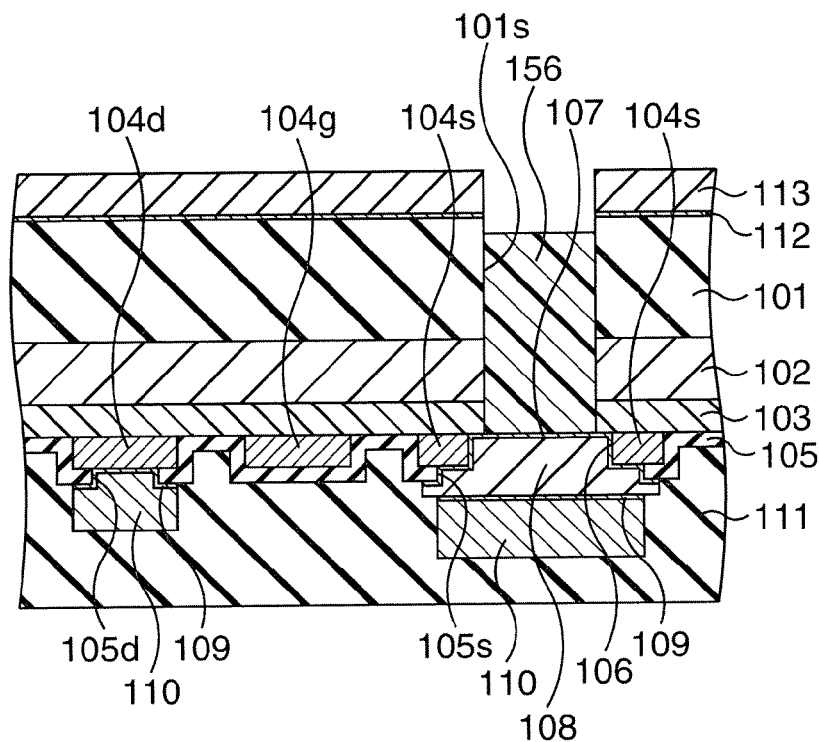
Figure 1U:
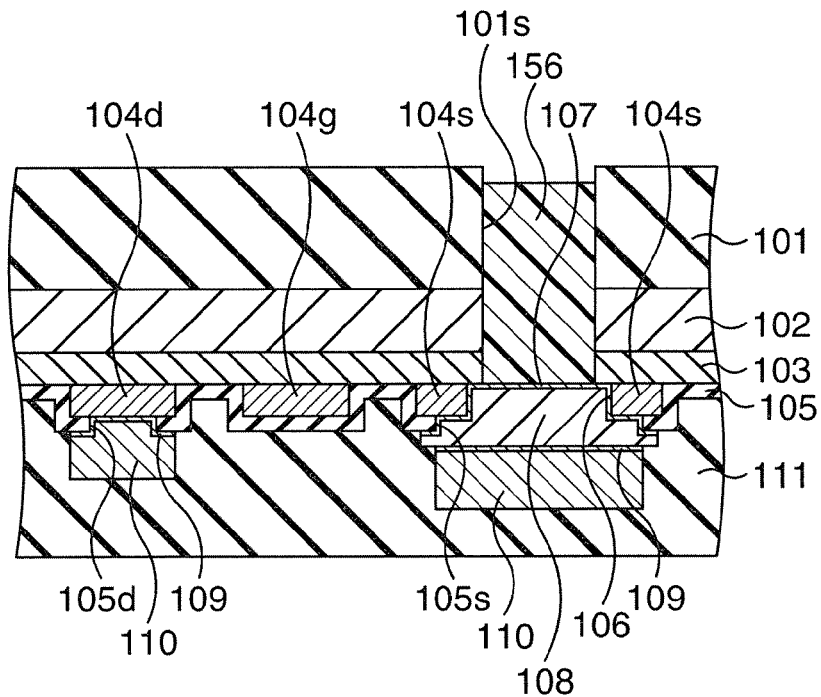
Figure 1V:
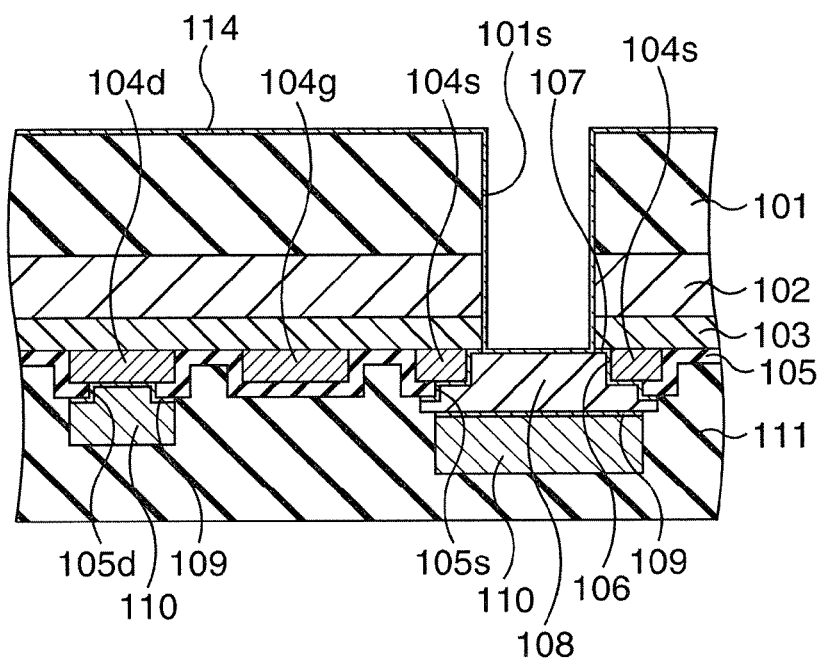
Figure 1W:
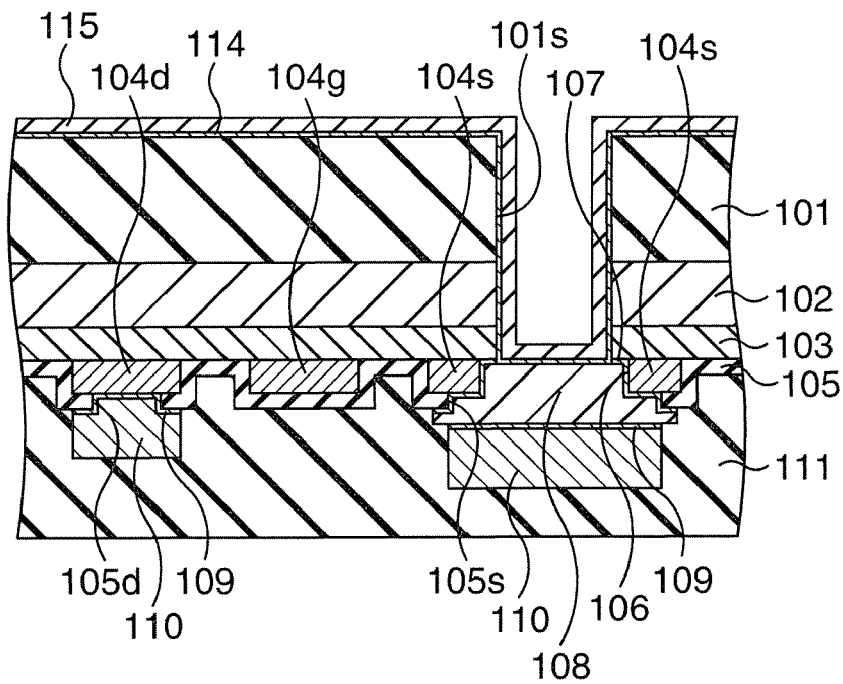
Figure 1X:
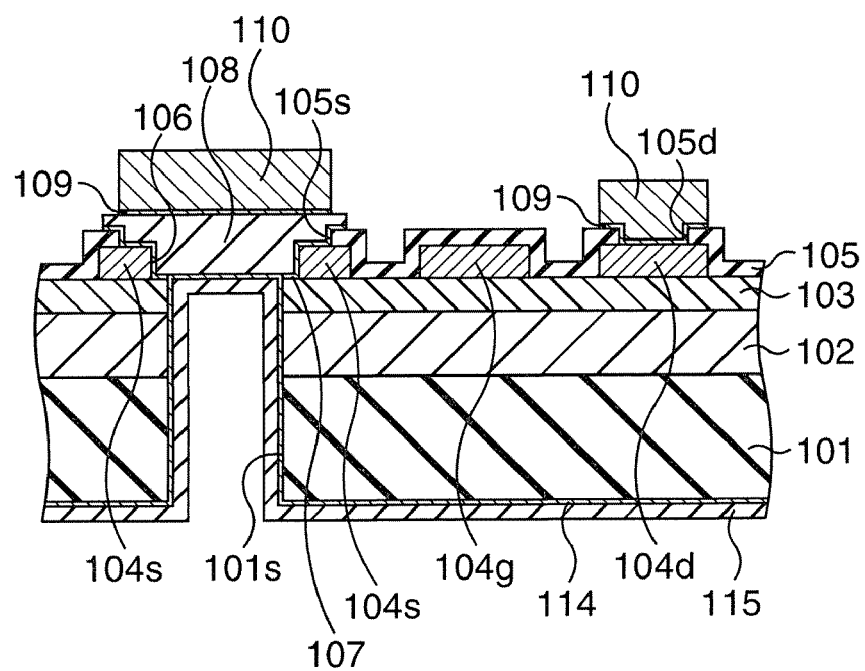
Figure 2:
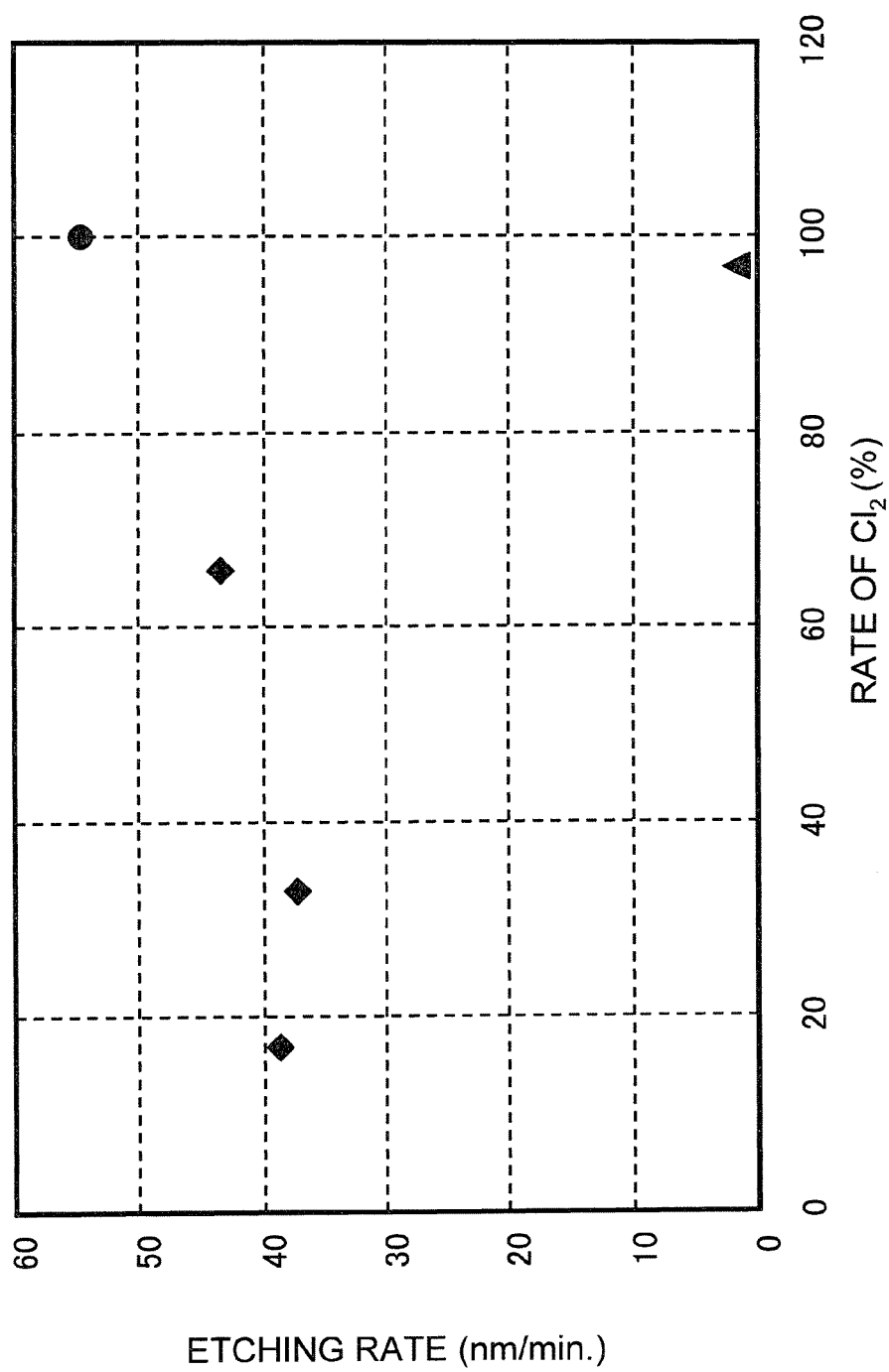
FIG. 2 is a graph showing a result of an ICP dry etching experiment.
Figure 3:
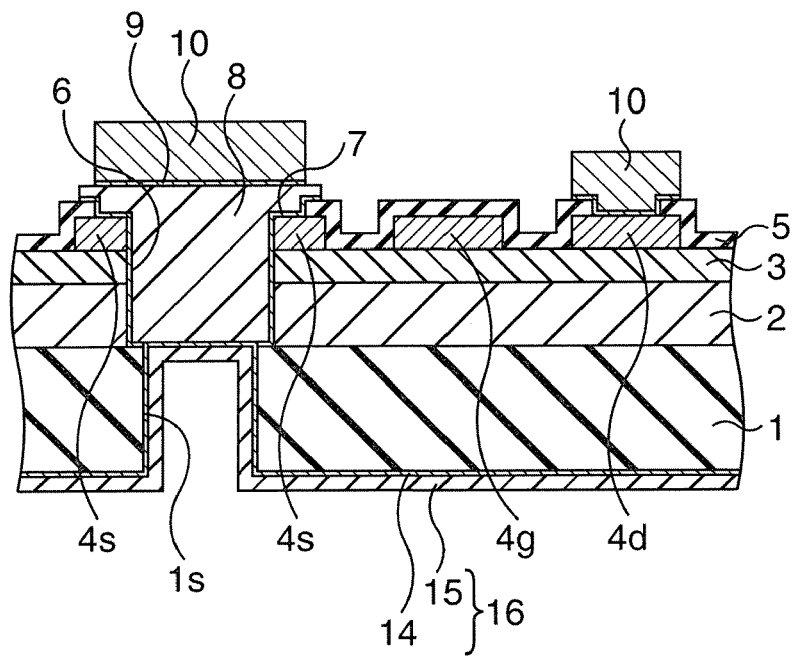
FIG. 3 is a sectional view showing a GaN base HEMT structure according to a first embodiment.

First, a first embodiment of the present embodiment will be explained. FIG. 3 is a sectional view showing a GaN base HEMT structure according to a first embodiment.

In the first embodiment, a GaN layer 2 and an n-type AlGaN layer 3 are formed in this order over a surface of an insulating substrate 1 made of SiC, for example. A source electrode 4s, a gate electrode 4g and a drain electrode 4d are selectively formed on the n-type AlGaN layer 3. A SiN layer 5 covering the source electrode 4s, the gate electrode 4g and the drain electrode 4d is also formed over the n-type AlGaN layer 3. An opening 6 which reaches the insulating substrate 1 is formed in the SiN layer 5, the source electrode 4s, the n-type AlGaN layer 3 and the GaN layer 2, and a via hole is connecting to the opening 6 is formed in the insulating substrate 1. A seed layer 7 coming into contact with the source electrode 4s and a nickel (Ni) layer 8 are formed in the opening 6, and a seed layer 9 and a gold (Au) layer 10 are formed on the nickel (Ni) layer 8. An opening reaching the drain electrode 4d is also formed in the SiN layer 5, and another seed layer 9 and another gold (Au) layer 10 are formed extending from the inside of the opening to the surface of the SiN layer 5. A via wiring 16 composing of a seed layer 14 and a gold (Au) layer 15 is formed inside the via hole 1s and over a back surface of the insulating substrate 1.

In such a GaN base HEMT, the nickel (Ni) layer 8 serves as an etching stopper when the via hole is formed. At this time, since the nickel (Ni) layer 8 reaches the surface of the insulating substrate 1, the via hole 1s never reaches the GaN layer 2. Accordingly, even there is in-plane distribution in an etching rate when the via hole is formed, it is possible to compensate for it by over-etching. Since the bottom of the nickel (Ni) layer 8 occurs not on the surface of the n-type AlGaN layer 3, but on the surface of the insulating substrate 1, the nickel (Ni) layer 8 does not disappear by conducting over-etching just to form the via hole 1s with reliability. In addition, since difference in height between the surface of the nickel (Ni) layer 8, and the gate electrode 4g and the drain electrode 4d is about the same as the conventional one, it is possible to prevent generation of distorted patterns even though a particularly thick resist pattern is not used when the gold (Au) layer 10 is formed.

In other words, by adopting such a structure described above, it is possible to reduce lowering of the yields relating to formation of the via hole 1s.

Figure 4A:
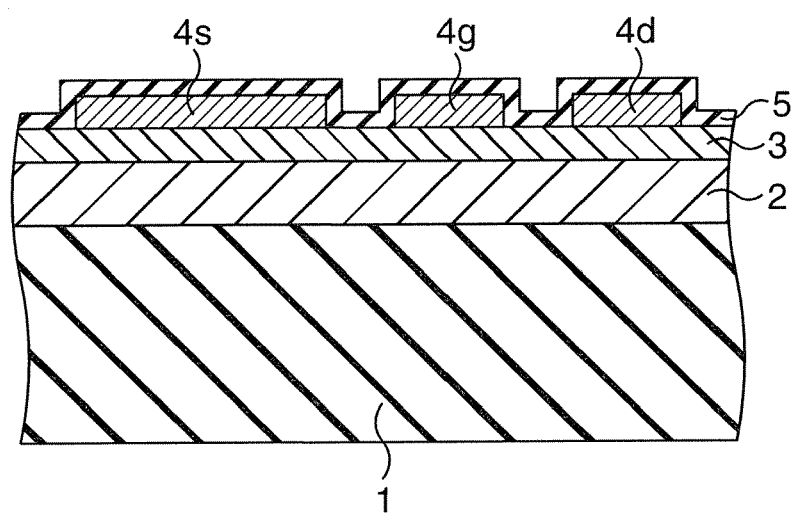
FIG. 4A to FIG. 4Y are sectional views showing a method of manufacturing the GaN base HEMT according to the first embodiment in process order.

Next, a method of manufacturing the GaN base HEMT relating to the first embodiment will be explained. FIG. 4A to FIG. 4Y are sectional views showing a method of manufacturing the GaN base HEMT according to the first embodiment in process order.

First, as shown in FIG. 4A, the GaN layer 2 and the n-type AlGaN layer 3 are formed in this order over the surface of the insulating substrate 1 made of silicon carbide (SiC), for example. The thickness of the insulating substrate 1 is about 350 μm. The thickness of the GaN layer 2 is about 2 μm, and that of the n-type AlGaN layer 3 is about 25 nm. Then, the source electrode 4s, the gate electrode 4g and the drain electrode 4d are selectively formed on the n-type AlGaN layer 3. Next, the SiN layer 5 covering the source electrode 4s, the gate electrode 4g and the drain electrode 4d is formed over the n-type AlGaN layer 3. When the source electrode 4s, the gate electrode 4g and the drain electrode 4d are formed, a titanium (Ti) layer is formed and then an aluminum (Al) layer is formed over the titanium (Ti) layer, for example.

Figure 4B:
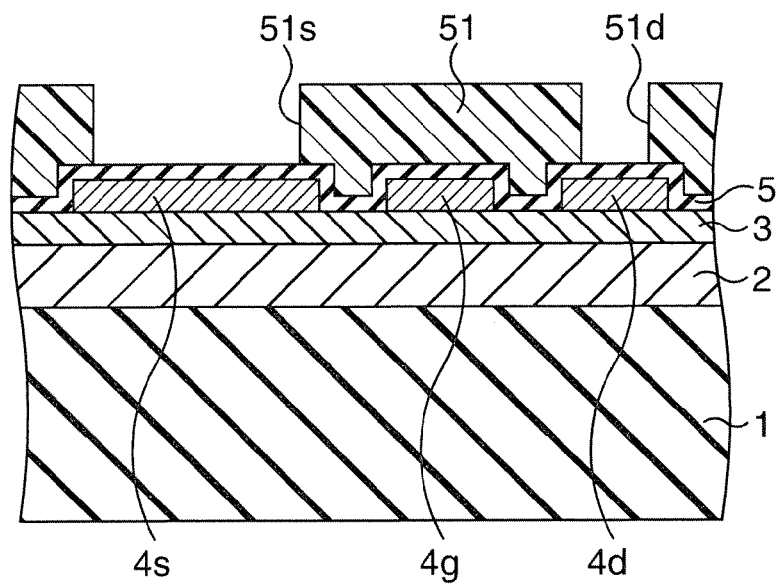

Thereafter, as shown in FIG. 4B, a resist pattern 51 provided with an opening 51s corresponding to the source electrode 4s and an opening 51d corresponding to the drain electrode 4d is formed over the SiN layer 5. The thickness of the resist pattern 51 is about 1 μm.

Figure 4C:
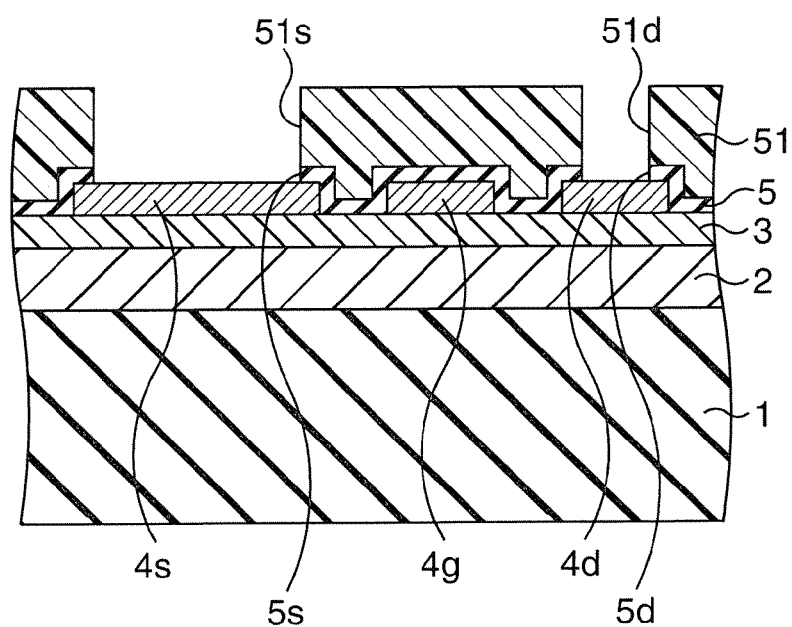

Then, as shown in FIG. 4C, by patterning the SiN layer 5 using the resist pattern 51 as a mask, a contact hole 5s matching with the opening 51s is formed above the source electrode 4s, and a contact hole 5d matching with the opening 51d is formed above the drain electrode 4d. When the SiN layer 5 is patterned, for example, $SF_6$ and $CHF_3$ are supplied into a chamber at the flow rate of 2:30, dry etching is conducted with the antenna power being set to 500 W, and the bias power being set to 50 W. The etching rate at this time is about 0.24 μm/min.

Figure 4D:
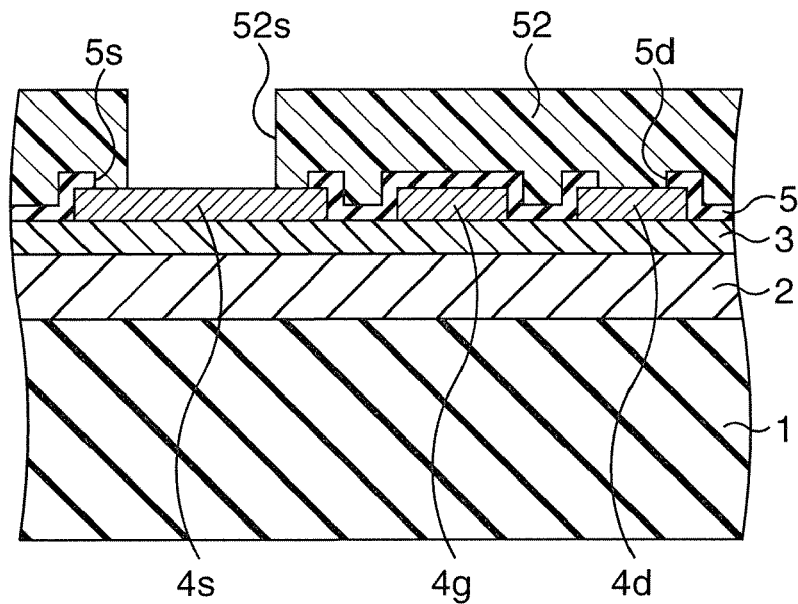

Next, the resist pattern 51 is removed, and as shown in FIG. 4D, a resist pattern 52 provided with an opening 52s which is smaller than the opening 51s and corresponding to the source electrode 4s is newly formed over the SiN layer 5 and the source electrode 4s. The thickness of the resist pattern 52 is about 10 μm. That is, the resist pattern 52 thicker than the resist pattern 152 prepared in the conventional method is formed. The diameter of the opening 52s is about 150 μm. The opening 52s of about 150 μm in diameter can be formed with high precision even the thickness of the resist pattern 52 is about 10 μm.

Figure 4E:
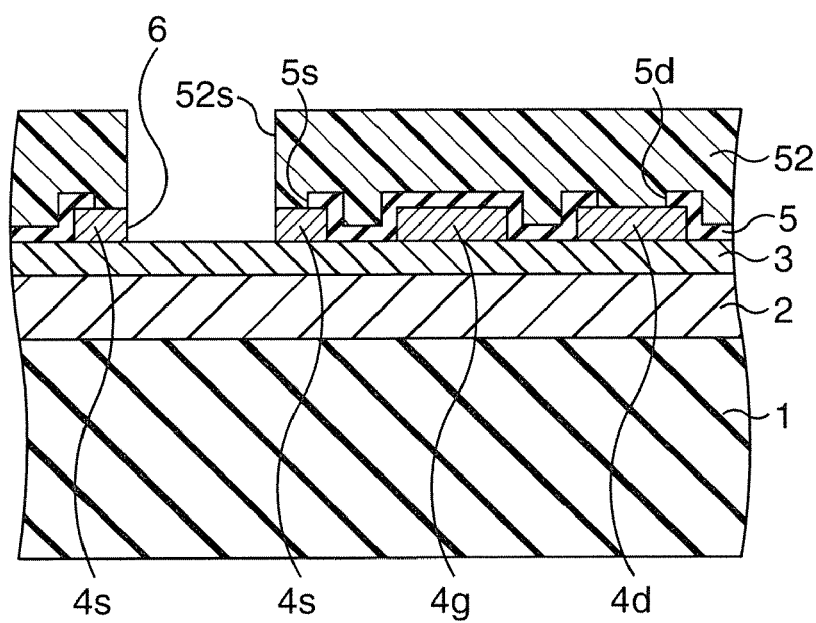

Then, as shown in FIG. 4E, the opening 6 is formed by ion-milling the source electrode 4s using the resist pattern 52 as a mask. The milling rate of the aluminum (Al) layer is about 28 nm/min, and the milling rate of the titanium (Ti) layer is about 15 nm/min, which layers compose the source electrode 4s.

Figure 4F:
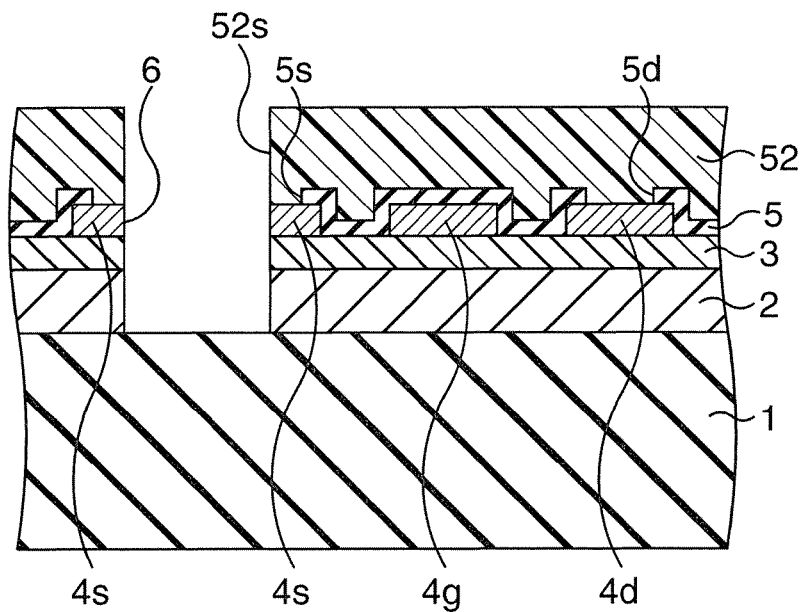

Thereafter, as shown in FIG. 4F, the opening 6 is allowed to reach the insulating substrate 1 by conducting dry etching of the n-type AlGaN layer 3 and the GaN layer 2 using the resist pattern 52 as a mask. Chlorine base gas, for example, chlorine gas ($Cl_2$) is used in the dry etching. An ICP dry etching apparatus is used for the dry etching, the antenna power is set to 200 W or 100 W, and the bias power is set to 50 W or 20 W, for example. The etching rate of the n-type AlGaN layer 3 and the GaN layer 2 in this case is about 0.2 μm/min. It should be noted that immediately before the dry etching of the n-type AlGaN layer 3 and the GaN layer 2, ion-milling of the source electrode 4s is conducted in the present embodiment, but a gas which exerts an effect on the etching rate of the n-type AlGaN 3 layer and the GaN layer 2 is not used. Accordingly, the dry etching of the n-type AlGaN layer 3 and the GaN layer 2 is conducted at an appropriate etching rate.

Note that the opening 6 may be allowed to reach inside the insulating substrate 1.

Figure 4G:
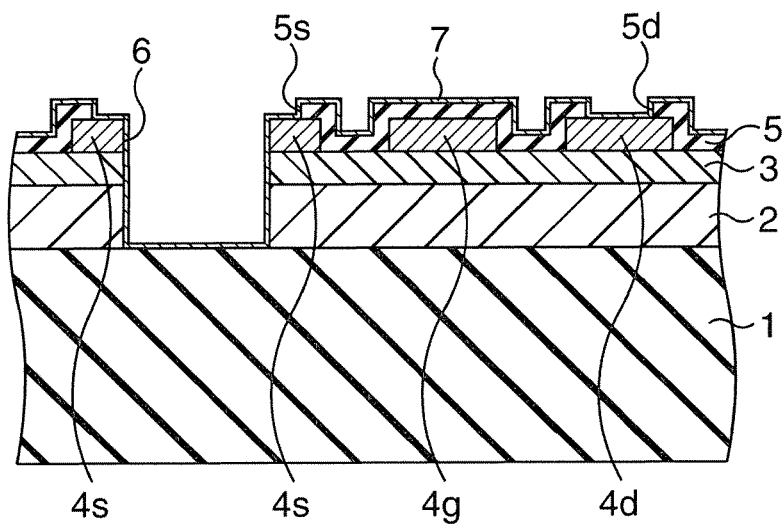

Then, the resist pattern 52 is removed, and as shown in FIG. 4G, a stacked body composed of a titanium (Ti) layer and a nickel (Ni) layer, or a titanium (Ti) layer and a copper (Cu) layer is formed as the seed layer 7 by sputtering over the whole surface on the front side of the insulating substrate 1. The thickness of the titanium (Ti) layer is about 10 nm, the thickness of the nickel (Ni) layer is about 100 nm and the thickness of the copper (Cu) layer is about 200 nm.

Figure 4H:
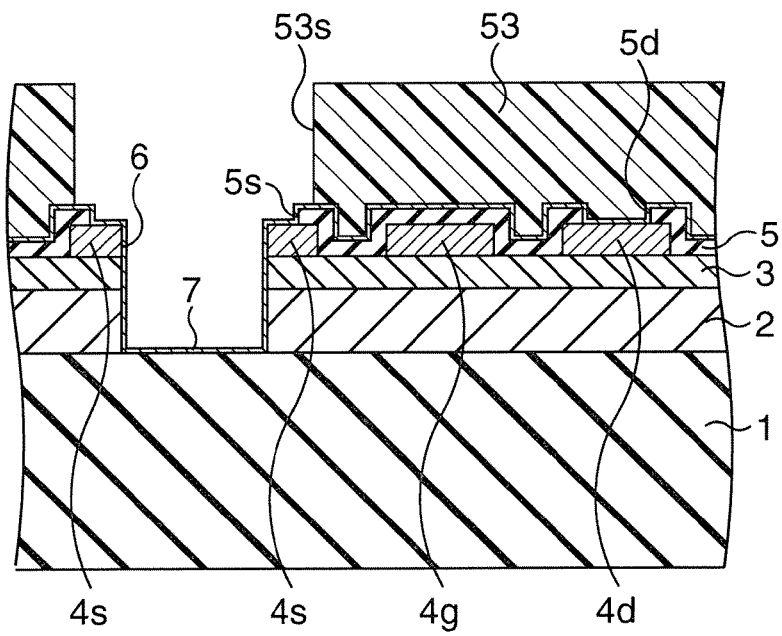

Next, as shown in FIG. 4H, a resist pattern 53 provided with an opening 53s corresponding to the outer periphery of the source electrode 4s is formed over the seed layer 7. The thickness of the resist pattern 53 is about 3 μm.

Figure 4I:
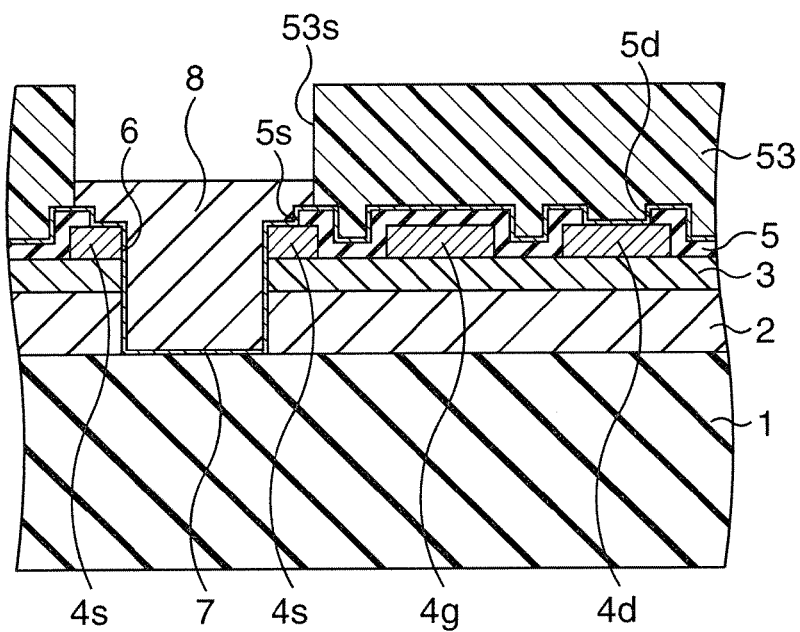

Next, as shown in FIG. 4I, the nickel (Ni) layer 8 of about 3.2 μm in thickness is formed on the seed layer 7 inside the opening 53s by electroplating. Formation of the nickel (Ni) layer 8 is conducted in a hot bath at 50° C. to 60° C., for example. The plating rate in this case is about 0.5 μm/min.

Figure 4J:
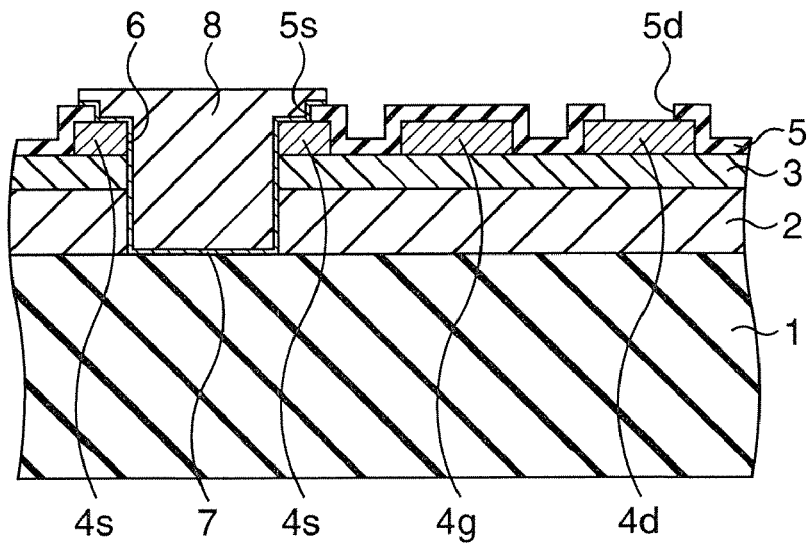

Thereafter, as shown in FIG. 4J, the resist pattern 53 is removed. Then, by ion-milling, a portion of the seed layer 7 exposing from the nickel (Ni) layer 8 is removed. The nickel (Ni) layer 8 is also processed a little simultaneously, and the resultant thickness of the nickel (Ni) layer 8 is about 3 μm. The distance between the surface of the n-type AlGaN layer 3 and the surface of the nickel (Ni) layer 8 is about 1 μm. This value is nearly the same as the thickness of the nickel (Ni) layer 108 in the conventional manufacturing method (the distance between the surface of the n-type AlGaN layer 103 and the surface of the nickel (Ni) layer 108). The milling rate of the titanium (Ti) layer forming the seed layer 7 is about 15 nm/min, the milling rate of the nickel (Ni) layer is about 25 nm/min and that of the copper (Cu) layer is about 53 nm/min.

Figure 4K:
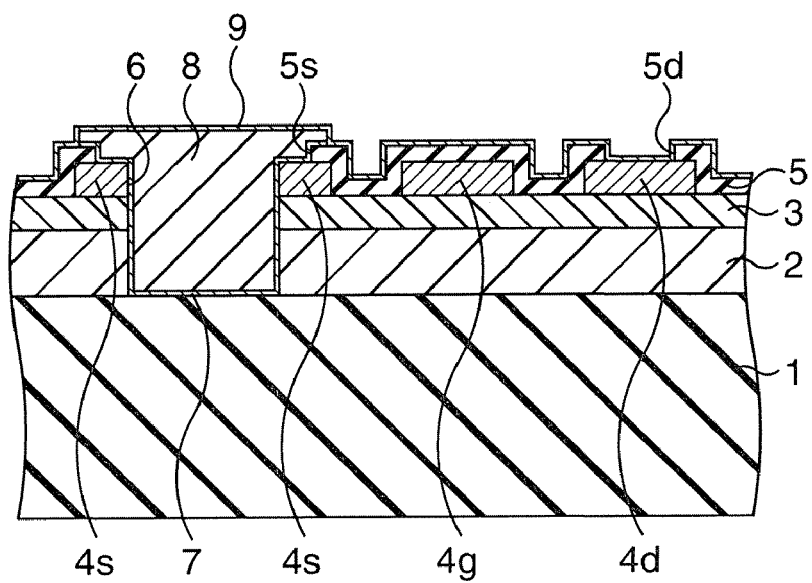

Next, as shown in FIG. 4K, a stacked body composed of a titanium (Ti) layer, a platinum (Pt) layer and a gold (Au) layer is formed as the seed layer 9 by sputtering over the whole surface on the front side of the insulating substrate 1. The thickness of the titanium (Ti) layer is about 10 nm, the thickness of the platinum (Pt) layer is about 50 nm and the thickness of the gold (Au) layer is about 200 nm.

Figure 4L:
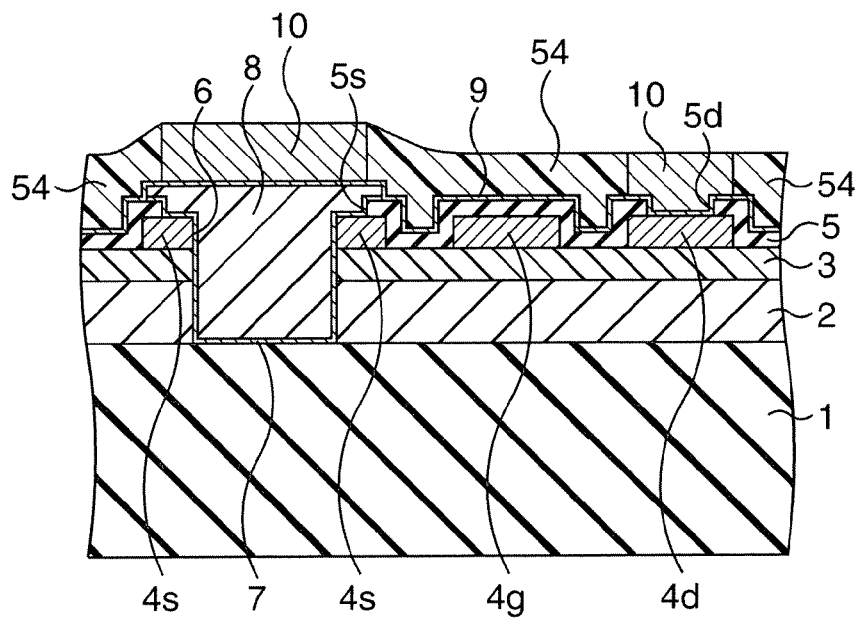

Next, as shown in FIG. 4L, a resist pattern 54 provided with an opening corresponding to the outer periphery of the source electrode 4s and an opening corresponding to the outer periphery of the drain electrode 4d is formed over the seed layer 9. The thickness of the resist pattern 54 is about 1 μm. Next, the gold (Au) layer 10 of about 1 μm in thickness is formed on the seed layer 9 inside the respective openings of the resist pattern 54 by electroplating. Formation of the gold (Au) layer 10 is conducted in a gold (Au) plating bath at 55° C. to 65° C., for example. The plating rate in this case is about 0.5 μm/min.

Figure 4M:
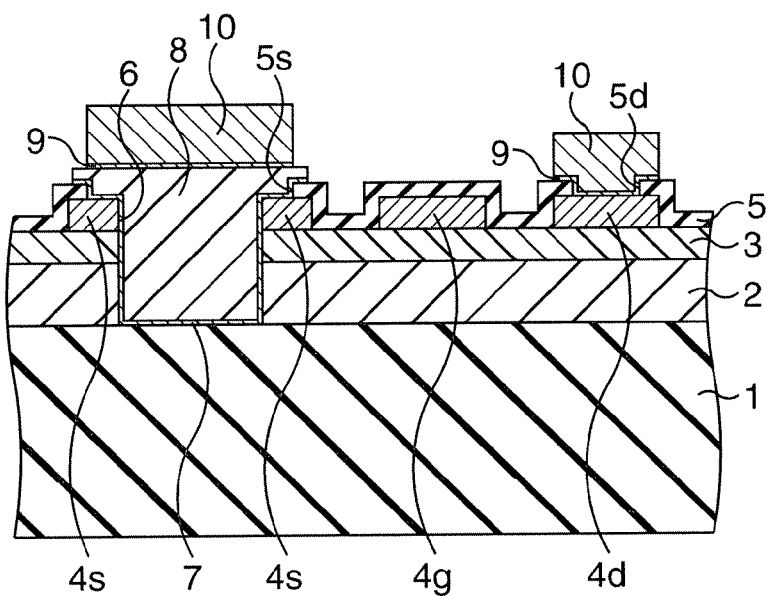

Then, as shown in FIG. 4M, the resist pattern 54 is removed. Then, by ion-milling, a portion of the seed layer 9 exposing from the gold (Au) layer 10 is removed. The gold (Au) layer 10 is also processed a little simultaneously, and the resultant thickness of the gold (Au) layer 10 is about 0.6 μm. The milling rate of the titanium (Ti) layer 9 is about 15 nm/min, the milling rate of the platinum (Pt) layer is about 30 nm/min and that of the gold (Au) layer is about 50 nm/min, which layers compose the seed layer 9.

Figure 4N:
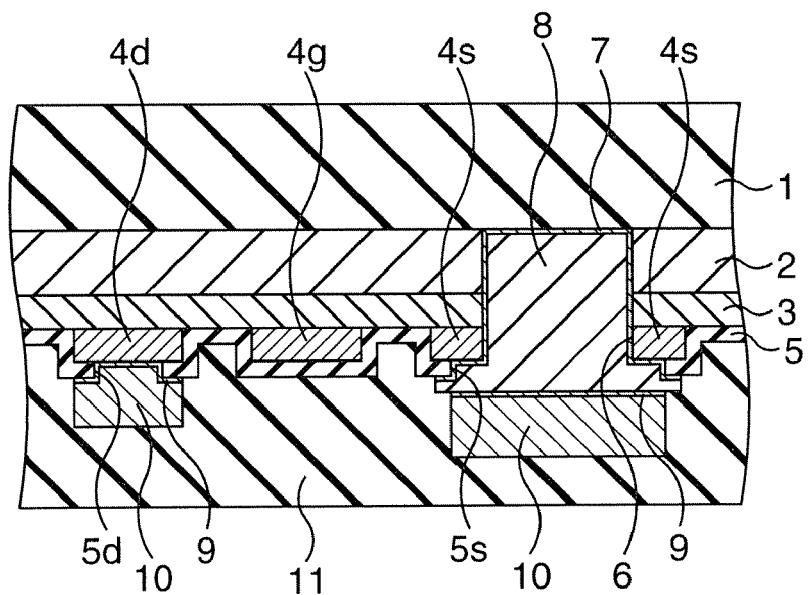

Then, as shown in FIG. 4N, the surface protecting layer 11 is formed over the whole surface on the front side of the insulating substrate 1, and the front and the back of the insulating substrate 1 are inversed. Next by polishing the back surface of the insulating substrate 1, the thickness of the insulating substrate 1 is made to be about 150 μm.

Figure 4O:
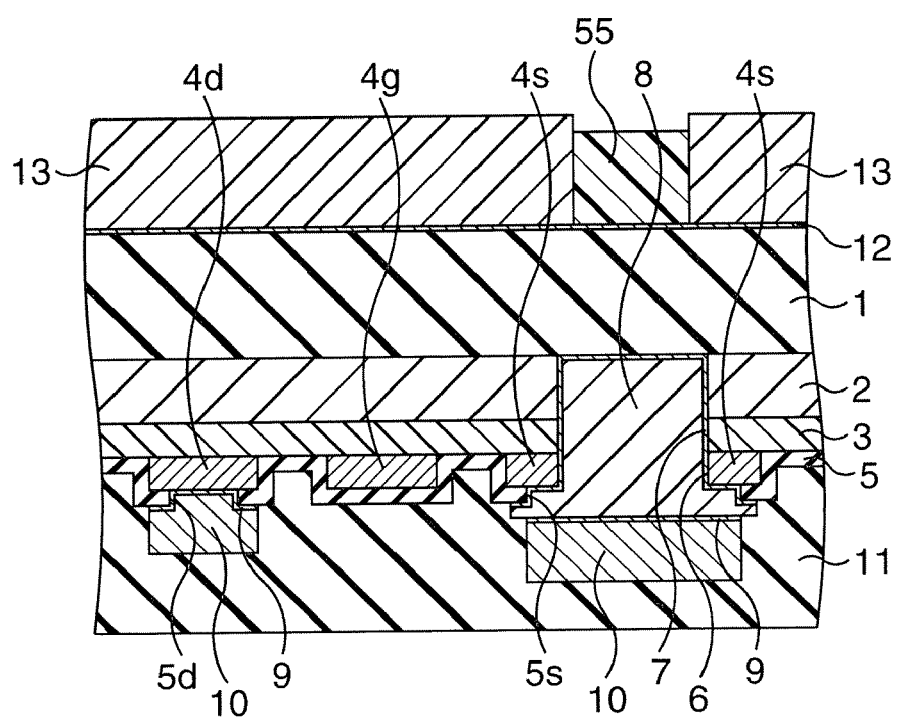

Then, as shown in FIG. 4O, a stacked body of a titanium (Ti) layer and a nickel (Ni) layer, or a stacked body of a titanium (Ti) layer and a copper (Cu) layer is formed as the seed layer 12 over the back face of the insulating substrate 1 by sputtering. The thickness of the titanium (Ti) layer is made to be about 10 nm, the thickness of the nickel (Ni) layer is made to be about 100 nm and the thickness of the copper (Cu) layer is made to be about 200 nm. Thereafter, a resist pattern 55 covering a part corresponding to the source electrode 4s is formed on the seed layer 12. The thickness of the resist pattern 55 is about 3 μm, and the diameter is about 100 μm. A nickel (Ni) layer 13 of about 3.2 μm in thickness is formed over the seed layer 12 in the area excepting the resist pattern 55 by electroplating. Formation of the nickel (Ni) layer 13 is conducted, for example, in a hot bath at 50° C. to 60° C. The plating rate in this case is about 0.5 μm/min.

Figure 4P:
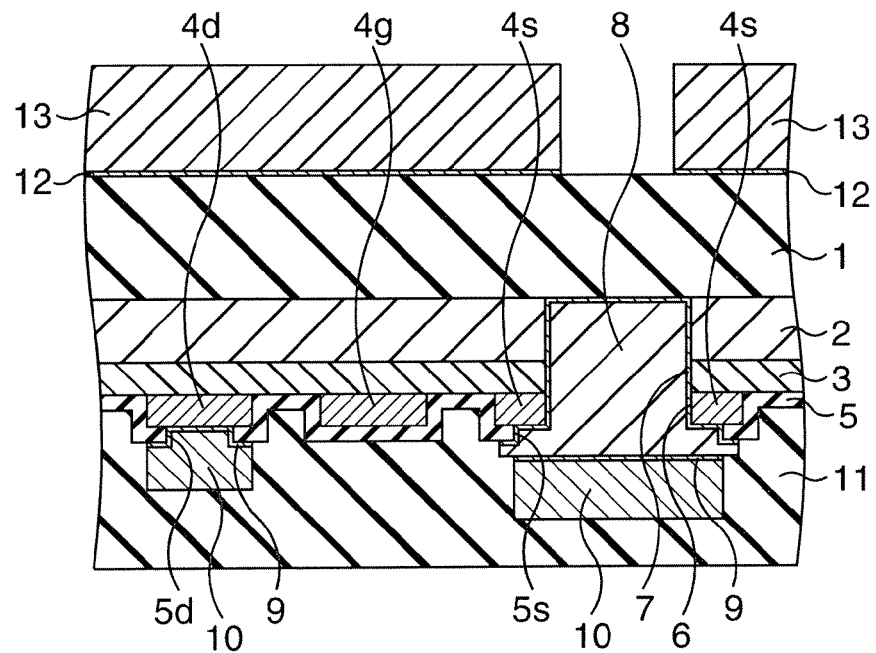

Next, as shown in FIG. 4P, the resist pattern 55 is removed. Then, by ion-milling, a portion of the seed layer 12 exposing from the nickel (Ni) layer 13 is removed. The nickel (Ni) layer 13 is also processed a little simultaneously, and the resultant thickness of the nickel (Ni) layer 13 is about 3 μm. The milling rate of the titanium (Ti) layer is about 15 nm/min, the milling rate of the nickel (Ni) layer is about 25 nm/min and that of the copper (Cu) layer is about 53 nm/min, which layers compose the seed layer 12.

Figure 4Q:
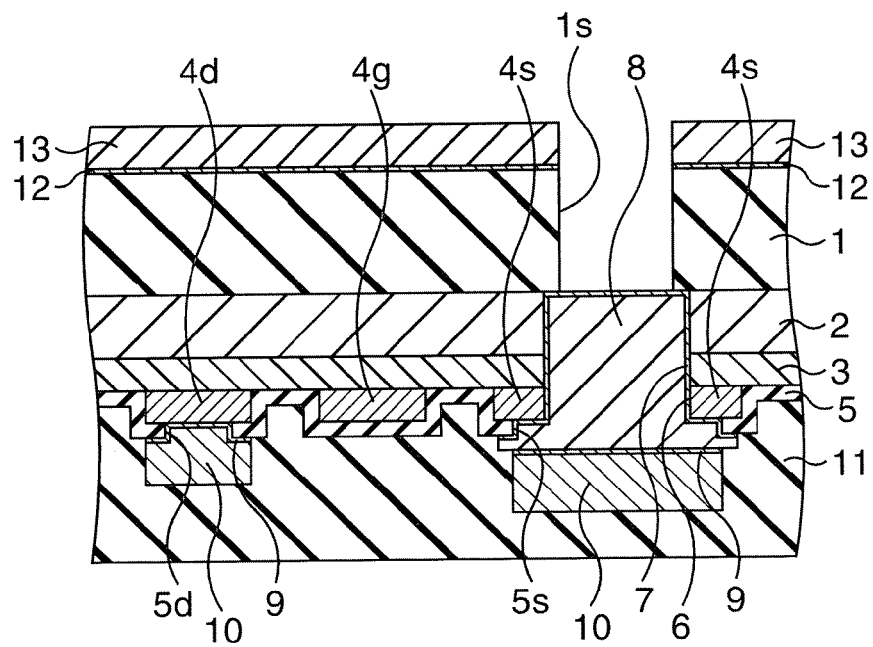

Thereafter, as shown in FIG. 4Q, the via hole is is formed by conducting dry etching of the insulating substrate 1 using the nickel (Ni) layer 13 as a mask. In the dry etching, fluoride base gas, for example, a mixed gas of sulfur hexafluoride ($SF_6$) gas and oxygen ($O_2$) gas is used. An ICP dry etching apparatus is used for the dry etching, the antenna power is set to 900 W, and the bias power is set to 150 W. The etching rate of the insulating substrate 1 made of SiC in this case is about 0.75 μm/min. The etching selection ratio between the insulating substrate 1 and the nickel (Ni) layer 13 is about 100.

It should be noted that since the in-plane distribution of the dry etching rate of the insulating substrate 1 made of SiC may be great, it is preferable to conduct over-etching. For example, estimating that the variation in the dry etching rate of the insulating substrate 1 (in-plane distribution) is about ±5%, 33% of over-etching (corresponding to the etching amount of SiC having 50 μm in thickness) is conducted for the purpose of forming the via hole 1s of 150 μm in depth.

Figure 4R:
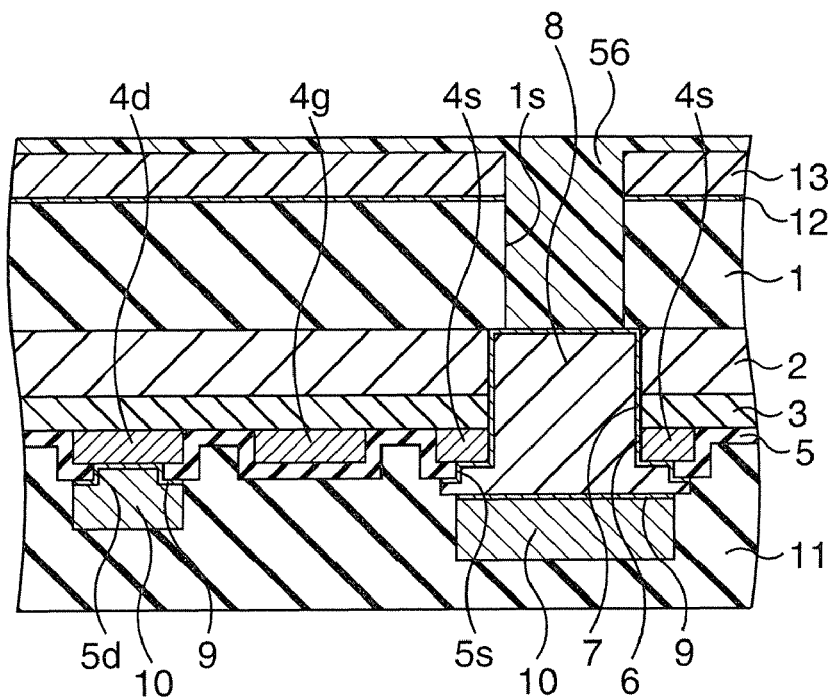

Then, as shown in FIG. 4R, a resist layer 56 is formed in the via hole 1s and over the nickel (Ni) layer 13.

Figure 4S:
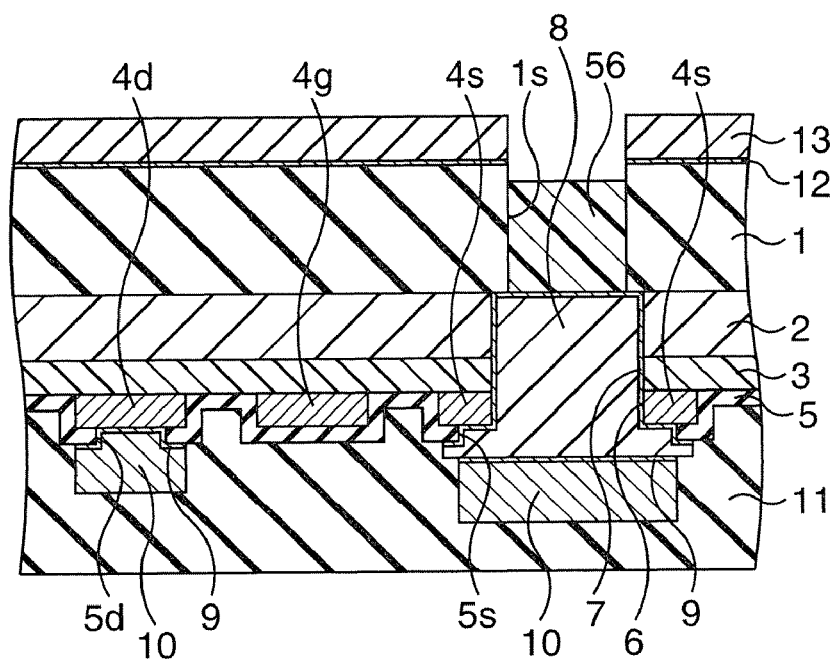

Next, as shown in FIG. 4S, the resist layer 56 is left only in the via hole 1s by conducting exposure and development to the resist layer 56. The remaining resist layer 56 serves as a protecting layer.

Figure 4T:
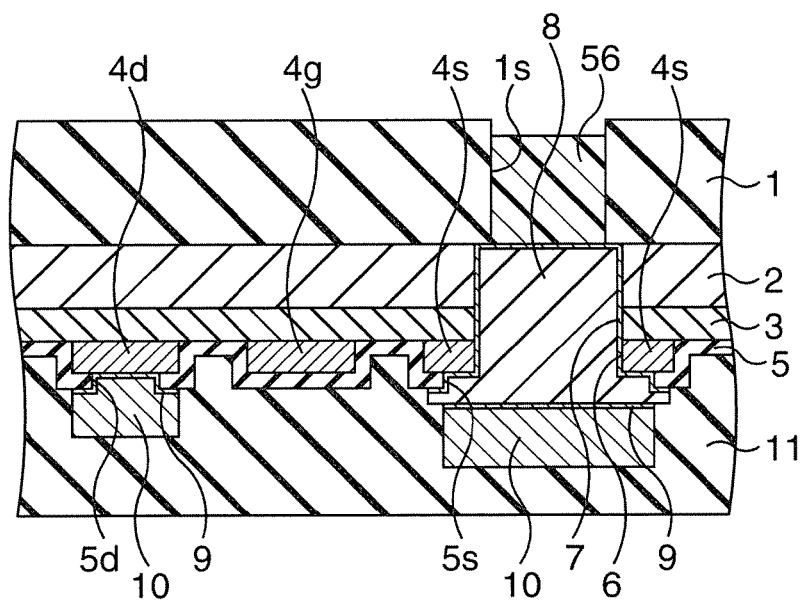

Then, as shown in FIG. 4T, by ion-milling with argon ion and/or wet etching with dilute nitric acid, the nickel (Ni) layer 13 and the seed layer 12 are removed. The milling rate of the nickel (Ni) layer 13 is about 25 nm/min and the wet etching rate using dilute nitric acid is about 50 nm/min.

Figure 4U:
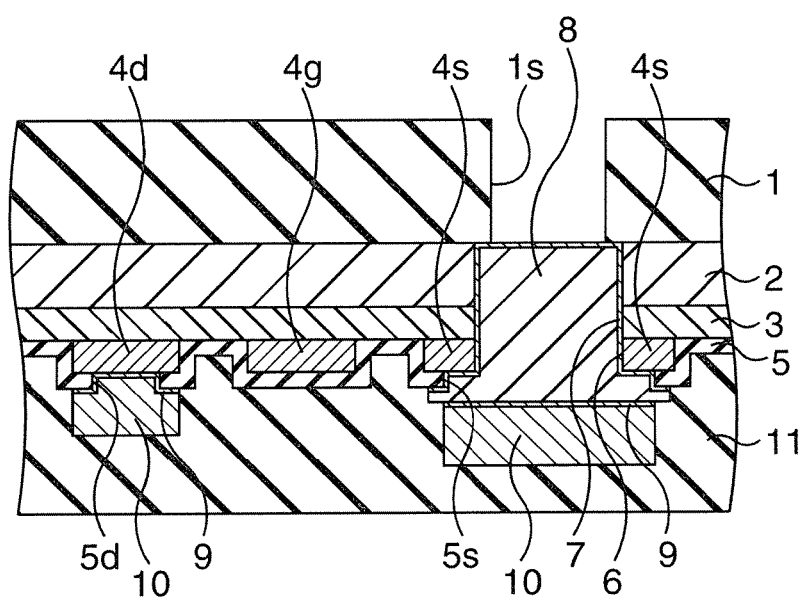

Thereafter, as shown in FIG. 4U, the resist layer 56 is removed.

Figure 4V:
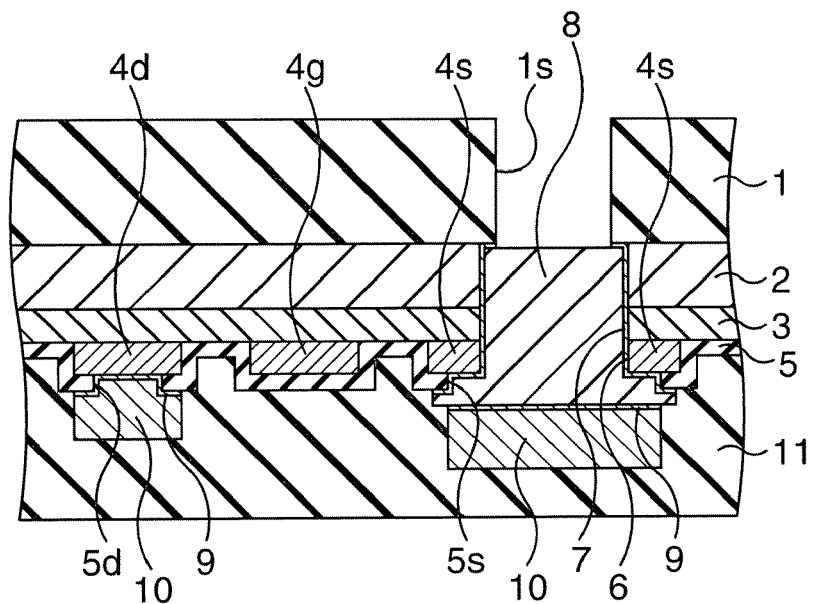

Then, as shown in FIG. 4V, a portion of the seed layer 7 exposing from the via hole 1s is removed by ion-milling. The milling rate of the titanium (Ti) layer is about 15 nm/min, the milling rate of the nickel (Ni) layer is about 25 nm/min and that of the copper (Cu) layer is about 53 nm/min, which layers compose the seed layer 7.

Figure 4W:
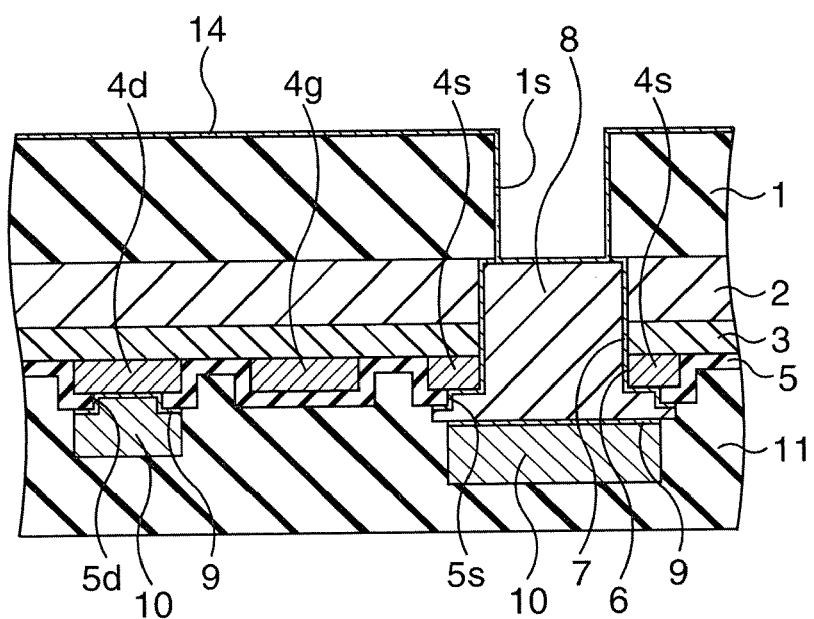

Next, as shown in FIG. 4W, a stacked body composed of a titanium (Ti) layer, a platinum (Pt) layer and a gold (Au) layer is formed as the seed layer 14 by sputtering over the whole surface on the back side of the insulating substrate 1. The thickness of the titanium (Ti) layer is about 10 nm, the thickness of the platinum (Pt) layer is about 50 nm and the thickness of the gold (Au) layer is about 200 nm.

Figure 4X:
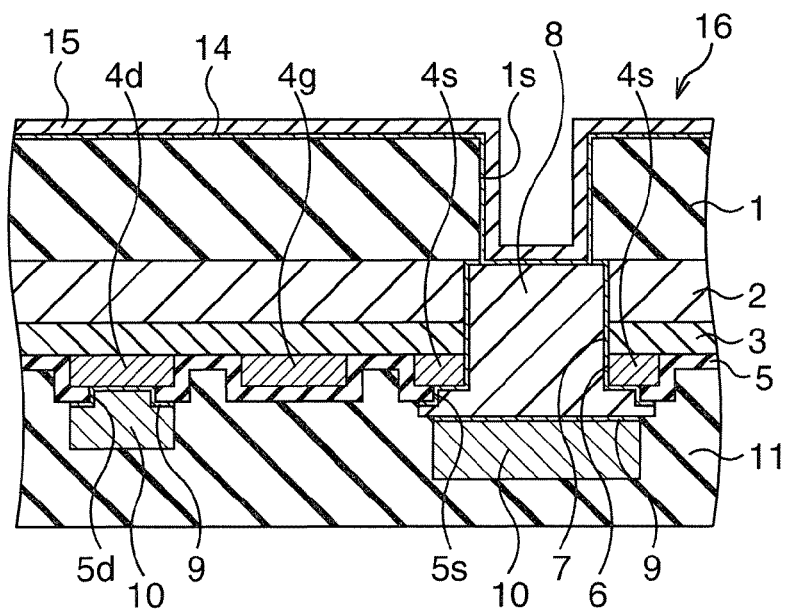
Figure 4Y:
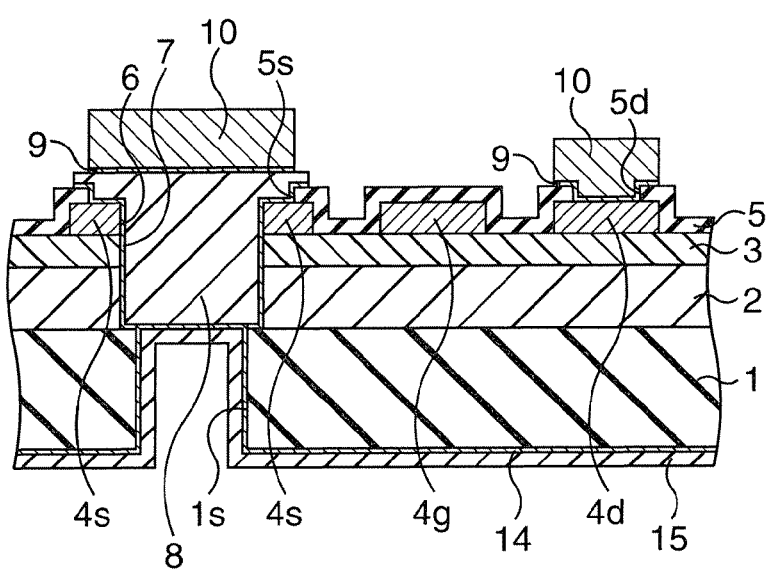

Then, as shown in FIG. 4X, by electroplating, the gold (Au) layer 15 of about 10 μm in thickness is formed over the seed layer 14. Formation of the gold (Au) layer 15 is conducted in a gold (Au) plating bath at 55° C. to 65° C., for example. The plating rate in this case is about 0.5 μm/min. The via wiring 16 is composed of the gold (Au) layer 15 and the seed layer 14, for example. Note that when the gold (Au) layer 15 is formed in the via hole is having the diameter of about 100 μm and the depth of about 150 μm by electroplating, the gold (Au) layer 15 is formed only on the bottom and the sides of the via hole is, so that the via hole is not completely infilled.

Thereafter, as shown in FIG. 4Y, the front and the back of the insulating substrate 1 are inversed and the surface protecting layer 11 is removed. A GaN base HEMT is completed by forming a wiring (not shown) and so on as necessary.

By such a method like this, when the via hole is is formed, since the bottoms of the seed layer 7 and the nickel layer 8 serving as an etching stopper come into contact with the area where the via hole is of the insulating substrate 1 is formed, and the GaN layer 2 and the n-type AlGaN layer 3 do not exist between these, there is no possibility that the GaN layer 2 and the n-type AlGaN layer 3 are etched excessively even when over-etching is conducted. In addition, since the nickel (Ni) layer 8 is thick, the nickel (Ni) layer 8 does not disappear by the over etching, it works as an etching stopper with reliability. Furthermore, since the distance between the surface of the nickel (Ni) layer 8 and the surface of the n-type AlGaN layer 3 is as small as 1 μm even though the nickel (Ni) layer 8 is thicker than the conventional nickel (Ni) layer 108, the thickness of the resist pattern 54 is easily made uniform even when the thickness of the resist pattern 54 is made as thin as 1 μm. Accordingly, distortion is not likely to have occurred in the pattern, and it is possible to keep the opening precision of the pattern high. In addition, since dry etching of the insulating substrate with $SF_6$ is not conducted before etching of the GaN layer 2 and the n-type AlGaN layer 3, there is no possibility of receiving the effect of the remaining $SF_6$ when dry etching of the GaN layer 2 and the n-type AlGaN layer 3.

Accordingly, according to the present embodiment, it is possible to make the nickel (Ni) layer 8 serve as an etching stopper with reliability while ensuring high yields obtained from the over-etching. Then, it becomes possible to obtain high yields while reducing the increase number of steps, which results in the reduction of manufacturing costs.

Second Embodiment

Next, a second embodiment will be explained. In the second embodiment, the method of removing a metal mask differs from that in the first embodiment. FIGS. 5A to 5D are sectional views showing a method of manufacturing a GaN base HEMT according to the second embodiment in process order.

Figure 5A:
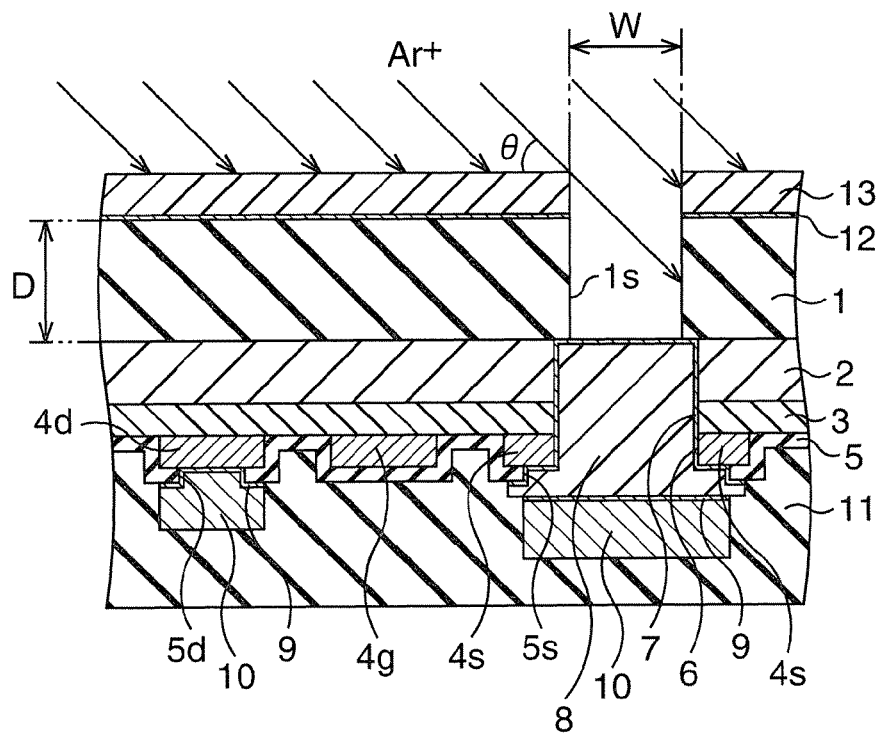
FIG. 5A to FIG. 5D are sectional views showing a method of manufacturing a GaN base HEMT according to a second embodiment in process order.
Figure 5B:
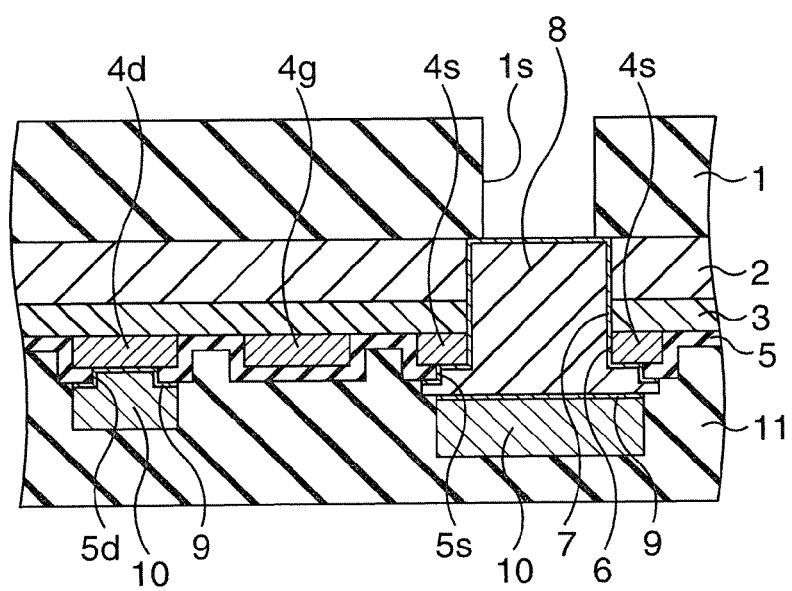

In the second embodiment, first, similarly to the first embodiment, the treatment upto the formation of the via hole is conducted (FIG. 4Q). Next, as shown in FIG. 5A, ion-milling with argon ion is conducted. In the ion-milling, the incident angle θ of the argon ion is made smaller than arctan (D/W), when the thickness of the insulating substrate 1 is D (μm), and the diameter of the via hole is W (μm). As a result, as shown in FIG. 5B, while the nickel (Ni) layer 13 and the seed layer 12 which serve as a metal mask are removed, the seed layer 7 and the nickel (Ni) layer 8 remain since the argon ion is prevented from reaching the bottom of the via hole is.

Figure 5C:
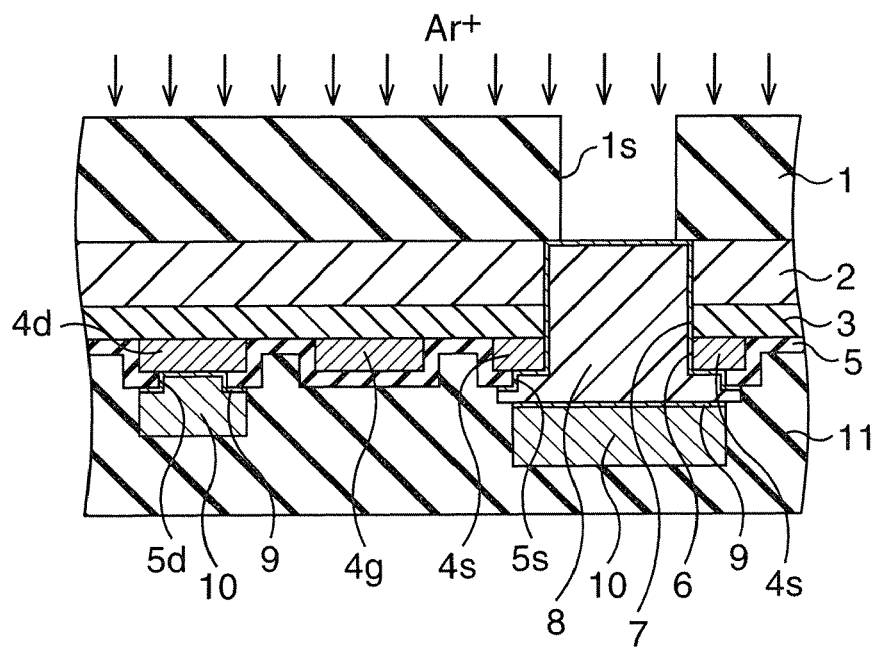
Figure 5D:
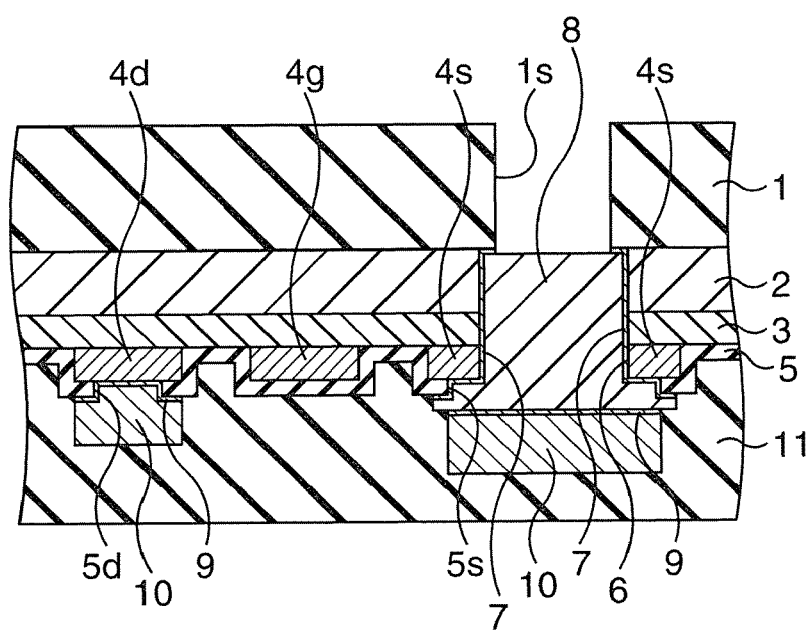

Then, as shown in FIG. 5C, ion-milling with argon ion is conducted. In the ion milling, the incident angle of the argon ion is set to 90°. As a result, as shown in FIG. 5D, the portion of the seed layer 7 exposed from the via hole is removed.

Thereafter, similarly to the first embodiment, the treatment after the formation of the seed layer 14 (FIG. 4W) is conducted.

According to the second embodiment, an effect similar to that obtained by the first embodiment is achieved, and at the same time, compared with the first embodiment, the number of steps can be reduced because the formation of the resist layer 56 and so on becomes unnecessary.

Third Embodiment

Next, a third embodiment will be explained. In the third embodiment, the method of removing a metal mask differs from those in the first embodiment and in the second embodiment. FIGS. 6A to 6D are sectional views showing a method of manufacturing a GaN base HEMT according to the third embodiment in process order.

Figure 6A:
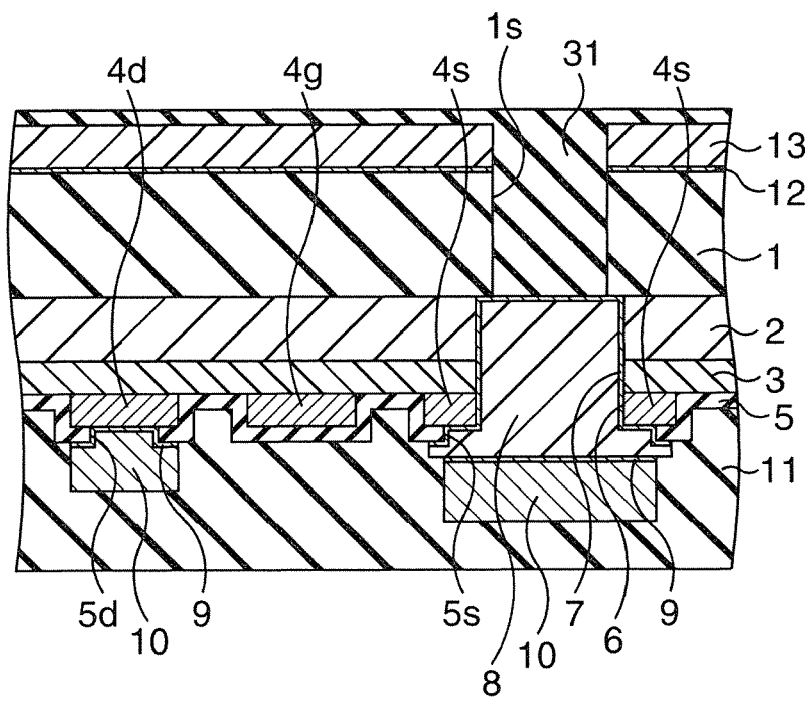
FIG. 6A to FIG. 6D are sectional views showing a method of manufacturing a GaN base HEMT according to a third embodiment in process order.

In the third embodiment, first, similarly to the first embodiment, the treatment upto the formation of the via hole is conducted (FIG. 4Q). Next, as shown in FIG. 6A, a SOG (spin on glass) layer 31 is formed in the via hole 1s and over the nickel (Ni) layer 13. For forming the SOG layer 31, first, by applying a coating liquid of an SOG over the whole surface on the front side of the insulating substrate 1 at a rotation speed of 1500 rpm, for example, by a spin coating method, the inside of the via hole 1s is filled with the coating liquid. Next, the coating liquid of the SOG is cured by conducting baking at about 300° C. The SOG layer 31 is thus formed.

Figure 6B:
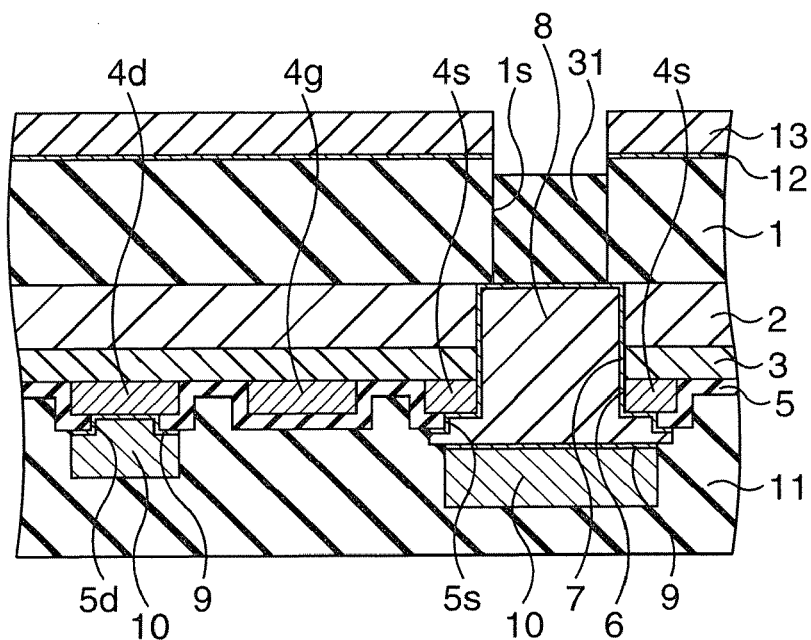

After forming the SOG layer 31, by conducting etch back of the SOG layer 31 with a buffered hydrofluoric acid or the like, as shown in FIG. 6B, the SOG layer 31 lower in height than the thickness of the insulating substrate 1 is made to remain in the via hole is. Etch back of the SOG layer 31 is conducted until it is separated from the nickel (Ni) layer 13 and the seed layer 12. The remaining SOG layer 31 serves as a protecting layer.

Figure 6C:
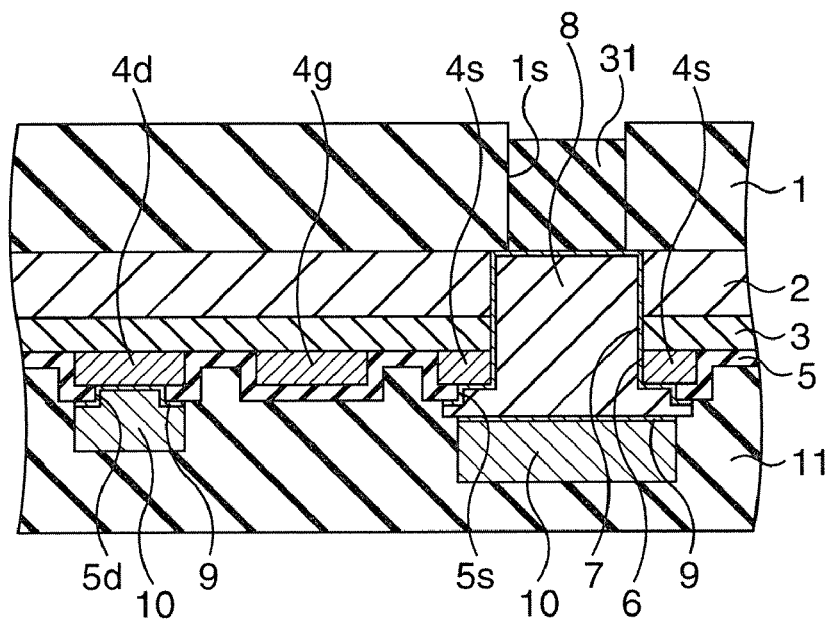

Next, as shown in FIG. 6C, by ion-milling with argon ion and/or wet etching with dilute nitric acid, the nickel (Ni) layer 13 and the seed layer 12 are removed.

Figure 6D:
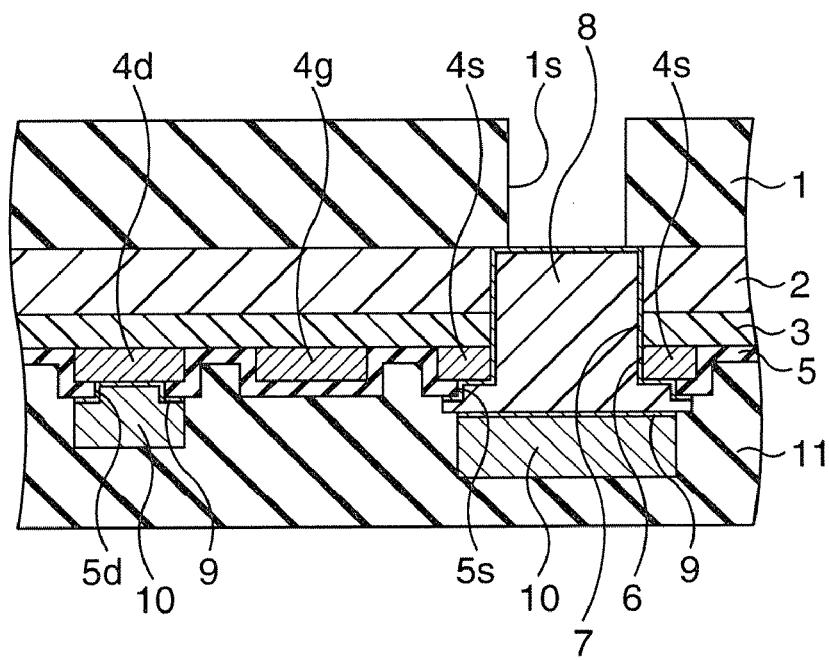

Thereafter, as shown in FIG. 6D, the SOG layer 31 is removed.

Thereafter, similarly to the first embodiment, the treatment after the removal of the portion of the seed layer 7 is conducted (FIG. 4V).

According to the third embodiment, an effect similar to that obtained by the first embodiment is obtained, and at the same time, compared with the first embodiment, the number of steps can be reduced because exposure and development of the resist layer 56 and so on become unnecessary.

It should be noted that as a protecting layer to be formed in the via hole is, an insulating layer such as a benzocyclobutene (BCB) layer, a polyimide layer, or the like may be formed instead of the SOG layer 31. In addition, dry etching may be performed as for etching of these layers. As for the coating liquid of the SOG, either organic SOG or inorganic SOG may be used.

Fourth Embodiment

Next, a fourth embodiment will be explained. In the fourth embodiment, the method of forming via wiring differs from that in the first embodiment. FIGS. 7A to 7D are sectional views showing a method of manufacturing a GaN base HEMT according to the fourth embodiment in process order.

Figure 7A:
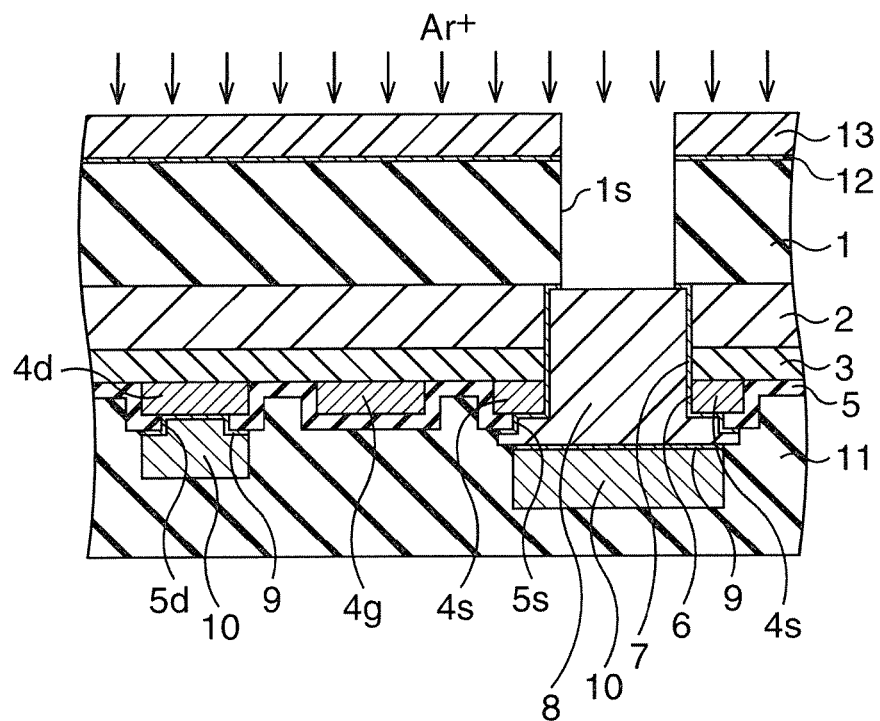
FIG. 7A to FIG. 7D are sectional views showing a method of manufacturing a GaN base HEMT according to a fourth embodiment in process order.

In the fourth embodiment, first, similarly to the first embodiment, the treatment upto the formation of the via hole is conducted (FIG. 4Q). Then, as shown in FIG. 7A, a portion of the seed layer 7 exposing from the via hole 1s is removed by ion-milling with argon ion. At this time, a part of the nickel (Ni) layer 13 is removed, but the larger part of the nickel (Ni) layer 13 remains.

Figure 7B:
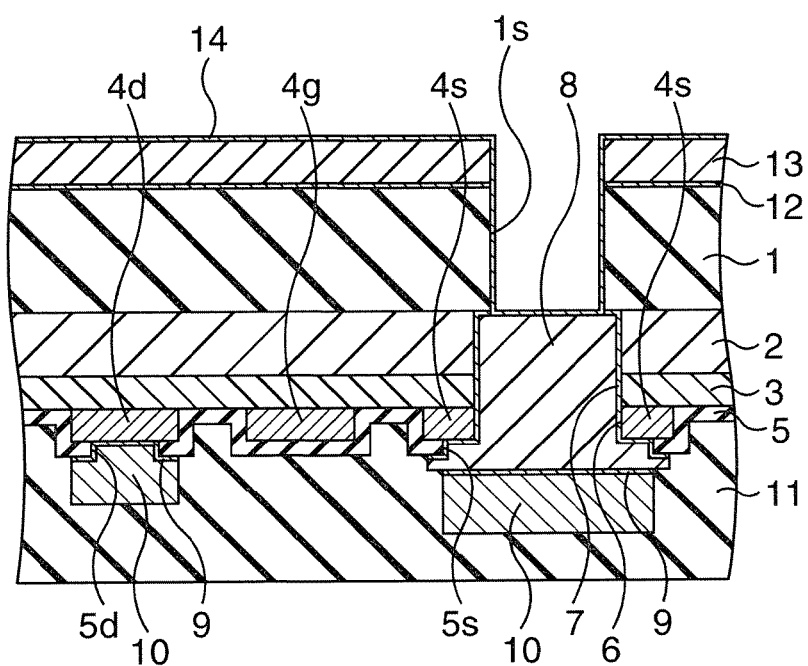

Next, as shown in FIG. 7B, a stacked body composed of a titanium (Ti) layer, a platinum (Pt) layer and a gold (Au) layer is formed by sputtering over the whole surface on the back side of the insulating substrate 1 as the seed layer 14. The thickness of the titanium (Ti) layer is about 10 nm, that of the platinum (Pt) layer is about 50 nm and that of the gold (Au) layer is about 200 nm.

Figure 7C:
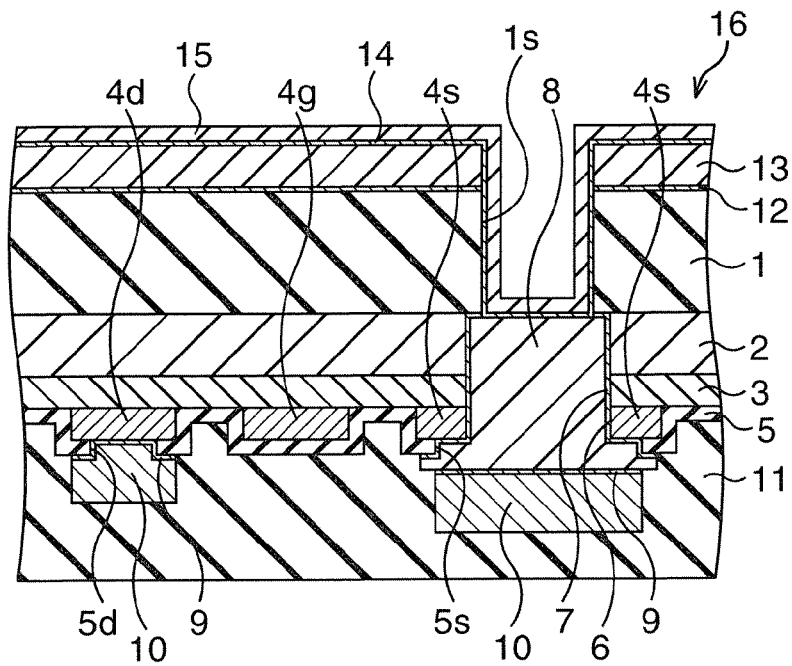

Then, as shown in FIG. 7C, by electroplating, the gold (Au) layer 15 of about 10 μm in thickness is formed over the seed layer 14.

Figure 7D:
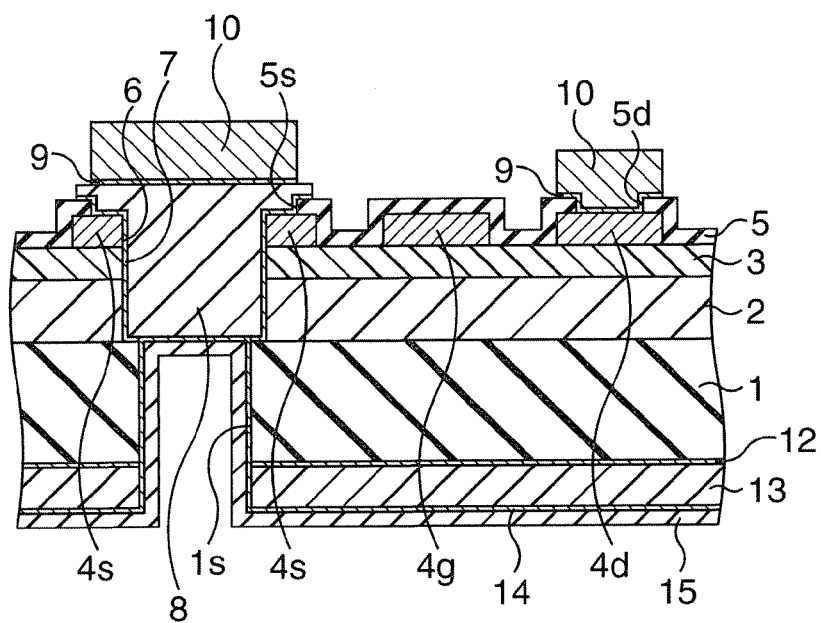

Thereafter, as shown in FIG. 7D, the front and the back of the insulating substrate 1 are inversed and the surface protecting layer 11 is removed. Then, the GaN base HEMT is completed by forming a wiring (not shown) and so on.

According to this fourth embodiment, an effect similar to that obtained by the first embodiment is obtained, and at the same time, compared with the first embodiment, the number of steps can be reduced because removal of the nickel (Ni) layer 13 and the seed layer 12 become unnecessary.

Fifth Embodiment

Figure 8A:
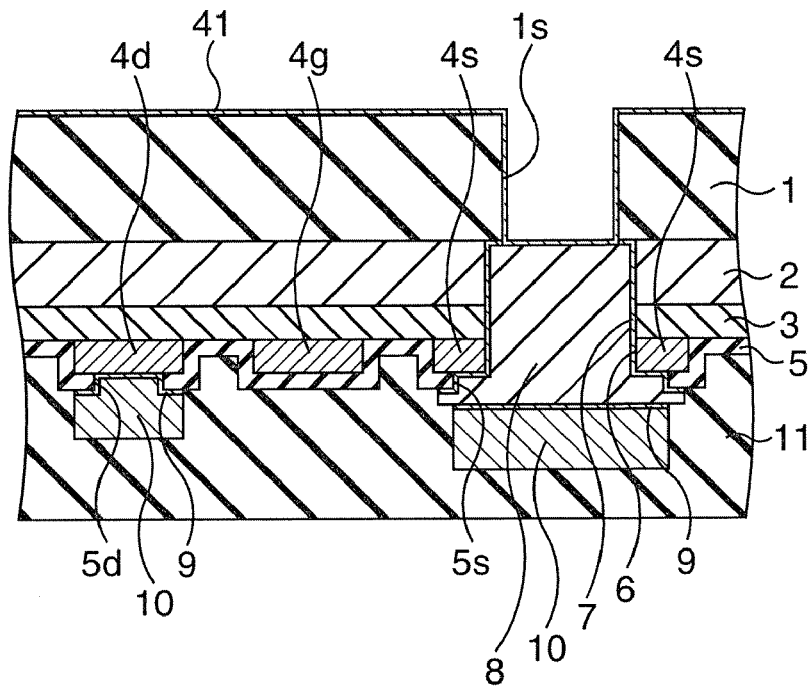
FIG. 8A to FIG. 8C are sectional views showing a method of manufacturing a GaN base HEMT according to a fifth embodiment in process order.
Figure 8B:
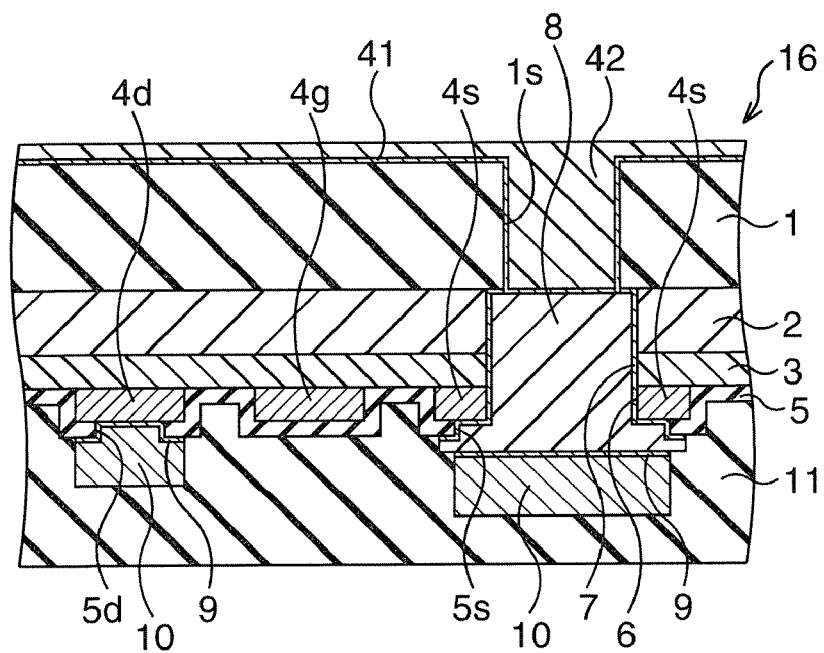
Figure 8C:
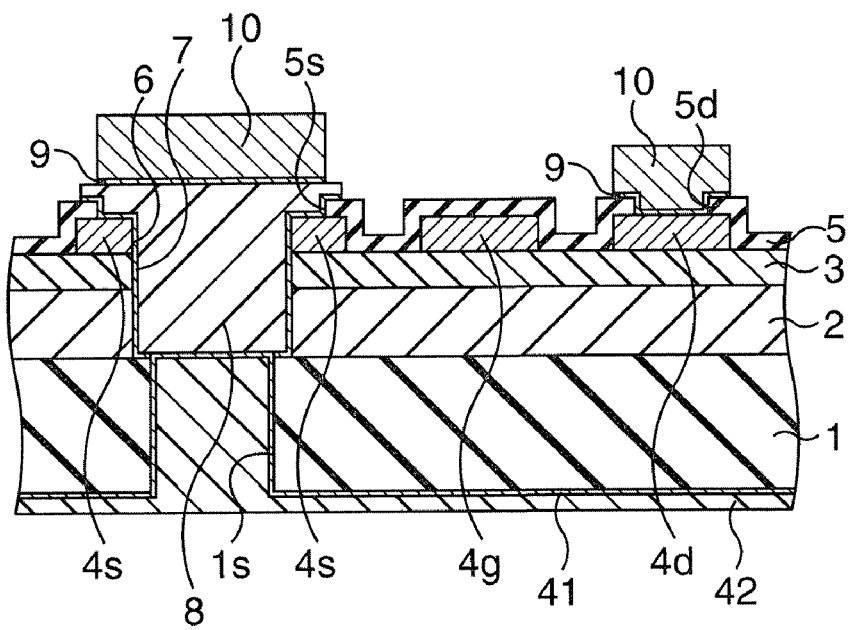

Next, a fifth embodiment will be explained. In the fifth embodiment, the method of forming via wiring differs from that in the first embodiment. FIGS. 8A to 8C are sectional views showing a method of manufacturing the GaN base HEMT according to the fifth embodiment in process order.

In the fifth embodiment, first, similarly to the first embodiment, the treatment upto the removal of the portion of the seed layer 7 is conducted (FIG. 4V). Then, as shown in FIG. 8A, a stacked body composed of a titanium (Ti) layer, a tantalum nitride (TaN) layer and a copper (Cu) layer is formed as a seed layer 41 by sputtering over the whole surface on the back side of the insulating substrate 1. The thickness of the titanium (Ti) layer is about 10 nm, that of the tantalum nitride (TaN) layer is about 40 nm and that of the copper (Cu) layer is about 200 nm.

Then, as shown in FIG. 8B, by electroplating, a copper (Cu) layer 42 is formed over the seed layer 41.

Thereafter, as shown in FIG. 8C, the front and the back of the insulating substrate 1 are inversed and the surface protecting layer 11 is removed. Then, the GaN base HEMT is completed by forming a wiring (not shown) and so on.

According to this fifth embodiment also, an effect similar to that obtained by the first embodiment can be obtained. In addition, although it is difficult to infill the inside of the via hole is with the gold (Au) layer 15 according to the first embodiment, it is possible to completely infill the inside of the via hole is with the copper (Cu) layer 42 according to the fifth embodiment. Generally, a GaN base HEMT is bonded to a package using gold-and-tin (AuSn) solder or the like. Accordingly, as in the first to fourth embodiments, while the via hole is not completely infilled with the via wiring 16, the gold-and-tin (AuSn) solder or the like goes into the via hole is, and cracking may occur when the gold-and-tin solder or the like is solidified. On the contrary, in the fifth embodiment, since the via hole is completely infilled with the via wiring 16, it is possible to prevent occurrence of such cracking.

Note that the first to fifth embodiments may appropriately combined.

—Improvement in Etching Rate—

Figure 9A:
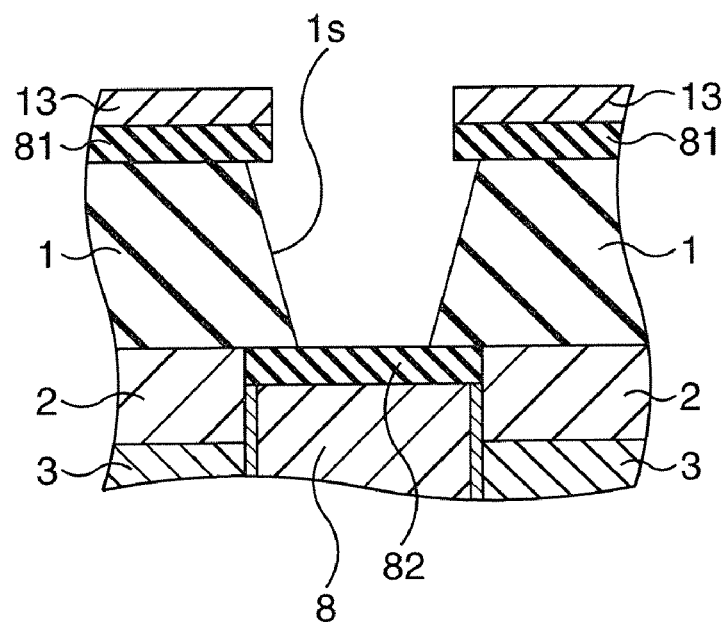
FIG. 9A is a sectional view showing a state after conducting high speed etching.
Figure 10A:
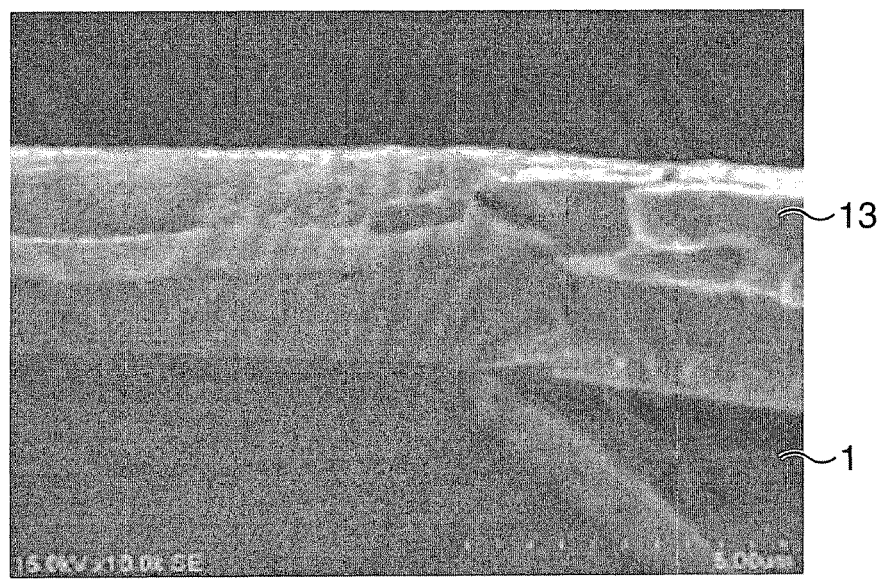
FIG. 10A is a view showing an alteration layer 81 positioned above an insulating substrate 1.
Figure 10B:
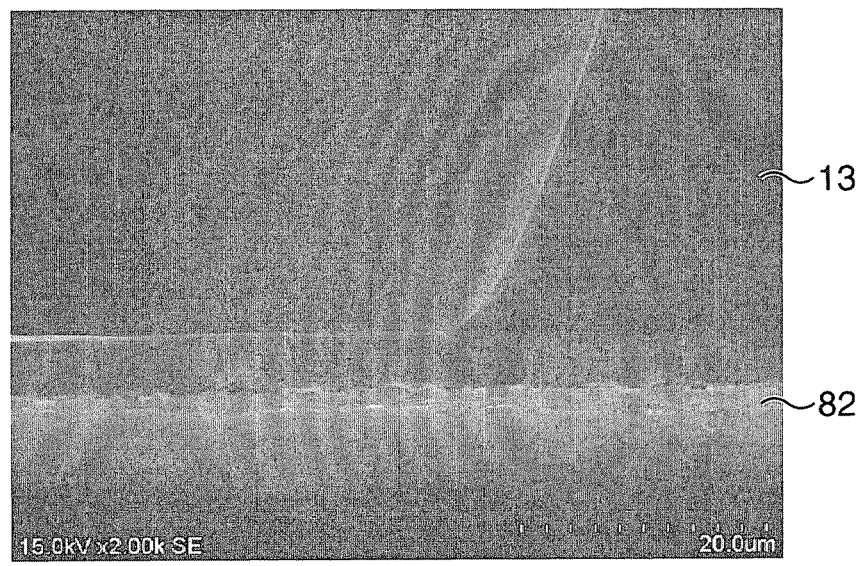
FIG. 10B is a view showing an alteration layer 82 positioned below the insulating substrate 1.

In the first embodiment, the etching rate of the insulating substrate 1 made of SiC is set to about 0.75 μm/min, but in order to improve in throughput, it is preferable to increase the etching rate. When high speed etching is conducted at the speed of 2 μm/min or more, however, since the temperature of the insulating substrate 1 becomes too hot, and plasma energy is given to the ICP dry etching apparatus, a reaction between the seed layer 12 and the nickel (Ni) layer 13 serving as the metal mask and the insulating substrate 1 occurs. Further, the reaction between the seed layer 7 and the nickel (Ni) layer 8 serving as the etching stopper and the insulating substrate 1 also occurs. As a result, as shown in FIG. 9A, alteration layers 81 and 82 are formed near the interface of these layers. FIG. 10A is an SEM photograph showing the alteration layer 81 positioned above the insulating substrate 1, and FIG. 10B is an SEM photograph showing the alteration layer 82 positioned below the insulating substrate 1. Further, the via hole is made bigger than the opening of the metal mask at the upper end due to the influence of a side etching. When the present inventor examined the conductivity of the alteration layers 81 and 82, no conductivity of the alteration layers 81 and 82 was found.

Figure 9B:
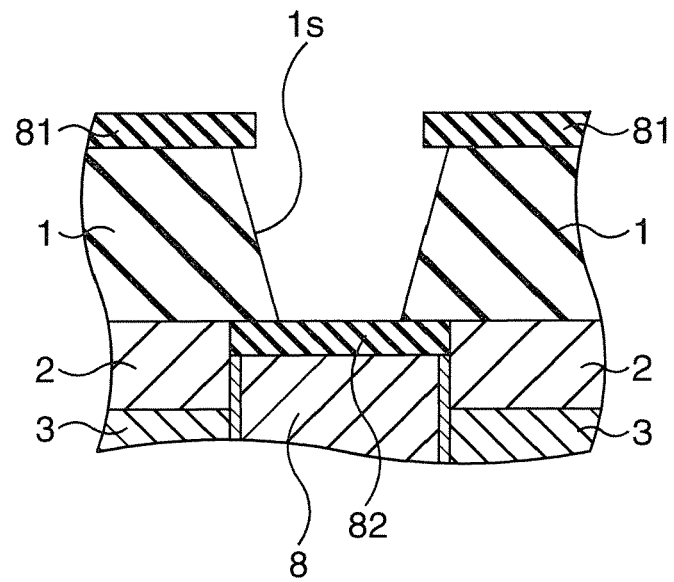
FIG. 9B is a sectional view showing a state after conducting a wet treatment.
Figure 10C:
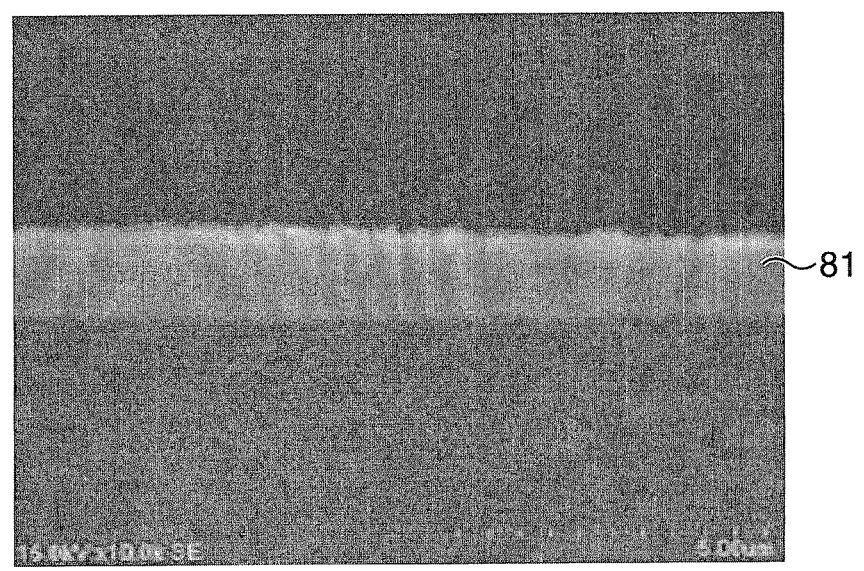
FIG. 10C is a view showing a state after treatment using SPM (sulfuric acid/hydrogen peroxide mixture)

In the first embodiment, the seed layer 14 and the gold (Au) layer 15 are formed after removal of the nickel (Ni) layer 13 and the seed layer 12 serving as the metal mask. However, it is impossible to remove the alteration layer 81 by the similar treatment to the first embodiment, as shown in FIG. 9B. The present inventor tried to remove the alteration layer 81 using mixed solution of sulfuric acid and hydrogen peroxide (SPM: sulfuric acid/hydrogen peroxide mixture), but the alteration layer 81 could not be removed, as shown in FIG. 10C. Accordingly, it is necessary to select whether the seed layer 14 and the gold (Au) layer 15 should be formed while the alteration layer 81 remains, or the seed layer 14 and the gold (Au) layer 15 should be formed after the alteration layer 81 is removed by other methods. It is, however, understood that a favorable result is not likely to be obtained even if one is selected.

Figure 11:
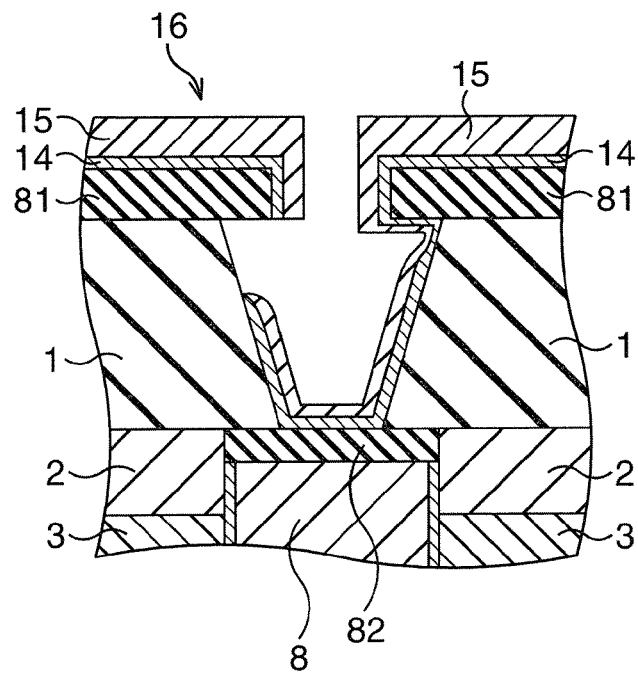
FIG. 11 is a view showing problems in a case of forwarding a treatment while keeping the alteration layer 81.

For example, when it is tried to carry on the treatment further while the alteration layer 81 remains, the seed layer 14 and the gold (Au) layer 15 are not likely to be formed on the back side of the alteration layer 81, as shown in FIG. 11. As a result, an area with no formation of the seed layer 14 and the gold (Au) layer 15 may occur or an area with no prescribed thickness may occur. In the area where no prescribed thickness is obtained, a large current maybe allowed to flow while in use and a break could occur.

As a processing to remove the alteration layer 81, a physical processing such as ion-milling or the like is listed, but the processing requires a long time, and the extent of improvement in throughput is low.

Considering these, it would be preferable to conduct a processing so as not to create the alteration layer 81.

Figure 12:
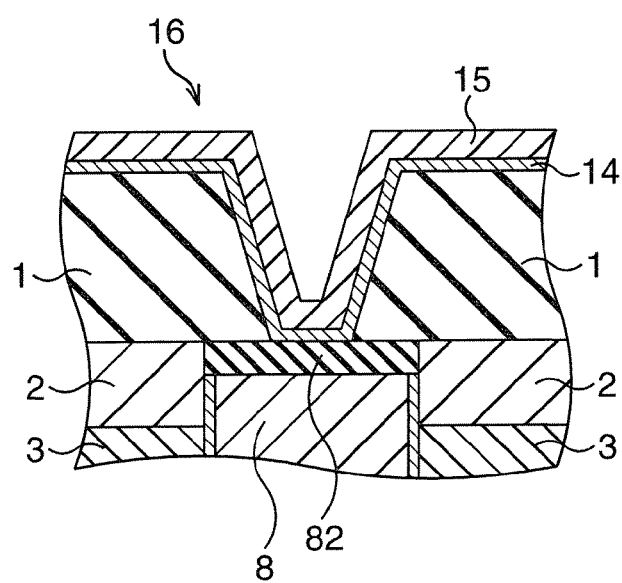
FIG. 12 is a view showing problems in a case of forwarding a treatment while keeping the alteration layer 82.

As for the alteration layer 82, it is impossible to form the seed layer 14 and the gold (Au) layer 15 while retaining the alteration layer 82 as it is. This is because since the alteration layer 82 does not exhibit conductivity, the conductivity between the via wiring 16 and the nickel (Ni) layer 8 cannot be secured, as shown in FIG. 12. Accordingly, when the alteration layer 82 is formed, it is necessary to remove it. But the treatment for the removal requires a protracted period similar to the case of the alteration layer 81. Accordingly, it can be said that it is preferable for the alteration layer 82 not to be created in the first place.

Figure 13:
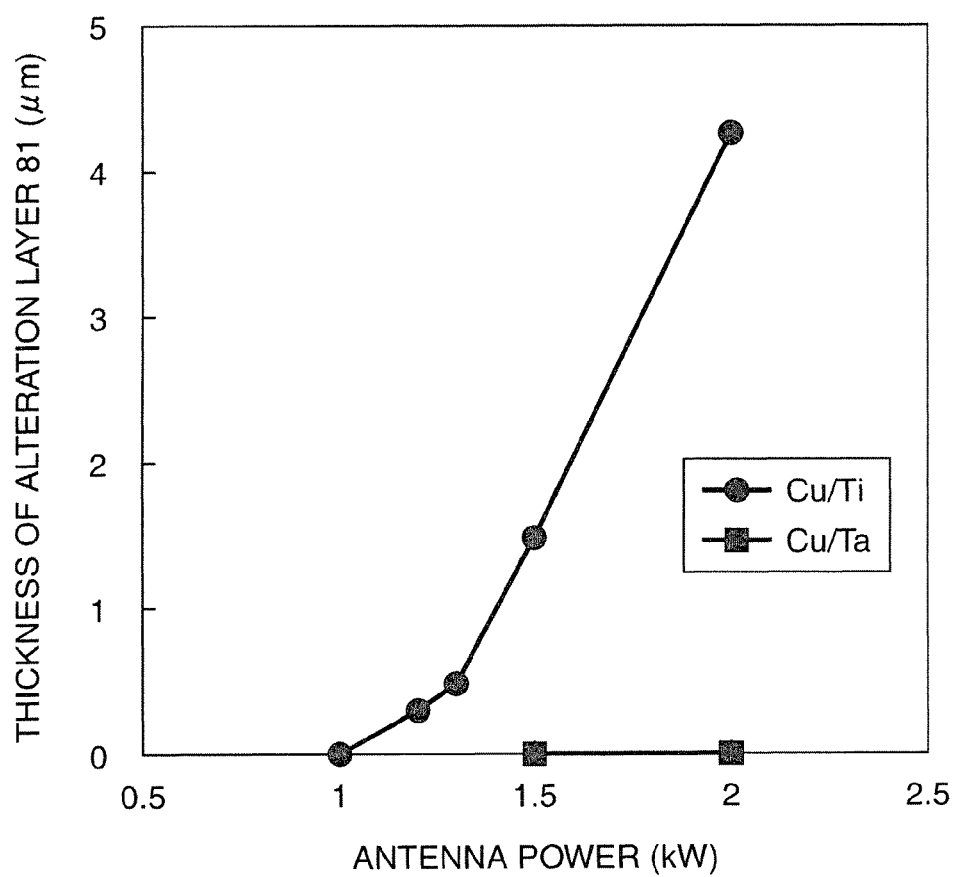
FIG. 13 is a graph showing a relation between an antenna power and a thickness of an alteration layer.
Figure 14:
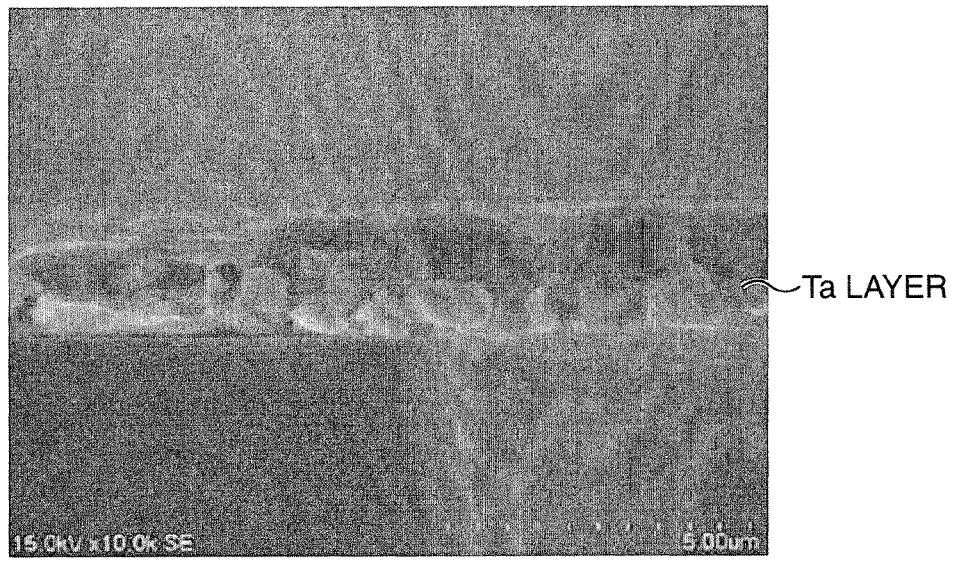
FIG. 14 is a view showing a tantalum (Ta) layer after forming a via hole is with an antenna power of 2 kW.

As a result of earnest studies by the inventor of the present application about the method capable of preventing the creation of the alteration layer 81, it is understood that formation of a tantalum (Ta) layer instead of the titanium (Ti) layer used for the seed layer 12 in the first embodiment is suitable. In other words, as shown in FIG. 13, when the stacked body composed of the titanium (Ti) layer and the copper (Cu) layer was used for the seed layer 12, the alteration layer 81 became thicker as the antenna power at the etching of the insulating substrate 1 was increased, but when a stacked body composed of a tantalum (Ta) layer and a copper (Cu) layer was used, the alteration layer 81 was not formed at all. FIG. 14 is a SEM photograph showing the tantalum (Ta) layer after forming the via hole 1s at an antenna power of 2 kW.

Similarly, it was understood that in order to prevent creation of the alteration layer 82, formation of a tantalum (Ta) layer instead of the titanium (Ti) layer used for the seed layer 7 in the first embodiment was successful.

Figure 15:
FIG. 15 is a view showing an alteration layer generated in a pin hole.

However, when the tantalum (Ta) is so thin that pinholes can occur, since there is a possibility of local contact between the copper (Cu) layer and the insulating substrate 1, the alteration layer may occur there. FIG. 15 is a SEM photograph showing alteration layers created in the pinhole.

Sixth Embodiment

Figure 16A:
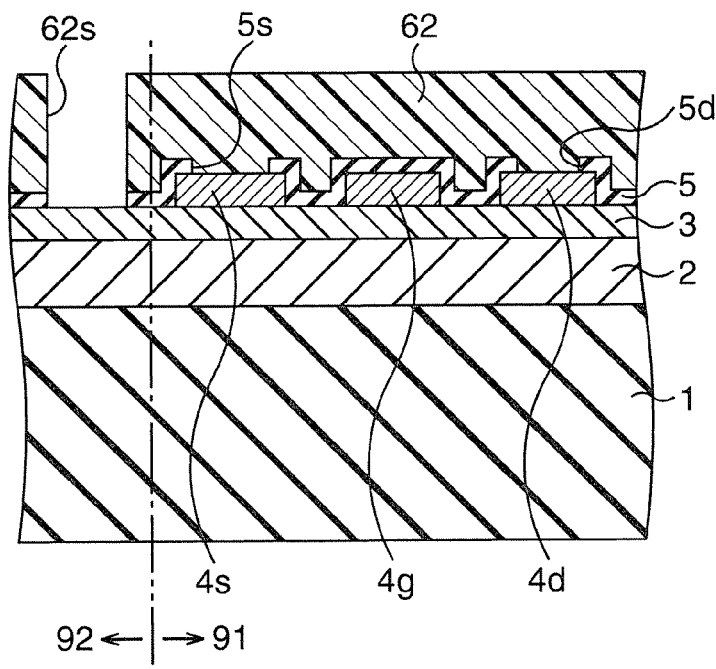
FIG. 16A to FIG. 16U are sectional views showing a method of manufacturing a GaN base HEMT according to a sixth embodiment in process order.

Next, a sixth embodiment will be explained. In the sixth embodiment, the position of the via hole and the material of the seed layer for the nickel (Ni) layer 13 differs from those in the first embodiment. FIG. 16A to FIG. 16U are views showing a method of manufacturing a GaN base HEMT according to the sixth embodiment in process order.

In the sixth embodiment, first, as shown in FIG. 16A, the GaN layer 2 and the n-type AlGaN layer 3 are formed over the surface of the insulating substrate 1 made of silicon carbide (SiC), for example, in this order. Next, the source electrode 4s, the gate electrode 4g and the drain electrode 4d are selectively formed in an active area 91 on the n-type AlGaN layer 3. Then, the SiN layer 5 covering the source electrode 4s, the gate electrode 4g and the drain electrode 4d is formed over the n-type AlGaN layer 3. Thereafter, similarly to the first embodiment, the contact holes 5s and 5d are formed in the SiN layer 5.

Then, a resist pattern 62 provided with an opening 62s positioned in an inactive area 92 is formed over the SiN layer 5. The thickness of the resist pattern 62 is about 10 μm. In other words, the resist pattern 62 thicker than the resist pattern 152 prepared in the conventional method is formed. The diameter of the opening 62s is about 150 μm. Even when the thickness of the resist pattern 62 is made about 10 μm, it is possible to form the opening 62s of about 150 μm in diameter with high precision. Next, by patterning the SiN layer 5 using the resist pattern 62 as a mask, an opening that matches with the opening 62s is formed in the inactive area 92. When the SiN layer 5 is patterned, for example, $SF_6$ and $CHF_3$ are supplied into the chamber at a flow rate of 2:30, dry etching is conducted with the antenna power being set to 500 W, and the bias power being set to 50 W.

Figure 16B:
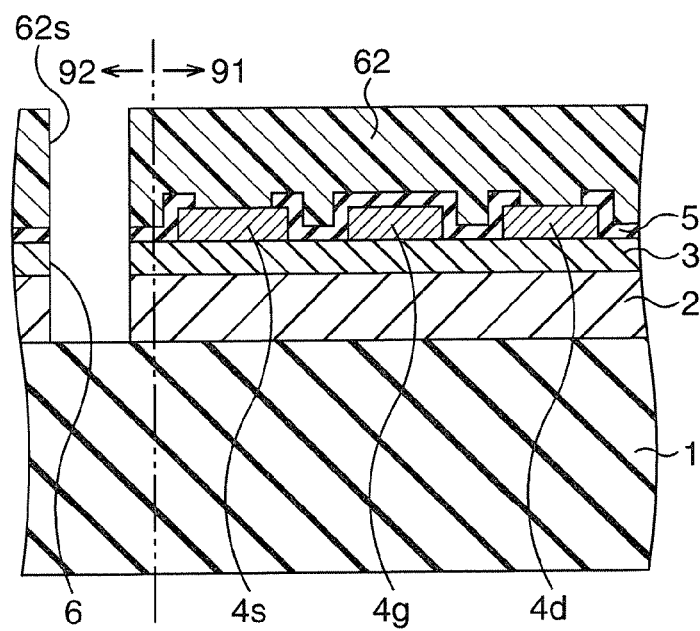

Thereafter, by dry etching of the n-type AlGaN layer 3 and the GaN layer 2 using the resist pattern 62 as a mask similarly to the first embodiment, the opening 6 reaching the insulating substrate 1 is formed as shown in FIG. 16B. Note that the opening 6 may reach as far as inside the insulating substrate 1.

Figure 16C:
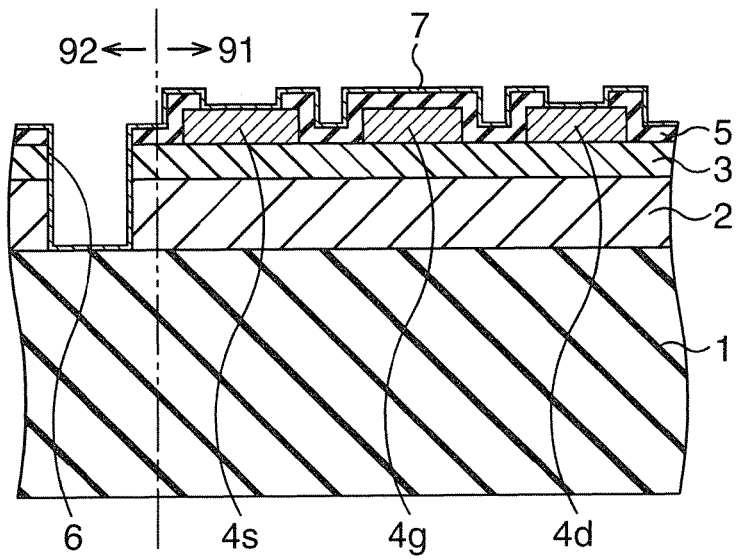

Then, the resist pattern 62 is removed, and as shown in FIG. 16C, a stacked body composed of a titanium (Ti) layer and a nickel (Ni) layer, or a titanium (Ti) layer and a copper (Cu) layer is formed by sputtering over the whole surface on the front side of the insulating substrate 1 as the seed layer 7.

Figure 16D:
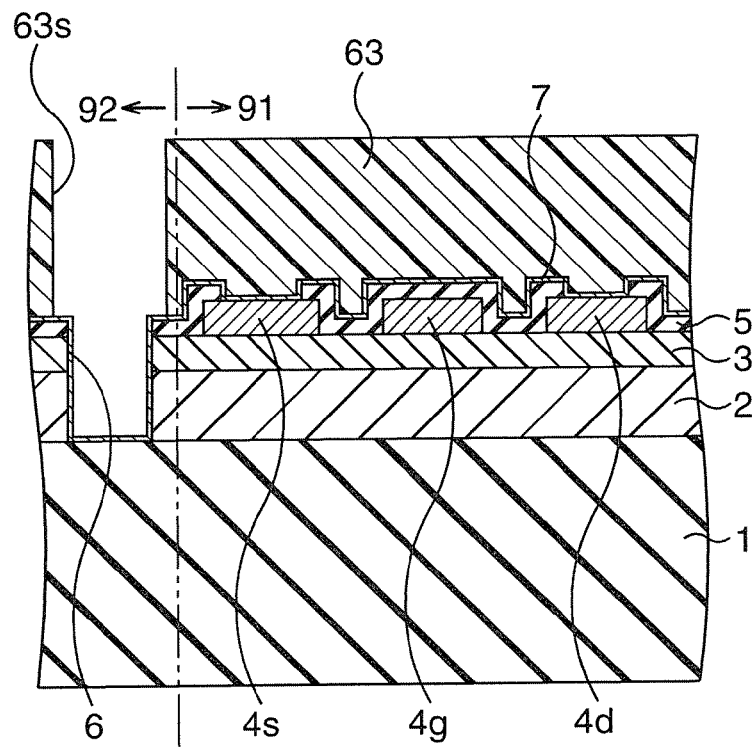

Next, as shown in FIG. 16D, a resist pattern 63 provided with an opening 63s which positions in the inactive area 92 and exposes the whole of the opening 6 is formed over the seed layer 7. The thickness of the resist pattern 63 is about 3 μm.

Figure 16E:
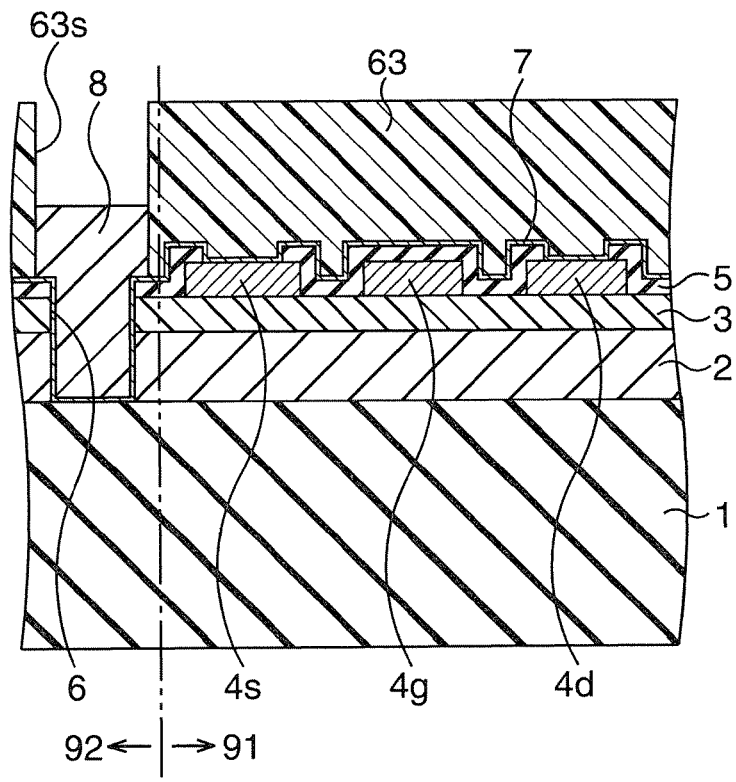

Then, as shown in FIG. 16E, in the inside of the opening 63s, the nickel (Ni) layer 8 of about 3.2 μm in thickness is formed on the seed layer 7 by electroplating.

Figure 16F:
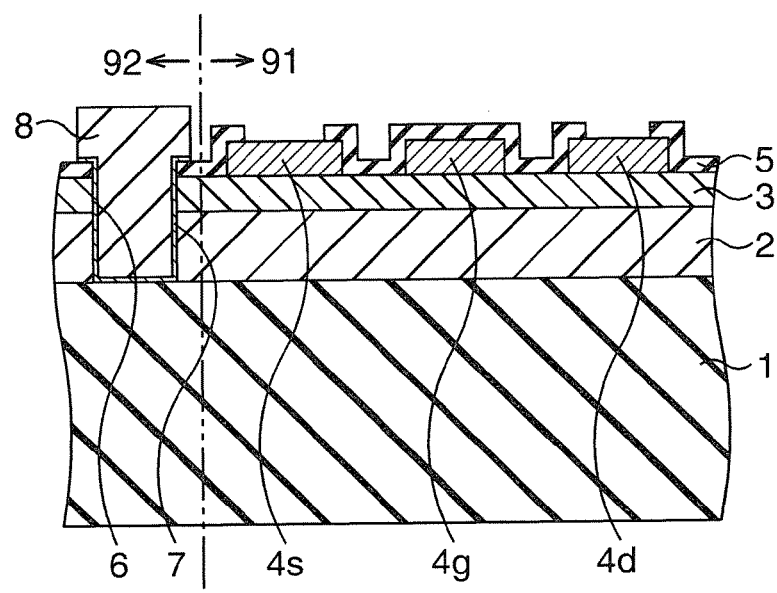

Thereafter, as shown in FIG. 16F, the resist pattern 63 is removed. Then, a portion of the seed layer 7 exposed from the nickel (Ni) layer 8 is removed by ion-milling. The nickel (Ni) layer 8 is also processed a little simultaneously, and the resultant thickness of the nickel (Ni) layer 8 is about 3 μm. The distance between the surface of the n-type AlGaN layer 3 and the surface of the nickel (Ni) layer 8 is about 1 μm.

Figure 16G:
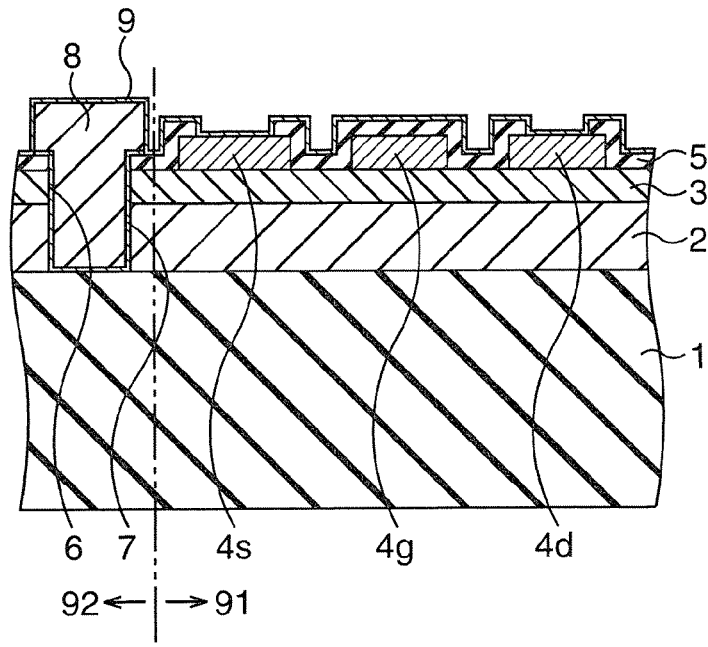

Next, as shown in FIG. 16G, a stacked body composed of a titanium (Ti) layer, a platinum (Pt) layer and a gold (Au) layer is formed by sputtering over the whole surface on the front side of the insulating substrate 1 as the seed layer 9.

Figure 16H:
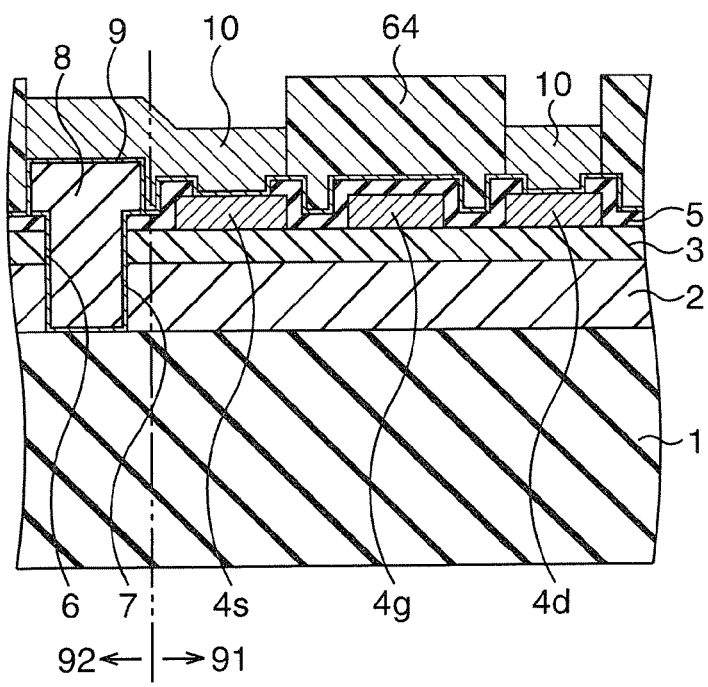

Then, as shown in FIG. 16H, a resist pattern 64 provided with an opening surrounding the whole of the source electrode 4s and the nickel (Ni) layer 8 and an opening corresponding to the outer periphery of the drain electrode 4d is formed over the seed layer 9. The thickness of the resist pattern 64 is about 1 μm. Thereafter, in the inside of the respective openings of the resist pattern 64, the gold (Au) layer 10 of about 1 μm in thickness is formed on the seed layer 9 by electroplating.

Figure 16I:
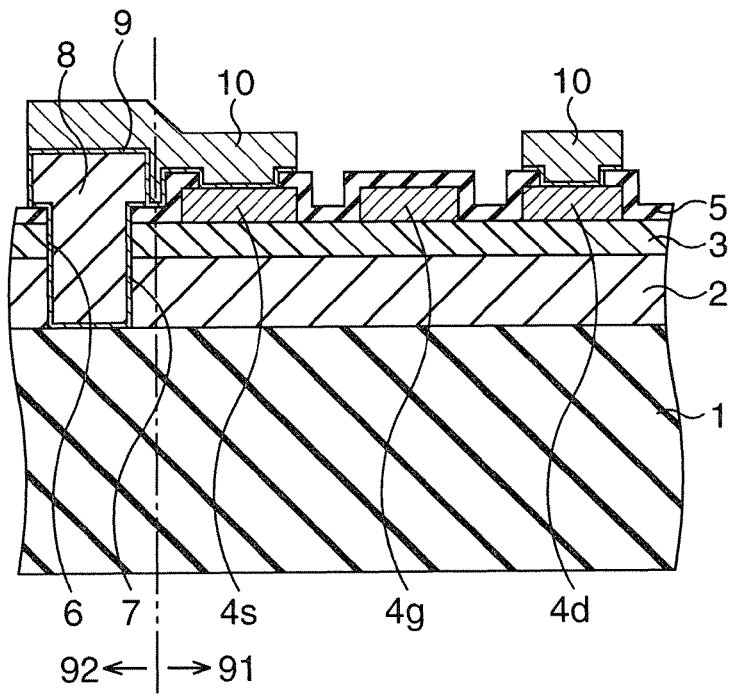

Then, as shown in FIG. 16I, the resist pattern 64 is removed. Next, a portion of the seed layer 9 exposed from the gold (Au) layer 10 is removed by ion-milling. The gold (Au) layer 10 is processed a little simultaneously, and the resultant thickness of the gold (Au) layer 10 is about 0.6 μm.

Figure 16J:
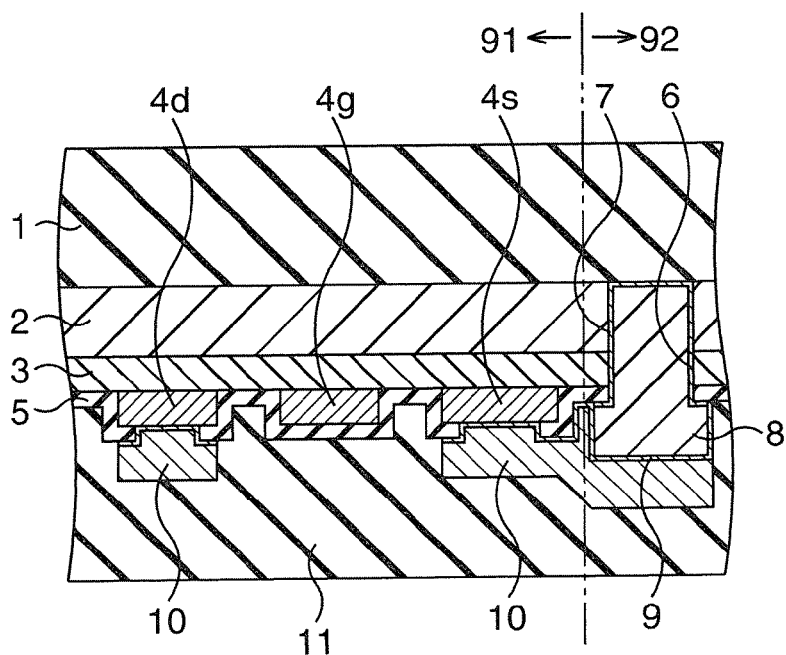

Next, as shown in FIG. 16J, the surface protecting layer 11 is formed over the whole surface on the front side of the insulating substrate 1, and the front and back of the insulating substrate 1 are inversed. Thereafter by polishing the back surface of the insulating substrate 1, the thickness of the insulating substrate is made about 150 μm.

Figure 16K:
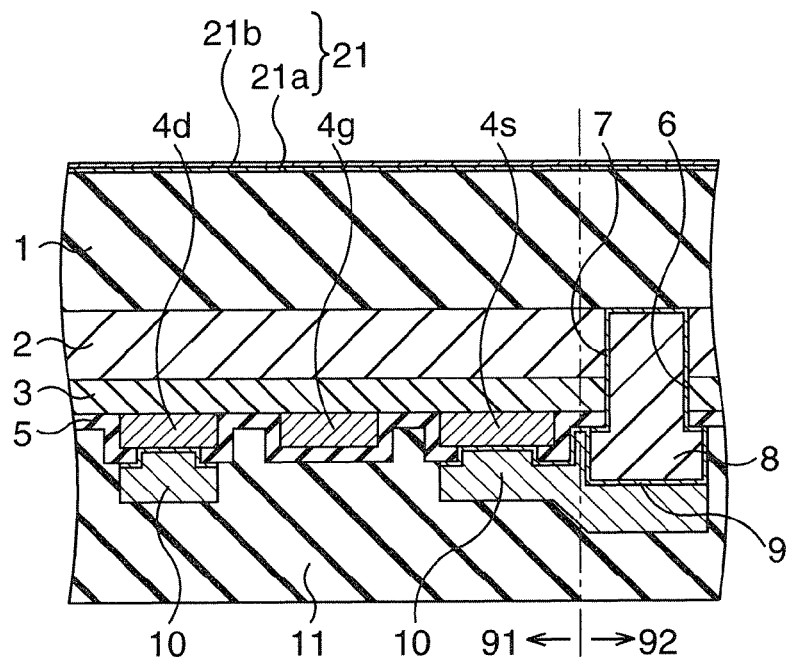

Then, as shown in FIG. 16K, a stacked body composed of a tantalum (Ta) layer 21a and a copper (Cu) layer 21b is formed as a seed layer 21 by sputtering over the back side of the insulating substrate 1. The thickness of the tantalum (Ta) layer 21a is made about 20 nm, and that of the copper (Cu) layer 21b is made about 200 nm.

Figure 16L:
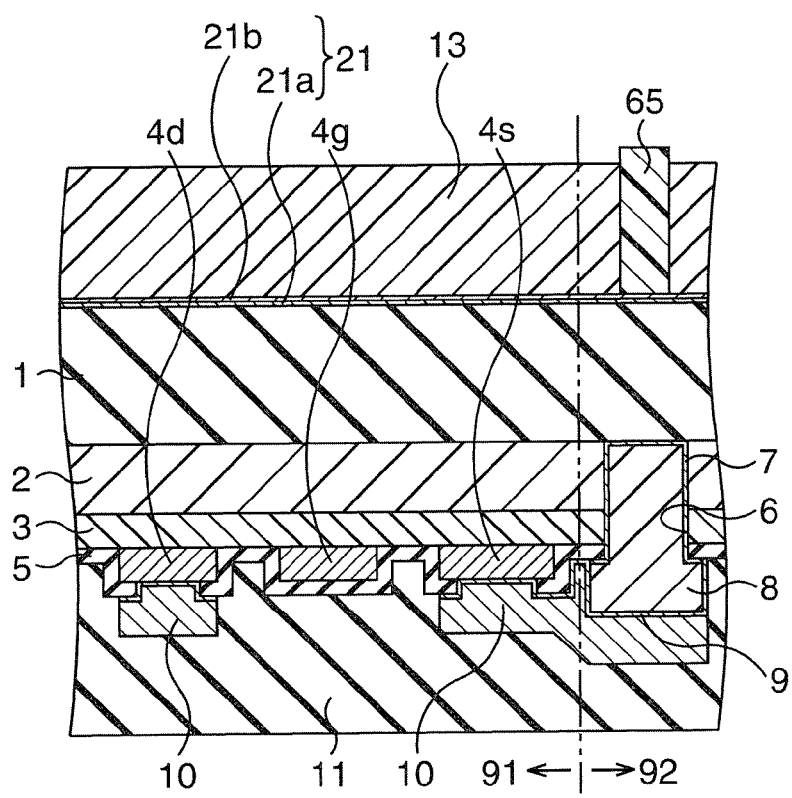

Next, as shown in FIG. 16L, a resist pattern 65 covering a part corresponding to the nickel (Ni) layer 8 is formed on the seed layer 21. The thickness of the resist pattern 65 is about 3 μm, and the diameter is about 100 μm. Then, by electroplating, in the area except the resist pattern 65, the nickel (Ni) layer 13 of about 3.2 μm in thickness is formed over the seed layer 21.

Figure 16M:
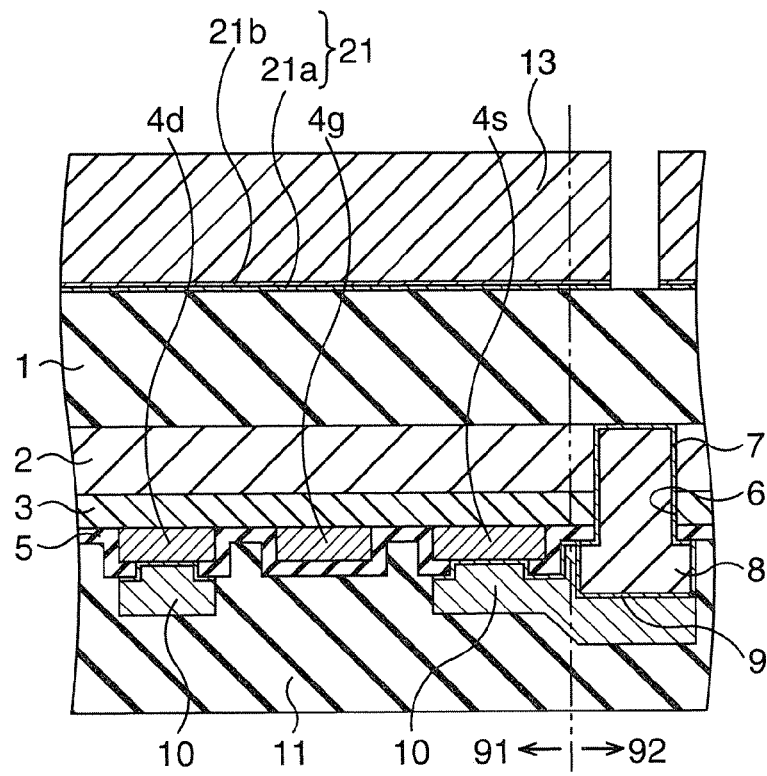

Thereafter, as shown in FIG. 16M, the resist pattern 65 is removed. Then, a portion of the seed layer 21 exposed from the nickel (Ni) layer 13 is removed by ion-milling. The nickel (Ni) layer 13 is processed a little simultaneously, and the resultant thickness of the nickel (Ni) layer 13 is about 3 μm.

Figure 16N:
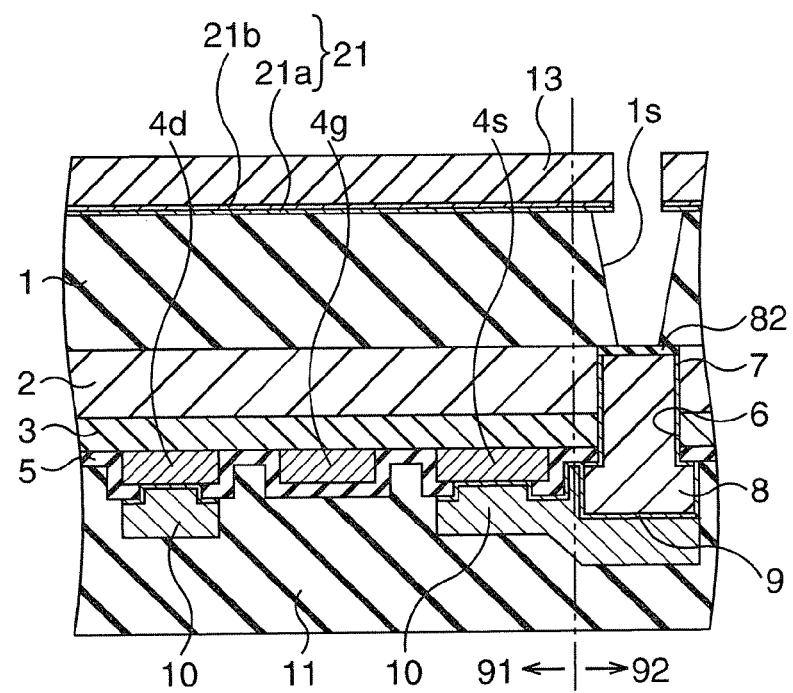

Next, as shown in FIG. 16N, by dry etching of the insulating substrate 1 using the nickel (Ni) layer 13 as a mask, the via hole 1s is formed. In the dry etching, fluoride base gas, for example, a mixed gas of sulfur hexafluoride ($SF_6$) gas and oxygen ($O_2$) gas is used. An ICP dry etching apparatus is used with the antenna power being set to 2 kW, and the bias power being set to 200 W. The etching rate of the insulating substrate 1 made of SiC at this time is 2 μm/min or more. In other words, the etching is conducted at a speed several times as fast as that in the first embodiment. Further, by the dry etching, although the alteration layer 82 may be created, the alteration layer 81 is not created. Because, the tantalum (Ta) layer 21a is formed.

Figure 16O:
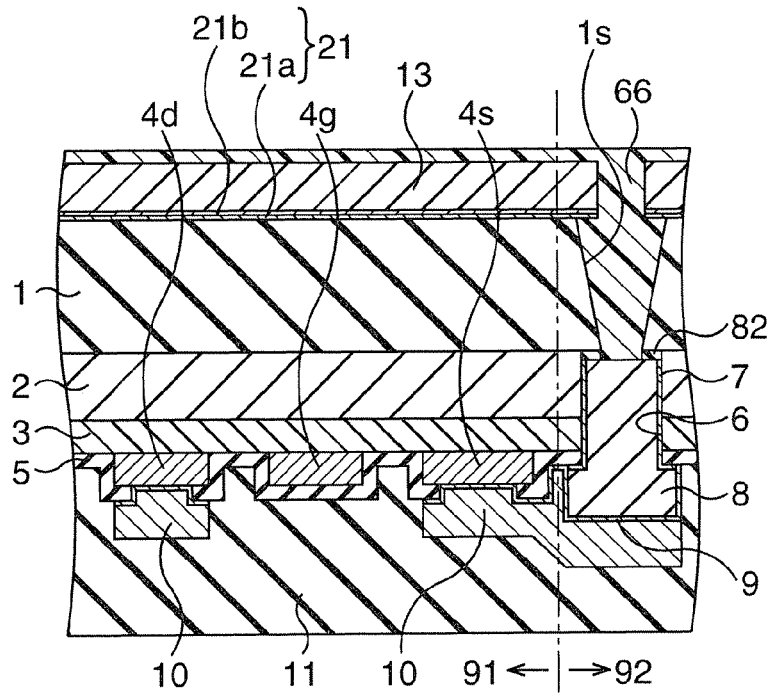

Then, by removing at least a part of the alteration layer 82 by a physical treatment such as ion-milling or the like, the via hole 1s is allowed to reach the nickel (Ni) layer 8 as shown in FIG. 16O. Thereafter, a resist layer 66 is formed inside the via hole 1s and over the nickel (Ni) layer 13.

Figure 16P:
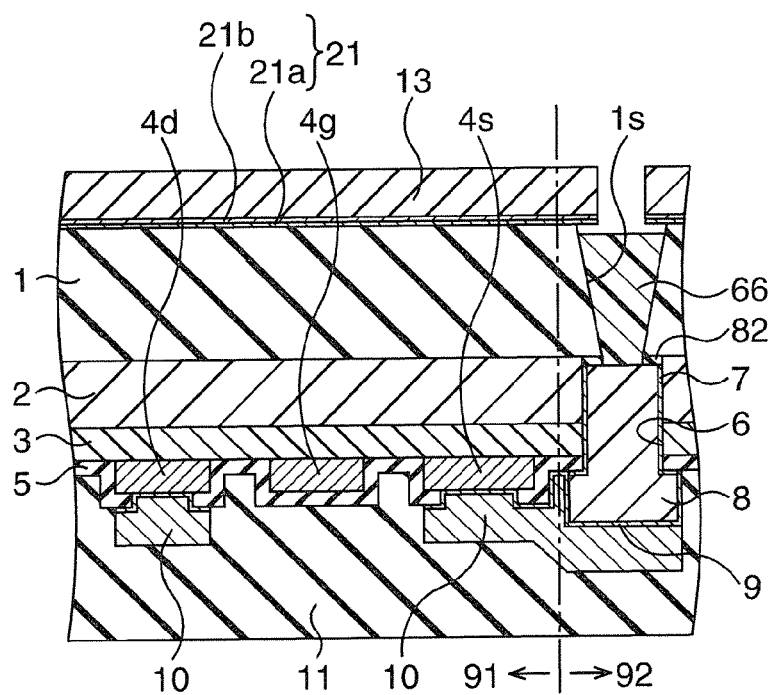

Then, as shown in FIG. 16P, by conducting exposure and development to the resist layer 66, the resist layer 66 is retained only in the via hole 1s. The remaining resist layer 66 serves as a protecting layer.

Figure 16Q:
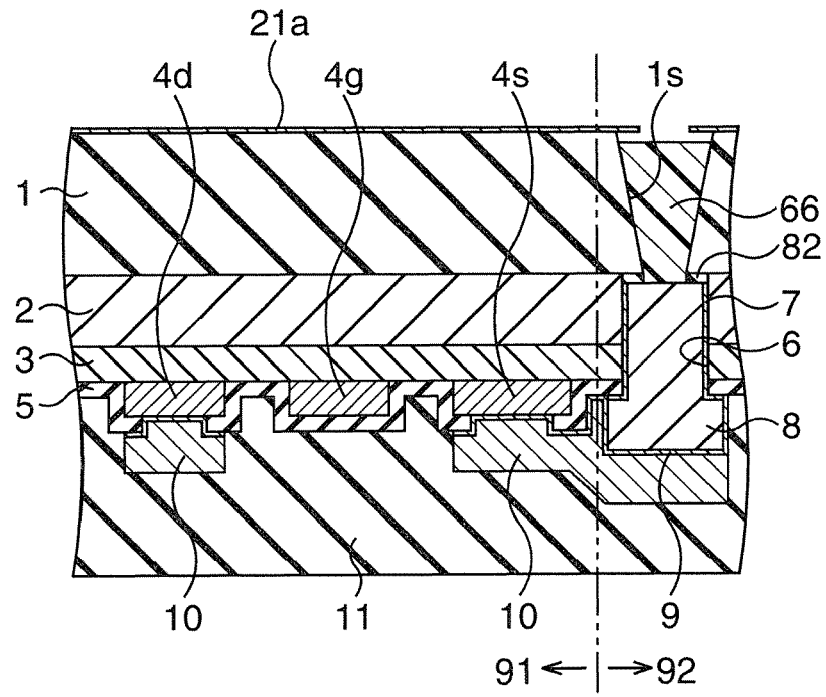

Next, as shown in FIG. 16Q, by wet etching with SPM or the like, the nickel (Ni) layer 13 and the copper (Cu) layer 21b are removed.

Figure 16R:
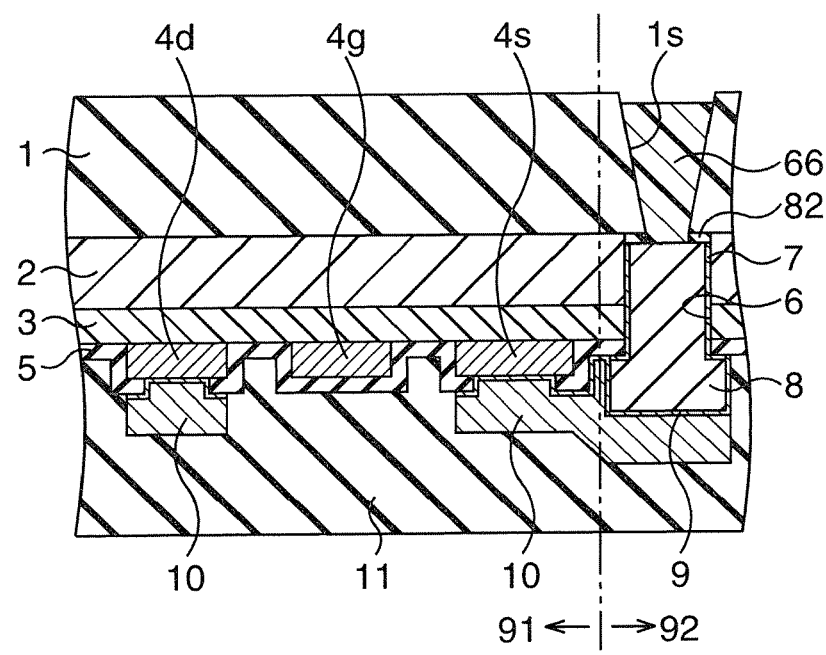

Then, as shown in FIG. 16R, by wet etching with aqueous hydrofluoric acid or the like, the tantalum (Ta) layer 21a is removed. The tantalum (Ta) layer 21a may be removed by ion-milling. Since the thickness of the tantalum (Ta) layer 21a is about 20 nm, it is possible to remove it by ion-milling in a short time.

Figure 16S:
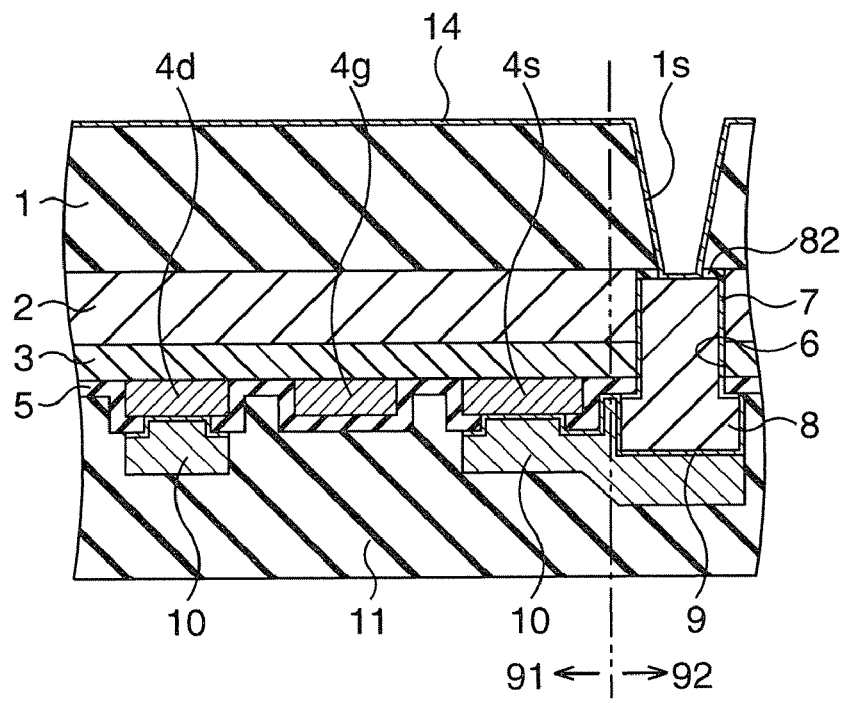

Thereafter, as shown in FIG. 16S, the resist layer 56 is removed. Then, a stacked body composed of a titanium (Ti) layer, a platinum (Pt) layer and a gold (Au) layer is formed as the seed layer 14 over the whole surface on the back side of the insulating substrate 1 by sputtering.

Figure 16T:
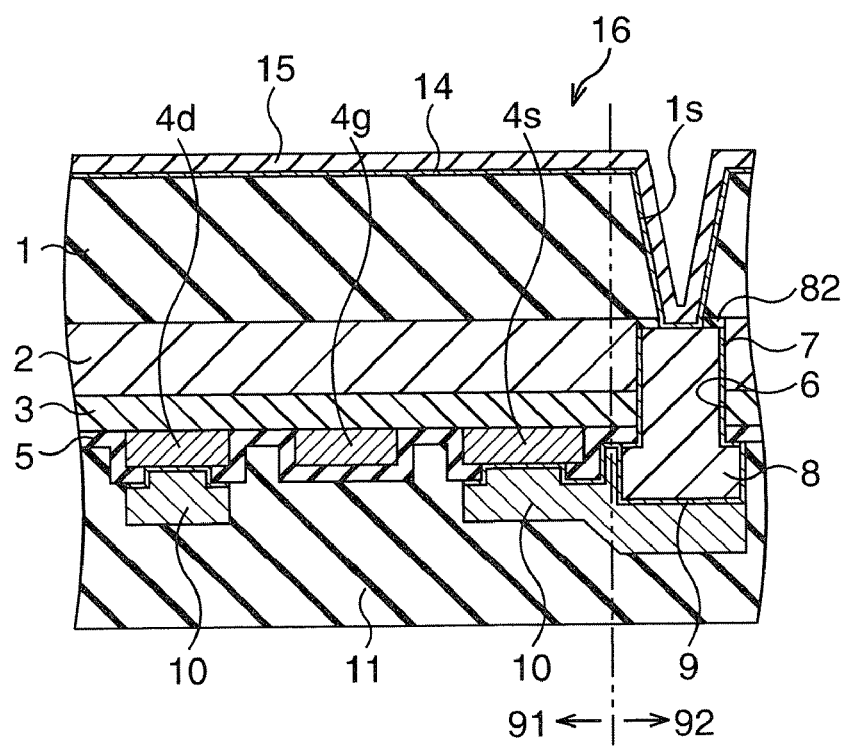
Figure 16U:
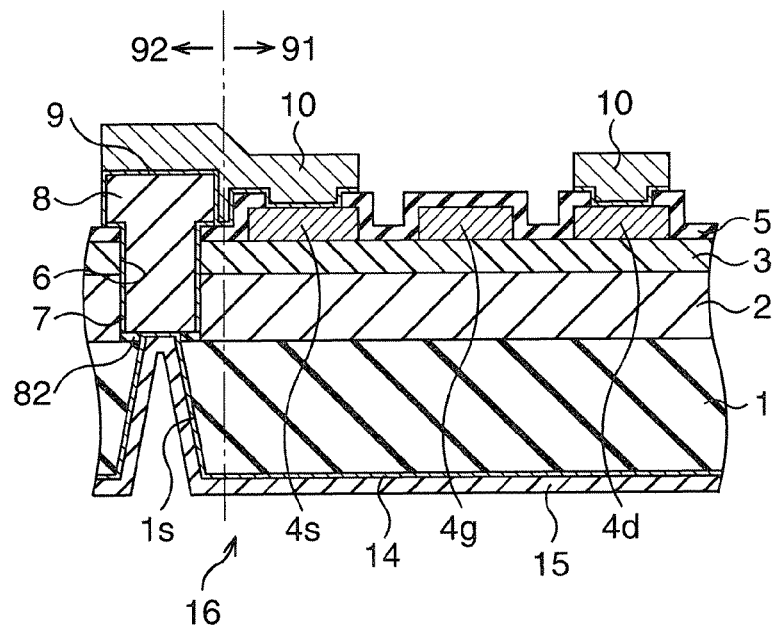

Next, as shown in FIG. 16T, the gold (Au) layer 15 of about 10 μm in thickness is formed over the seed layer 14 by electroplating. The via wiring 16 is composed of the gold (Au) layer 15 and the seed layer 14. When the gold (Au) layer 15 is formed inside the via hole is of about 100 μm in diameter, and of about 150 μm in depth by electroplating, the gold (Au) layer 15 is formed only on the bottom and sides of the via hole is, so that the via hole is not completely infilled.

Thereafter, as shown in FIG. 16U, the front and the back of the insulating substrate 1 are inversed and the surface protecting layer 11 is removed. A GaN base HEMT is completed by forming a wiring (not shown) and so on as necessary.

According to the sixth embodiment, since the tantalum (Ta) layer 21a is used for the seed layer 21, it is possible to make the etching rate during formation of the via hole is several times as fast as that of the first embodiment while preventing the creation of the alteration layer 81. Accordingly, even when the removal of the alteration layer 82 is considered, the throughput is considerably better than that in the first embodiment.

Figure 17A:
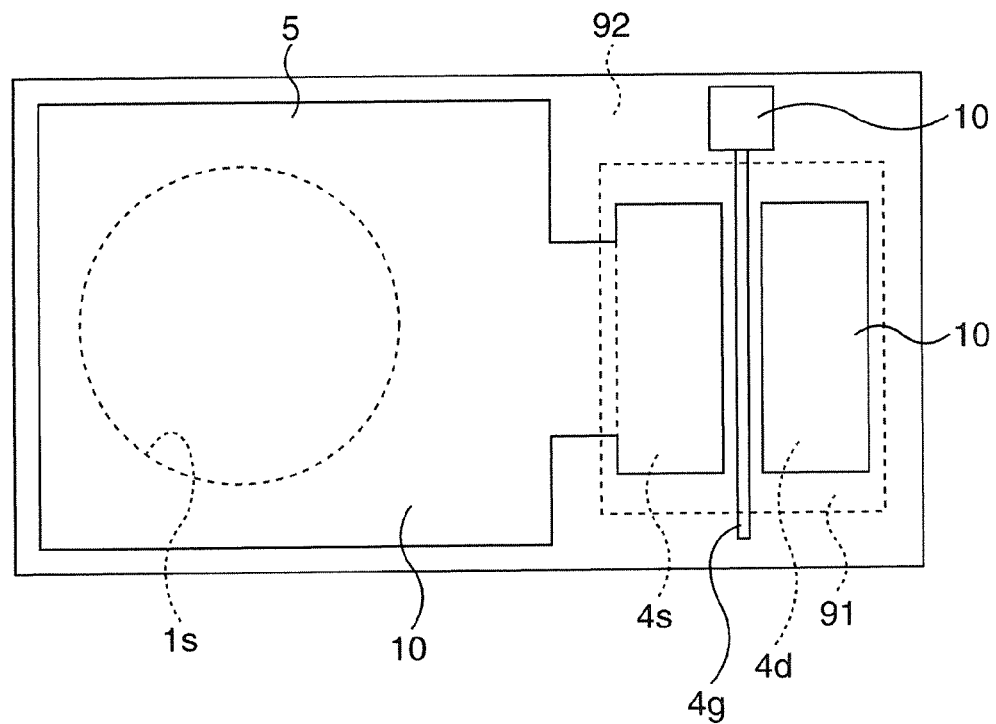
FIG. 17A is a view showing a layout on a front side in the sixth embodiment.
Figure 17B:
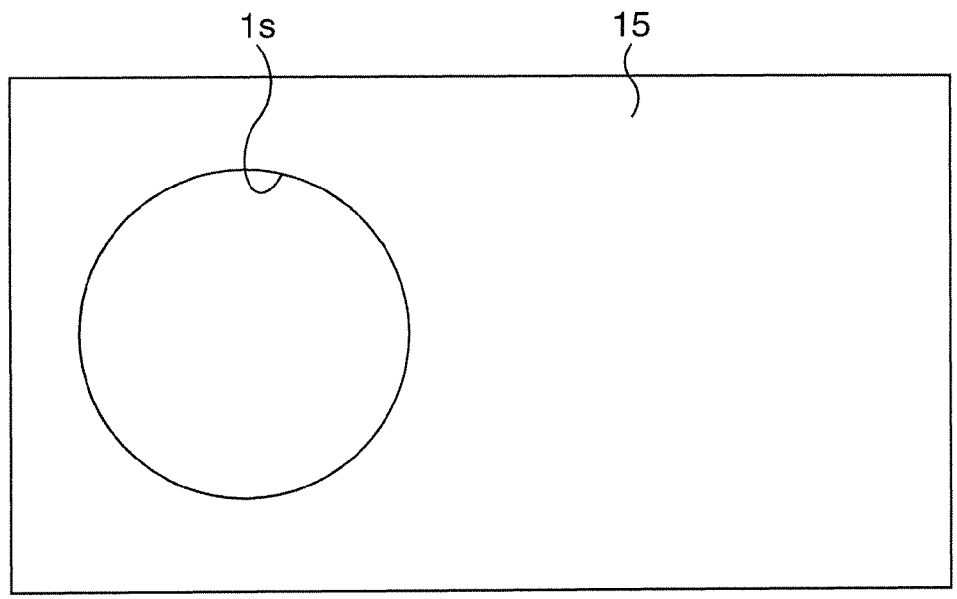
FIG. 17B is a view showing a layout on a back side in the sixth embodiment.

It should be noted that after removal of the surface protecting layer 11, a layout seen from the front surface side of the insulating substrate 1 is like FIG. 17A, and a layout seen from the back side is like FIG. 17B. In other words, though not shown in FIG. 16U, the gold (Au) layer 10 coupled to the gate electrode 4g exists as shown in FIG. 17A. Note that though the layout shown in FIG. 17A is simple, adoption of a multi-finger gate structure makes it possible to enhance the output. Furthermore, a monolithic microwave integrated circuit (MMIC) may be formed by installing a resistor, a capacitor, and so on.

Seventh Embodiment

Figure 18A:
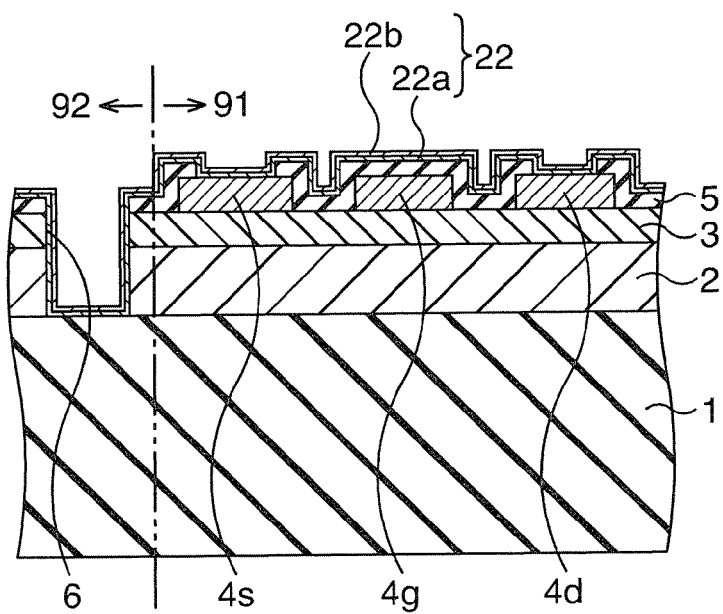
FIG. 18A to FIG. 18Q are sectional views showing a method of manufacturing a GaN base HEMT according to a seventh embodiment in process order.

Next, a seventh embodiment will be explained. In the seventh embodiment, the material of the seed layers for the nickel (Ni) layers 8 and 13 differs from that in the sixth embodiment. FIG. 18A to FIG. 18Q are sectional views showing a method of manufacturing a GaN base HEMT according to the seventh embodiment in process order.

In the seventh embodiment, first, the treatment upto the removal of the resist pattern 62 is conducted similarly to the sixth embodiment (FIG. 16C). Then, as shown in FIG. 18A, a stacked body composed of a tantalum (Ta) layer 22a and a copper (Cu) layer 22b is formed as a seed layer 22 over the whole surface on the front side of the insulating layer 1 by sputtering. The thickness of the tantalum (Ta) layer 22a is set to about 20 nm, and the thickness of the copper (Cu) layer 22b is set to about 200 nm.

Figure 18B:
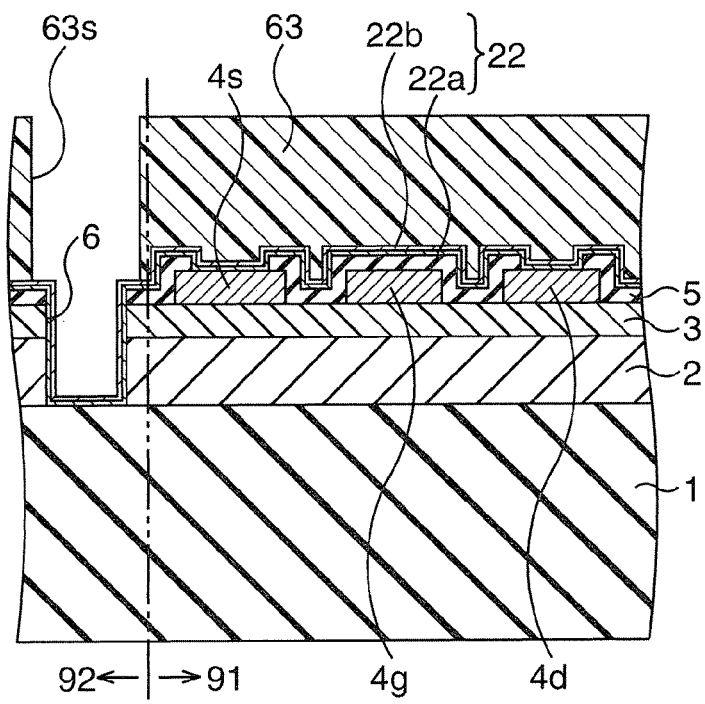

Next, as shown in FIG. 18B, the resist pattern 63 provided with the opening 63s which positions in the inactive area 92 and exposes the whole of the opening 6 is formed over the seed layer 22.

Figure 18C:
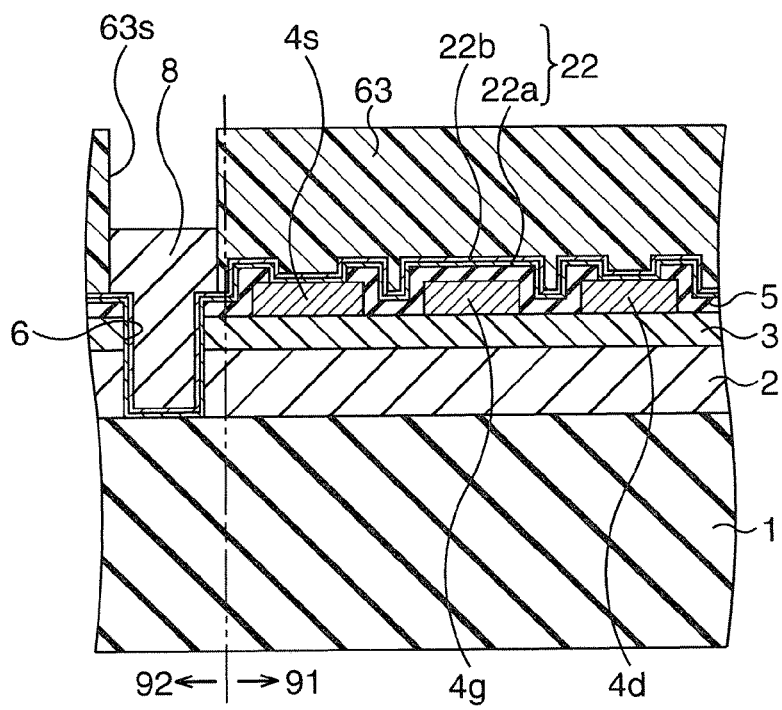

Next, as shown in FIG. 18C, the nickel (Ni) layer 8 of about 3.2 µm in thickness is formed on the seed layer 22 by electroplating.

Figure 18D:
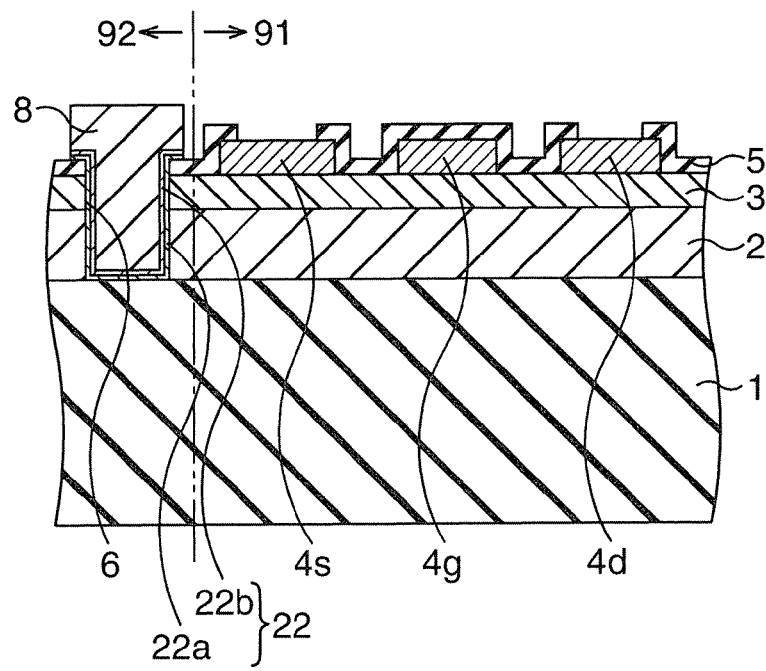

Thereafter, as shown in FIG. 18D, the resist pattern 63 is removed. Then, a portion of the seed layer 22 exposed from the nickel (Ni) layer 8 is removed by ion-milling. The nickel (Ni) layer 8 is processed a little simultaneously, and the resultant thickness of the nickel (Ni) layer 8 is about 3 µm. The distance between the surface of the n-type AlGaN layer 3 and the surface of the nickel (Ni) 8 is about 1 µm.

Figure 18E:
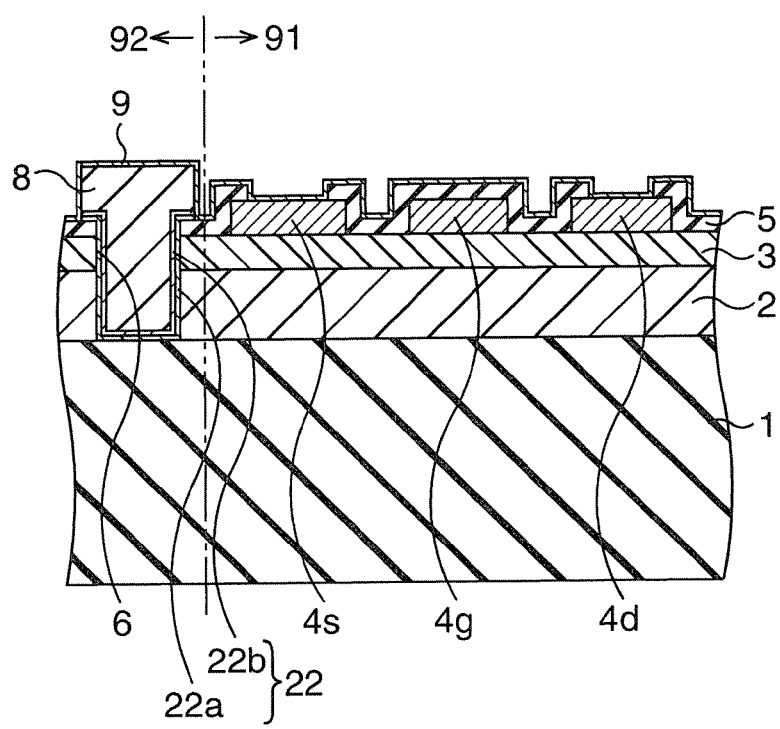

Next, as shown in FIG. 18E, a stacked body composed of a titanium (Ti) layer, a platinum (Pt) layer and a gold (Au) layer is formed as the seed layer 9 over the whole surface on the front side of the insulating substrate 1 by sputtering.

Figure 18F:
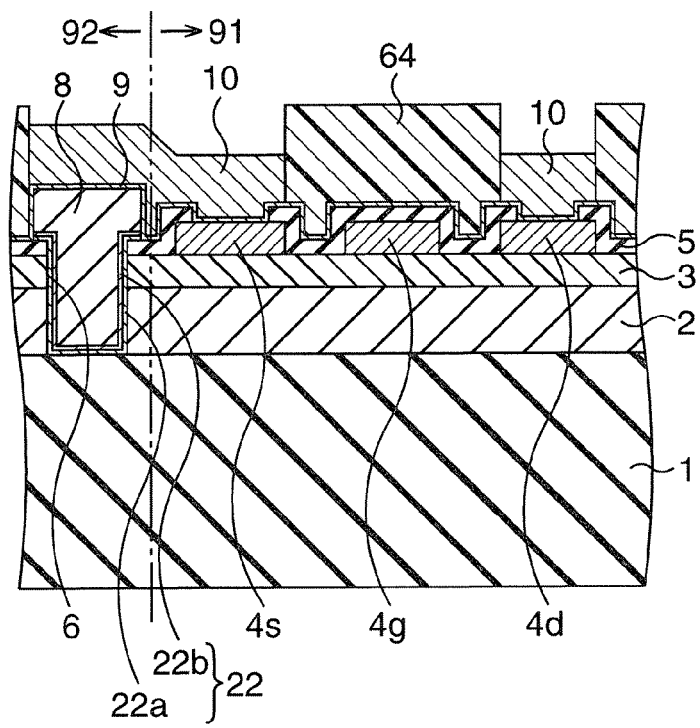

Then, as shown in FIG. 18F, the resist pattern 64 provided with the opening surrounding the whole of the source electrode 4s and the nickel (Ni) layer 8 and the opening corresponding to the outer periphery of the drain electrode 4d is formed over the seed layer 9. Thereafter, in the inside of the respective openings of the resist pattern 64, the gold (Au) layer 10 of about 1 µm in thickness is formed on the seed layer 9 by electroplating.

Figure 18G:
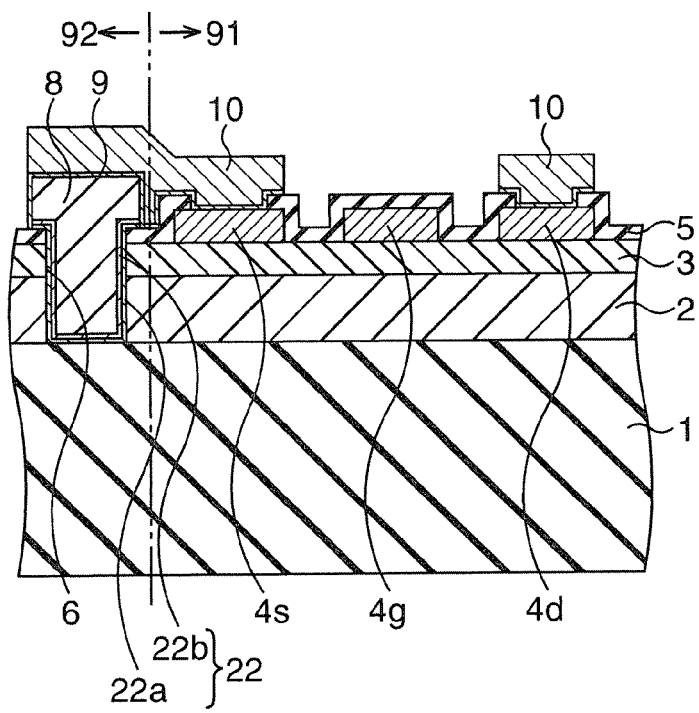

Then, as shown in FIG. 18G, the resist pattern 64 is removed. Next, a portion of the seed layer 9 exposed from the gold (Au) layer 10 is removed by ion-milling. The gold (Au) layer 10 is processed a little simultaneously, and the resultant thickness of the gold (Au) layer 10 is about 0.6 µm.

Figure 18H:
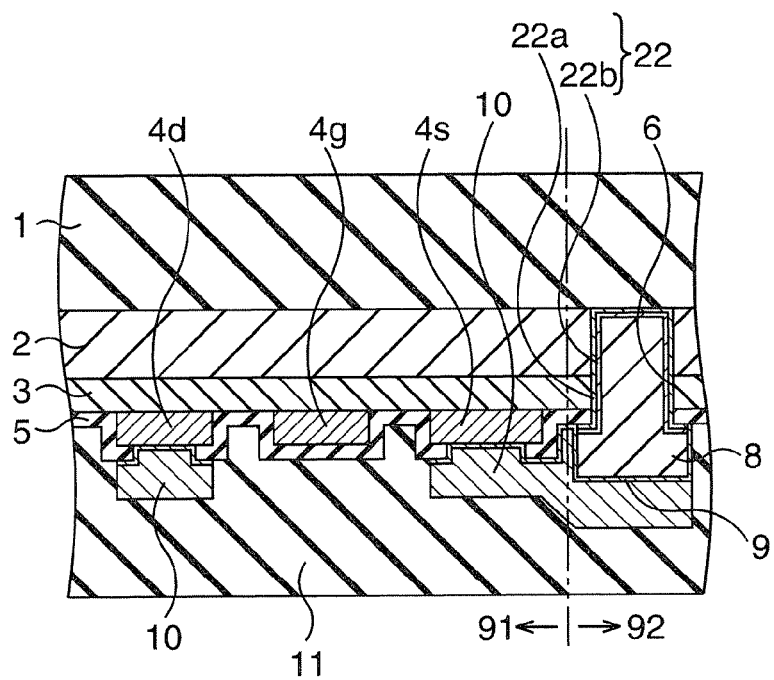

Next, as shown in FIG. 18H, the surface protecting layer 11 is formed over the whole surface on the front side of the insulating substrate 1, and the front and back of the insulating substrate 1 are inversed. Thereafter by polishing the back surface of the insulating substrate 1, the thickness of the insulating substrate is made about 150 µm.

Figure 18I:
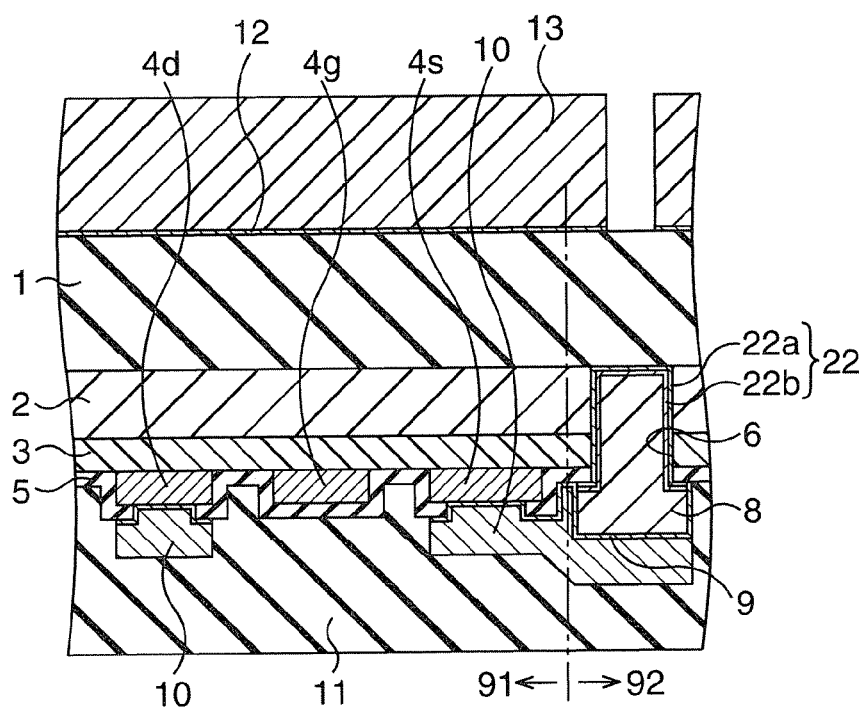

Then, as shown in FIG. 18I, a stacked body composed of a titanium (Ti) layer and a nickel (Ni) layer, or a titanium (Ti) layer and a copper (Cu) layer is formed as the seed layer 12 by sputtering over the back side of the insulating substrate 1. The thickness of the titanium (Ti) layer is made about 10 nm, that of the nickel (Ni) layer is made about 100 nm and that of the copper (Cu) layer is made about 200 nm. Next, similarly to the first embodiment, the nickel (Ni) layer 13 of about 3.2 µm in thickness is formed over the seed layer 12. Further, the resist pattern used for forming the nickel (Ni) layer 13 is removed. Then, a portion of the seed layer 12 exposed from the nickel (Ni) layer 13 is removed by ion-milling. The nickel (Ni) layer 13 is processed a little simultaneously, and the resultant thickness is about 3 µm.

Figure 18J:
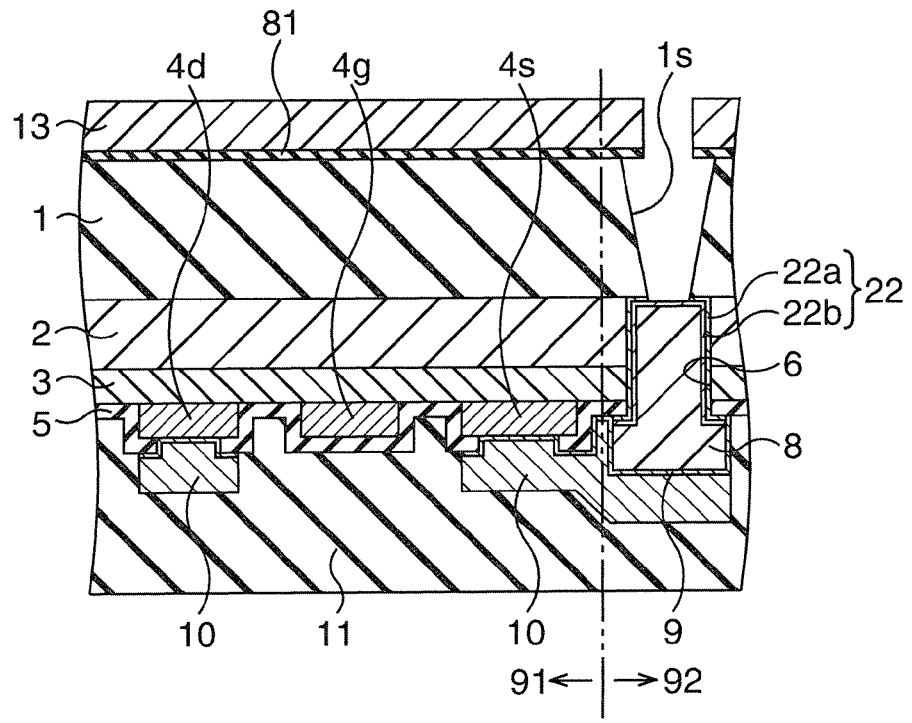

Then, as shown in FIG. 18J, the via hole is formed by conducting dry etching of the insulating substrate 1 using the nickel (Ni) layer 13 as a mask. In the dry etching, fluoride base gas, for example, a mixed gas of sulfur hexafluoride (SF$_6$) gas and oxygen (O$_2$) gas is used. An ICP dry etching apparatus is used for the dry etching, the antenna power is set to 2 kW, and the bias power is set to 200 W. The etching rate of the insulating substrate 1 made of SiC at this time is 2 µm/min or more. In other words, the etching is conducted at a speed several times as much as that in the first embodiment. Further, by the dry etching, although the alteration layer 81 may be created, the alteration layer 82 is not created. Because, the tantalum (Ta) layer 22a is formed. In addition, a part of the tantalum (Ta) layer 22a is removed, and the via hole is reaches the copper (Cu) layer 22b.

Figure 18K:
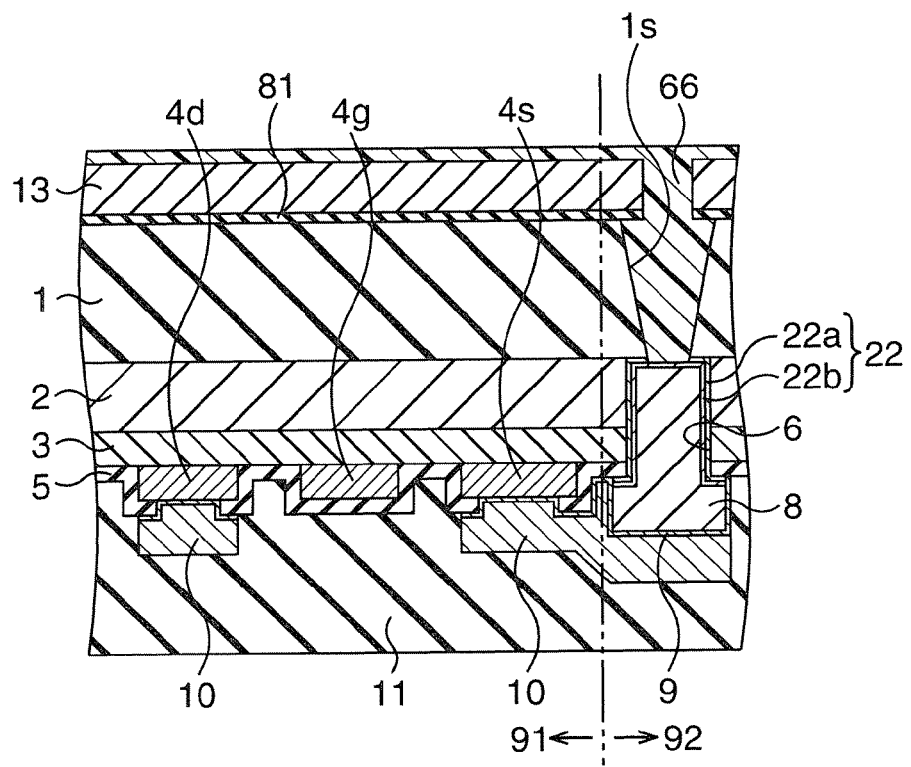

Then, as shown in FIG. 18K, the resist layer 66 is formed inside the via hole 1s and over the nickel (Ni) layer 13.

Figure 18L:
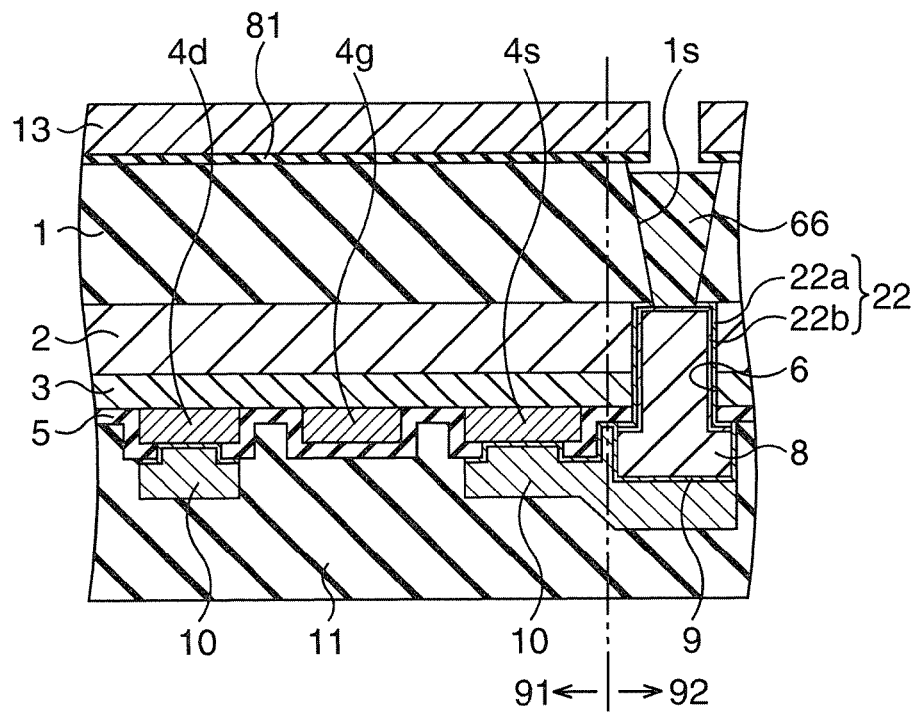

Then, as shown in FIG. 18L, by conducting exposure and development to the resist layer 66, the resist layer 66 is left remaining only in the via hole is. The remaining resist layer 66 serves as a protecting layer.

Figure 18M:
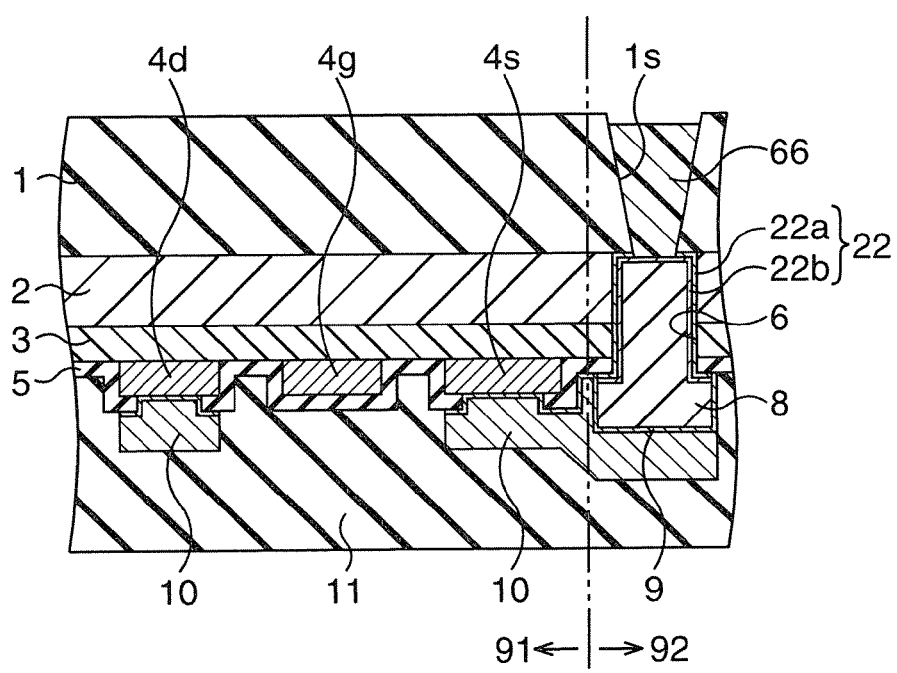

Then, as shown in FIG. 18M, by ion-milling with argon ion and/or by wet etching with dilute nitric acid, the nickel (Ni) layer 13 and the alteration layer 81 are removed.

Figure 18N:
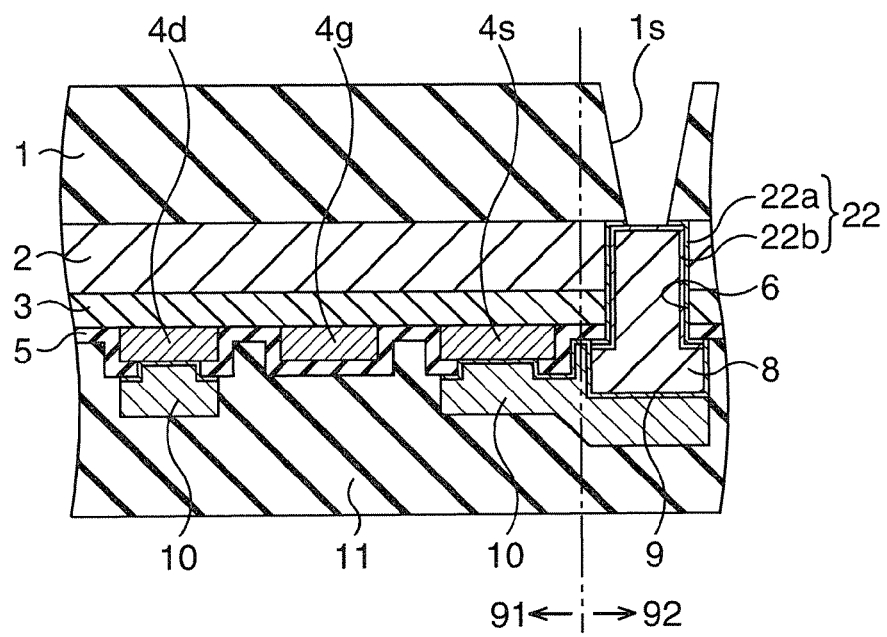

Thereafter, as shown in FIG. 18N, the resist layer 66 is removed.

Figure 18O:
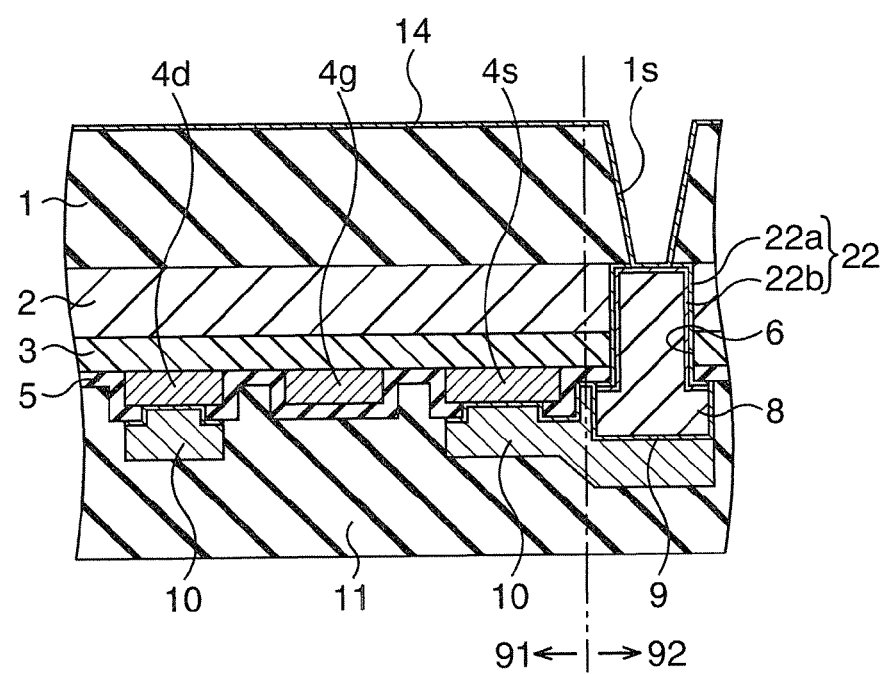

Then, as shown in FIG. 18O, a stack body composed of a titanium (Ti) layer, a platinum (Pt) layer and a gold (Au) layer is formed as the seed layer 14 by sputtering over the whole surface on the back side of the insulating substrate 1.

Figure 18P:
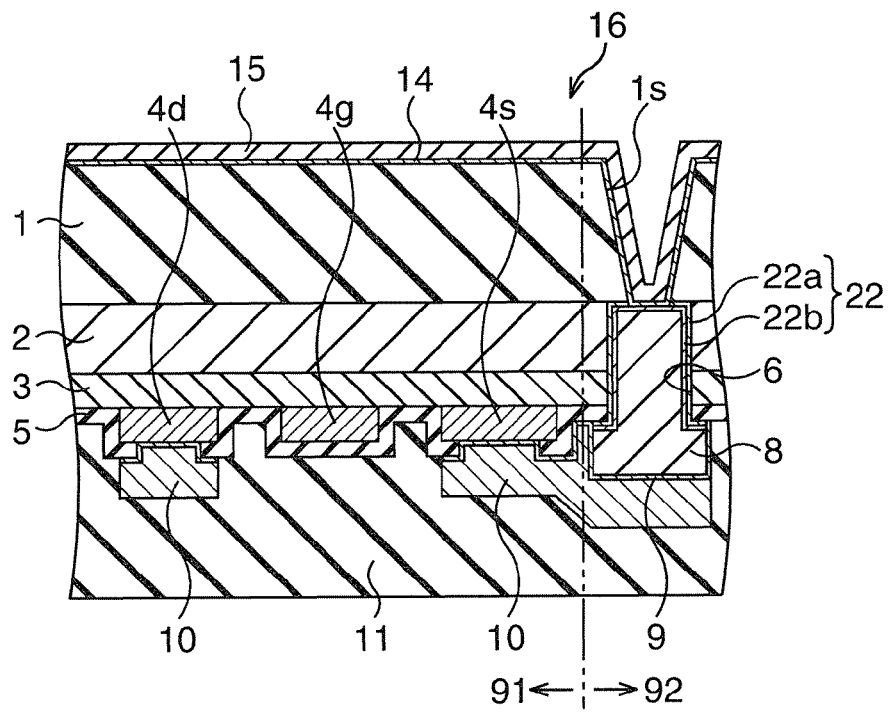
Figure 18Q:
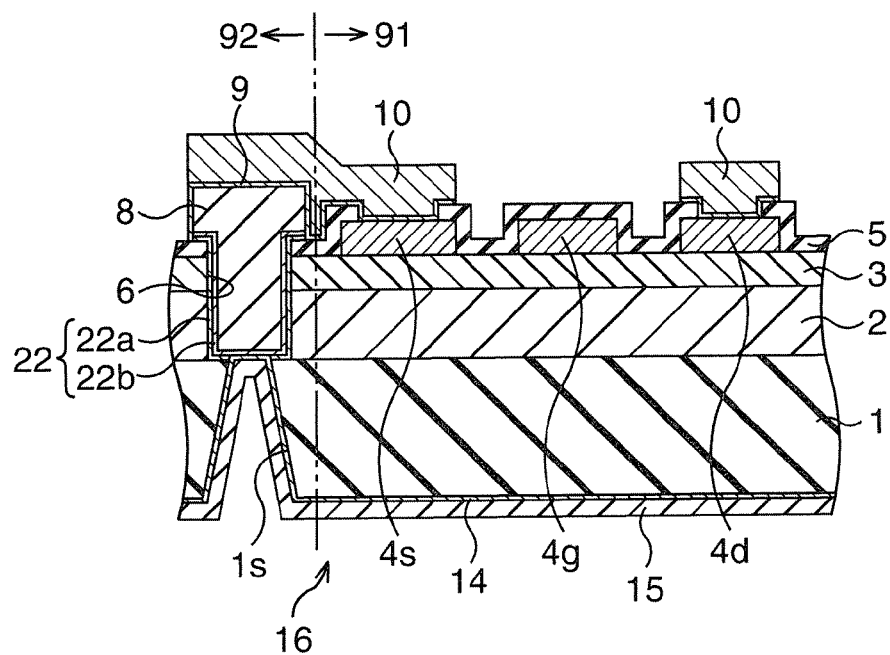

Next, as shown in FIG. 18P, the gold (Au) layer 15 of about 10 µm in thickness is formed over the seed layer 14 by electroplating. The via wiring 16 is composed of the gold (Au) layer 15 and the seed layer 14. When the gold (Au) layer 15 is formed inside the via hole is of about 100 µm in diameter, and of about 150 µm in depth by electroplating, the gold (Au) layer 15 is formed only on the bottom and sides of the via hole is, so that the via hole is not completely infilled.

Thereafter, as shown in FIG. 18Q, the front and the back of the insulating substrate 1 are inversed and the surface protecting layer 11 is removed. A GaN base HEMT is completed by forming a wiring (not shown) and so on as necessary.

According to the seventh embodiment, since the tantalum (Ta) layer 22a is used for the seed layer 22, it is possible to make the etching rate at the time of forming the via hole is several times as much as that of the first embodiment while preventing the creation of the alteration layer 82. Accordingly, even when the step of removing the alteration layer 81 is considered, the throughput is improved more than that in the first embodiment.

Eighth Embodiment

Figure 19:
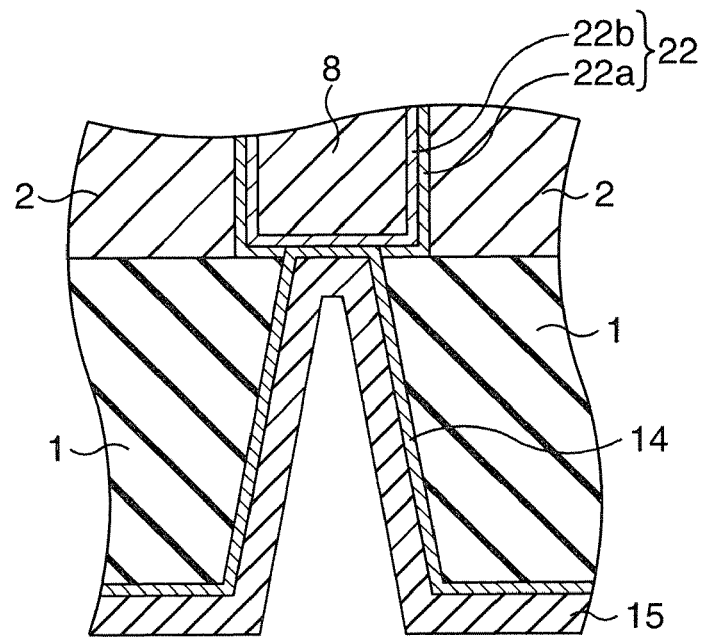
FIG. 19 is a sectional view showing a bottom of a via hole 1s in the seventh embodiment.
Figure 20A:
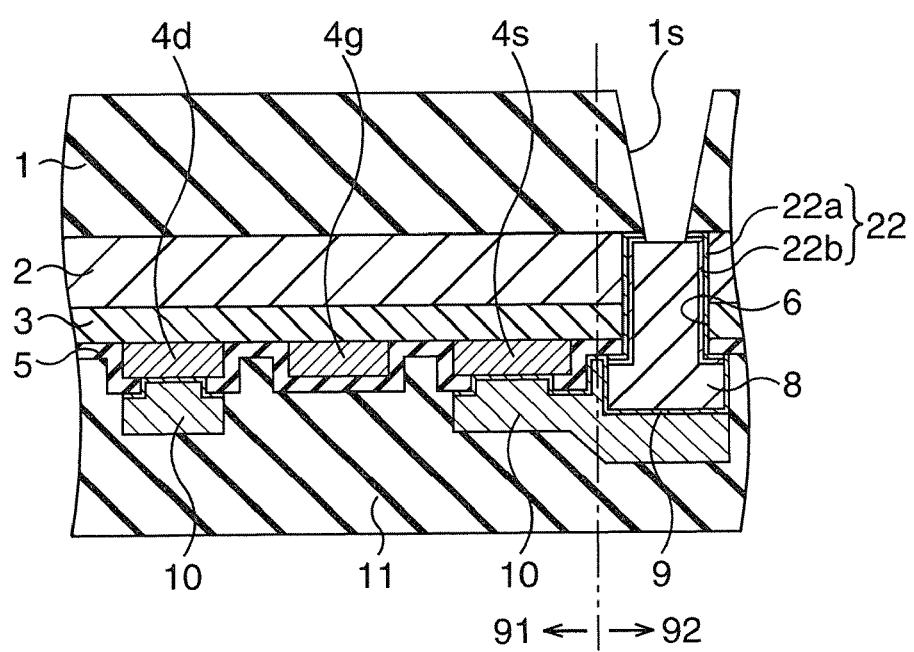
FIG. 20A to FIG. 20B are sectional views showing a method of manufacturing a GaN base HEMT according to an eighth embodiment in process order.
Figure 20B:
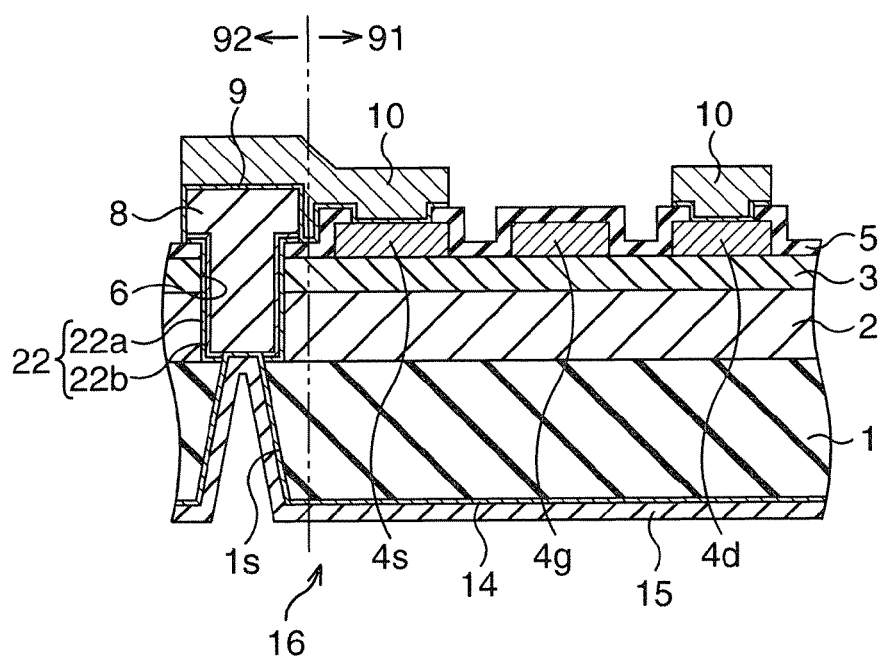

Next, an eighth embodiment will be explained. In any embodiments, the seed layer 14 may not cover the via hole is sufficiently, or foreign substances may cling onto the seed layer 14 before forming the gold (Au) layer 15. In such a case, the gold (Au) layer 15 is not formed and pinholes may appear on such a part. In the seventh embodiment, as shown in FIG. 19, the seed layer 14 is formed so as to come in contact with not the nickel (Ni) layer 8 but the copper (Cu) layer 22b. Accordingly, if the above-described pinhole appears, the copper (Cu) layer 22b comes in contact with the air via the pinhole. Since copper (Cu) is subject to reaction with oxygen and sulfur to make an alteration more readily compared with nickel (Ni), when once coming into contact with the air, there is high possibility that a break and/or high resistance may occur in the via wiring 16. The eighth embodiment is for preventing such anxiety. FIG. 20A to FIG. 20B are sectional views showing a method of manufacturing a GaN base HEMT according to the eighth embodiment in process order.

In the eighth embodiment, first, similarly to the seventh embodiment, the treatment upto the formation of the via hole is conducted (FIG. 18J). Next, as shown in FIG. 20A, a portion of the copper (Cu) layer 22b exposed from the via hole is removed by ion-milling.

Then, as shown in FIG. 20B, a stacked body composed of a titanium (Ti) layer, a platinum (Pt) layer and a gold (Au) layer is formed as the seed layer 14 over the whole surface on the back side of the insulating substrate 1 by sputtering. Thereafter, the gold (Au) layer 15 of about 10 μm in thickness is formed over the seed layer 14 by electroplating. Thereafter, the front and the back of the insulating substrate 1 are inversed and the surface protecting layer 11 is removed. A GaN base HEMT is completed by forming a wiring (not shown) and so on as necessary.

Figure 21:
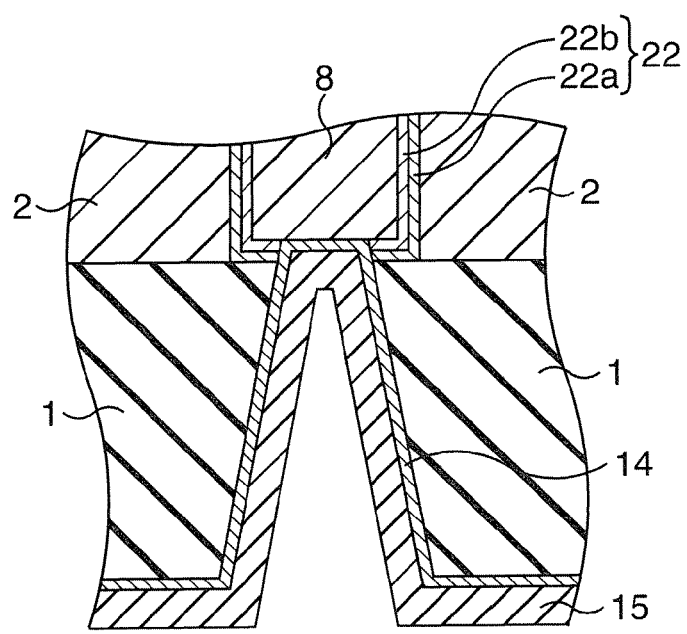
FIG. 21 is a sectional view showing the bottom of the via hole is in the eighth embodiment.

According to the eighth embodiment described above, as shown in FIG. 21, the bottom of the seed layer 14 is in contact with the nickel (Ni) layer 8. Accordingly, even when pinholes appear in the gold (Au) layer 15, the possibility that the copper (Cu) layer 22b comes in contact with the air via the pinhole is extremely low.

Ninth Embodiment

Figure 22A:
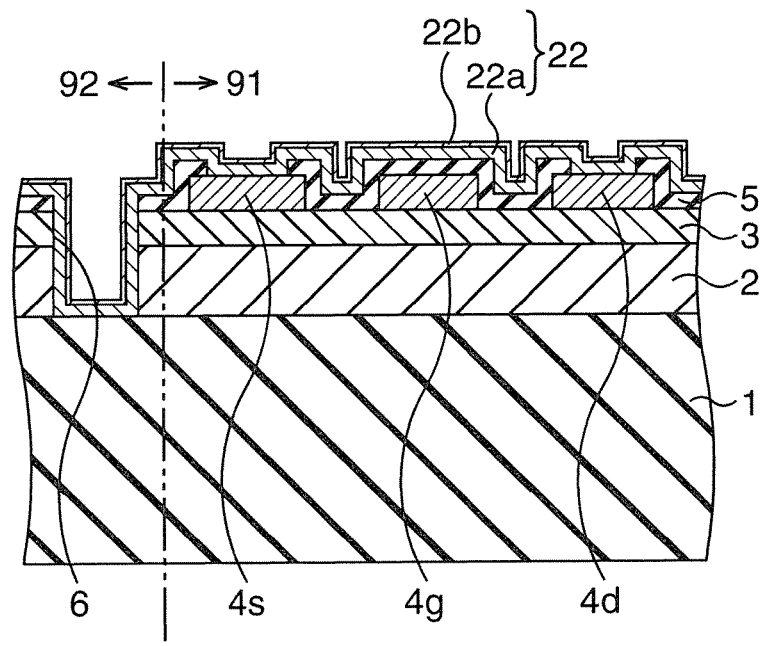
FIG. 22A to FIG. 22B are sectional views showing a method of manufacturing a GaN base HEMT according to a ninth embodiment in process order.
Figure 22B:
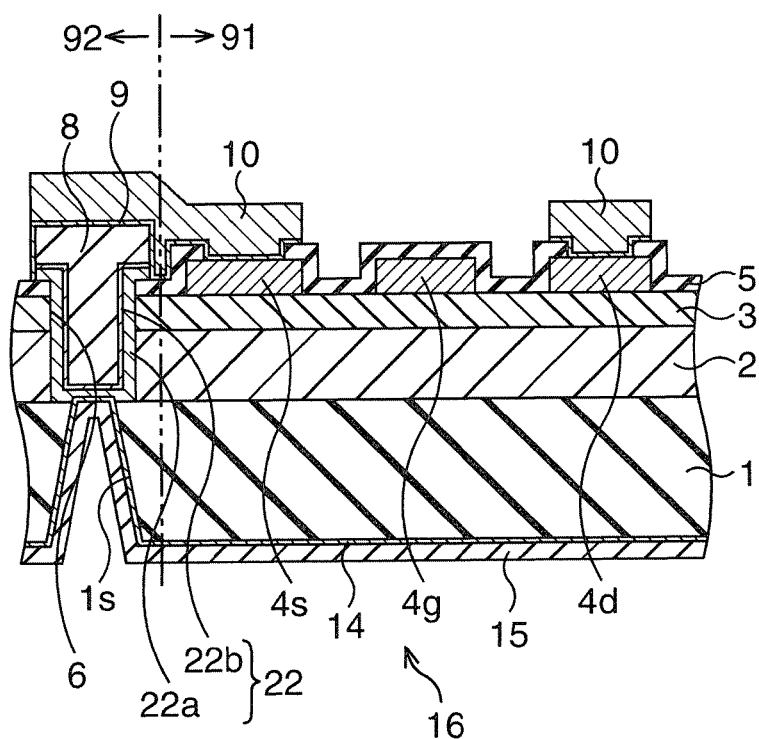

Next, a ninth embodiment of the present invention will be explained. In the ninth embodiment, the thickness of the tantalum (Ta) layer 22a differs from that in the seventh embodiment. FIG. 22A to FIG. 22B are sectional views showing a method of manufacturing a GaN base HEMT according to the ninth embodiment in process order.

In the ninth embodiment, first, the treatment upto the removal of the resist pattern 62 is conducted similarly to the sixth and seventh embodiments (FIG. 16C). Then, as shown in FIG. 22A, a stacked body composed of the tantalum (Ta) layer 22a and the copper (Cu) layer 22b is formed as the seed layer 22 over the whole surface on the front side of the insulating layer 1 by sputtering. The thickness of the tantalum layer 22a is set to about 20 nm in the seventh embodiment, but in the present embodiment, the thickness of the tantalum layer 22a is set to about 200 nm.

Next, similarly to the seventh embodiment, as shown in FIG. 22B, the treatment after the formation of the resist pattern 63 is conducted. A GaN base HEMT is completed by forming a wiring (not shown) and so on as necessary.

Figure 23:
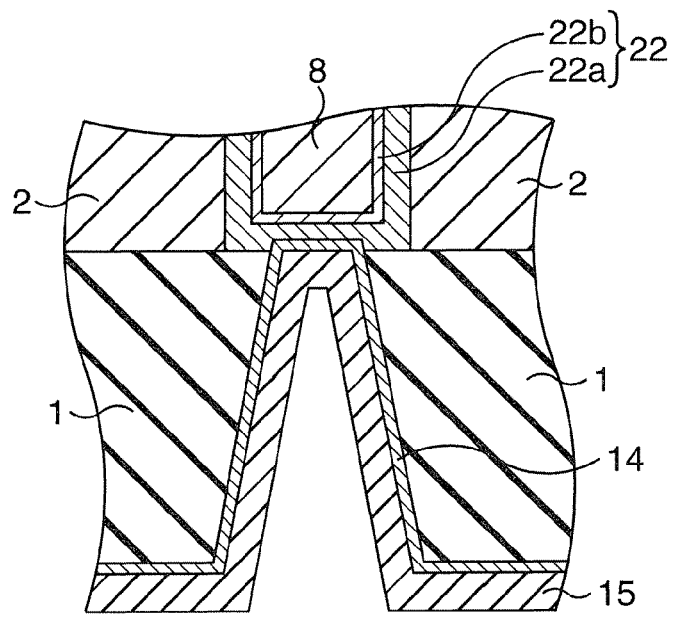
FIG. 23 is a sectional view showing the bottom of the via hole is in the ninth embodiment.

According to the ninth embodiment described above, since the tantalum (Ta) layer 22a is retaining during the formation of the via hole is, the bottom of the seed layer 14 is in contact with the tantalum (Ta) layer 22a as shown in FIG. 23. Accordingly, even though pinholes appear in the gold (Au) layer 15, the possibility of the copper (Cu) layer 22b coming into contact with the air via the pinholes is extremely low.

Tenth Embodiment

Figure 24:
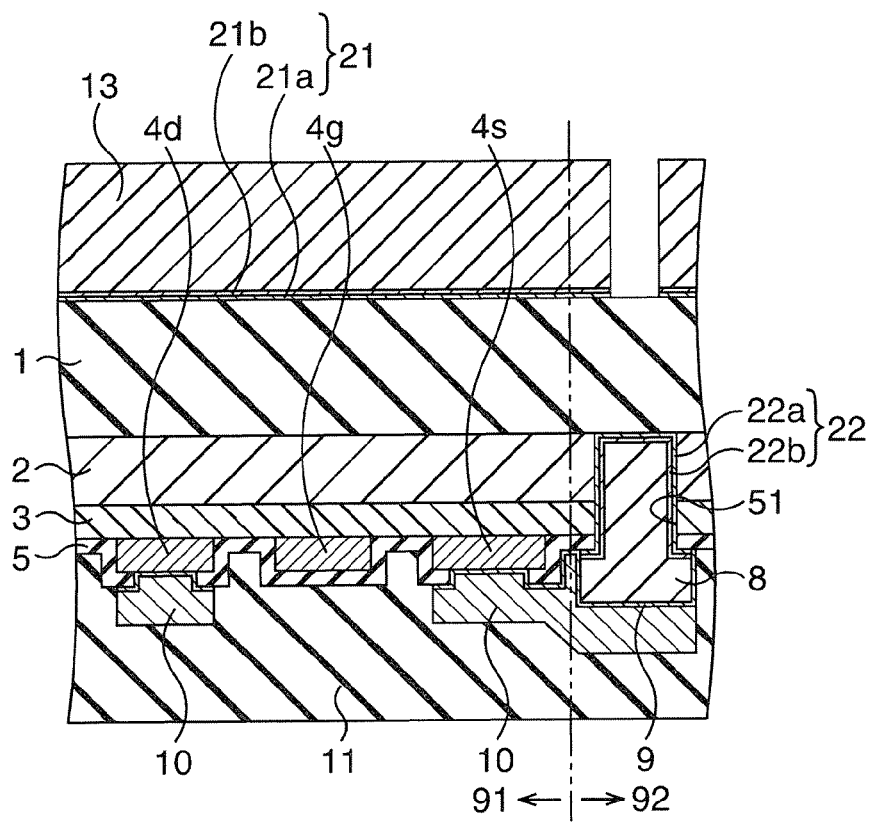
FIG. 24 is a sectional view showing a method of manufacturing a GaN base HEMT according to a tenth embodiment.

Next, a tenth embodiment will be explained. The tenth embodiment is a combination of the sixth embodiment with the seventh embodiment. FIG. 24 is a sectional view showing a method of manufacturing a GaN base HEMT according to the tenth embodiment.

In the tenth embodiment, as shown in FIG. 24, a stacked body of the tantalum (Ta) layer 22a and the copper (Cu) layer 22b is formed as the seed layer 22 for the nickel (Ni) layer 8. Further, a stacked body of the tantalum (Ta) layer 21a and the copper (Cu) layer 21b is formed as the seed layer 21 for the nickel (Ni) layer 13. Other configurations are similar to the sixth embodiment.

According to the tenth embodiment described above, it is possible to prevent formation of both alteration layers 81 and 82. Accordingly, since there is no need to conduct ion-milling or the like to remove these layers, it is possible to further improve the throughput.

Note that the eighth or the ninth embodiment may be combined with the sixth embodiment.

In addition, in the sixth to tenth embodiments, instead of the tantalum (Ta) layers 21a and 22a, a tantalum (Ta) nitride layer may be formed. A layer made of metal having a melting point higher than that made of titanium (Ti) may be formed. As such metals, vanadium (V), chromium (Cr), molybdenum (Mo), hafnium (Hf), zirconium (Zr), platinum (Pt), rhodium (Rh), iridium (Ir), niobium (Nb), ruthenium (Ru), technetium (Tc), tantalum (Ta), rhenium (Re), osmium (Os) and tungsten (W) can be cited. Also, a layer made of nitrides of these metals may be formed. Table 1 is a list of melting points of these metals. Among them, a layer made of metal having high melting point such as tantalum (Ta), osmium (Os), rhenium (Re) or tungsten (W), and a layer made of their nitrides are suitable.

TABLE 1

| metal element | melting point (° C.) |
| --- | --- |
| titanium (Ti) | 1668 |
| vanadium (V) | 1905 |
| chromium (Cr) | 1875 |
| molybdenum (Mo) | 2615 |
| hafnium (Hf) | 2220 |
| zirconium (Zr) | 1852 |
| platinum (Pt) | 1769 |
| rhodium (Rh) | 1966 |
| iridium (Ir) | 2243 |
| niobium (Nb) | 2468 |
| ruthenium (Ru) | 2280 |
| technetium (Tc) | 2170 |
| tantalum (Ta) | 2998 |
| rhenium (Re) | 3160 |
| osmium (Os) | 3027 |
| tungsten (W) | 3380 |

Furthermore, instead of the copper (Cu) layers 21b and 22b, as in the first to the fifth embodiments, a nickel (Ni) layer may be formed.

Note that instead of a SiC substrate, a sapphire substrate, a silicon substrate, and a zinc oxide substrate or the like may be used as a substrate. In other words, the present invention is especially useful when conducting dry etching in which fluorine base gas is used during formation of the via hole.

Further, in the first to the fifth embodiments, the position of the via hole is may be separated from the source electrode 4s as in the sixth to the tenth embodiments, and in the sixth to the tenth embodiments, the position of the via hole is may be superimposed on the source electrode 4s as in the first to the fifth embodiments.

According to the semiconductor devices and the like, since the relation between a via hole and a conductive layer is made appropriate, it is possible to easily form a desired via hole. It is also possible to form an opening in a compound semiconductor layer without being affected by the influence of the gas used during formation of the via hole in a substrate. Accordingly, it is possible to minimize reduction in the yield relating to the formation of the via hole.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of manufacturing a semiconductor device, comprising:
    forming a compound semiconductor layer over a substrate;
    forming a gate electrode, a source electrode and a drain electrode on said compound semiconductor layer;
    forming a passivation film covering said gate electrode, said source electrode and said drain electrode;
    forming an opening penetrating said passivation film and reaching at least a surface of said substrate in said compound semiconductor layer;
    forming a first metal layer containing tantalum (Ta) or tantalum nitride (TaN) in said opening;
    forming a conductive layer coupled to said source electrode on said first metal layer in said opening;
    conducting dry etching from a back side of said substrate while making said conductive layer serve as an etching stopper so as to form a via hole reaching said conductive layer; and
    forming a via wiring extending from an inside of said via hole to a back surface of said substrate.

2. The method of manufacturing a semiconductor device according to claim 1, wherein a gas containing fluorine is used in conducting said dry etching.

3. The method of manufacturing a semiconductor device according to claim 1, wherein forming said opening comprises etching said compound semiconductor layer using a gas containing chlorine.

4. The method of manufacturing a semiconductor device according to claim 1, wherein said conductive layer contains nickel (Ni).

5. The method of manufacturing a semiconductor device according to claim 1, wherein said substrate contains silicon carbide (SiC).

6. The method of manufacturing a semiconductor device according to claim 1, further comprising, between forming said conductive layer and forming said via hole, forming a metal mask on the back surface of said substrate.

7. The method of manufacturing a semiconductor device according to claim 6, wherein said metal mask contains nickel (Ni).

8. The method of manufacturing a semiconductor device according to claim 6, further comprising, before forming said metal mask, forming a second metal layer on the back surface of said substrate,
    wherein said metal mask is formed over said second metal layer.

9. The method of manufacturing a semiconductor device according to claim 8, wherein said second metal layer contains metal having a melting point higher than titanium (Ti).

10. A method of manufacturing a semiconductor device, comprising:
    forming a compound semiconductor layer over an insulating substrate;
    forming a gate electrode, a source electrode and a drain electrode on said compound semiconductor layer;
    forming a passivation film covering said gate electrode, said source electrode and said drain electrode;
    forming an opening penetrating said passivation film and reaching at least a surface of said insulating substrate in said source electrode and said compound semiconductor layer;
    forming a first metal layer containing tantalum (Ta) or tantalum nitride (TaN) in said opening;
    forming a conductive layer on said first metal layer in said opening;
    conducting dry etching from a back side of said insulating substrate while making said conductive layer serve as an etching stopper so as to form a via hole reaching said conductive layer; and
    forming a via wiring extending from an inside of said via hole to a back surface of said insulating substrate.

11. The method of manufacturing a semiconductor device according to claim 10, wherein a gas containing fluorine is used in conducting said dry etching.

12. The method of manufacturing a semiconductor device according to claim 10, further comprising, between forming said conductive layer and forming said via hole, forming a metal mask on the back of said insulating substrate.

13. The method of manufacturing a semiconductor device according to claim 10, wherein forming said via wiring comprises forming a copper (Cu) layer.

* * * * *